US012445108B2

(12) United States Patent
Daimon

(10) Patent No.: US 12,445,108 B2
(45) Date of Patent: Oct. 14, 2025

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 742 days.

(21) Appl. No.: 17/880,848

(22) Filed: Aug. 4, 2022

(65) Prior Publication Data

US 2022/0385271 A1 Dec. 1, 2022

Related U.S. Application Data

(63) Continuation of application No. PCT/JP2021/005611, filed on Feb. 16, 2021.

(30) Foreign Application Priority Data

Feb. 17, 2020 (JP) ................................ 2020-024257

(51) Int. Cl.
*H03H 9/25* (2006.01)
*H03H 9/02* (2006.01)
*H03H 9/145* (2006.01)

(52) U.S. Cl.
CPC .......... *H03H 9/25* (2013.01); *H03H 9/02559* (2013.01); *H03H 9/02574* (2013.01); *H03H 9/14541* (2013.01); *H03H 9/02992* (2013.01)

(58) Field of Classification Search
CPC .. H03H 9/25; H03H 9/02559; H03H 9/02574; H03H 9/14541; H03H 9/02992
See application file for complete search history.

(56) References Cited

U.S. PATENT DOCUMENTS

2006/0179642 A1 8/2006 Kawamura
2013/0285768 A1 10/2013 Watanabe et al.
(Continued)

FOREIGN PATENT DOCUMENTS

JP 2006217281 A 8/2006
JP 2015073331 A 4/2015
(Continued)

OTHER PUBLICATIONS

International Search Report in PCT/JP2021/005611, mailed Apr. 20, 2021, 3 pages.
(Continued)

*Primary Examiner* — Pedro J Cuevas
(74) *Attorney, Agent, or Firm* — Keating & Bennett, LLP

(57) ABSTRACT

An acoustic wave device includes a support substrate, a piezoelectric film, and an IDT electrode. When a wavelength defined by an electrode finger pitch of the IDT electrode is λ, a thickness of the piezoelectric film is about 1λ or less. The piezoelectric film has crystal axes. The support substrate includes first and second silicon layers. A plane orientation of the first and second silicon layers is (100), (110), or (111). When angles α1 and β2 are defined between the plane orientations of the first and second silicon layers and the crystal axes, each of the angles α1 and α2 is one of three types of angles of an angle $\alpha_{100}$, an angle $\alpha_{110}$, and an angle $\alpha_{111}$. A type of the angle α1 is different from a type of the angle α2 and/or a value of the angle α1 is different from a value of the angle α2.

28 Claims, 20 Drawing Sheets

(56) References Cited

U.S. PATENT DOCUMENTS

| | | | |
|---|---|---|---|
| 2019/0280666 A1 | 9/2019 | Akiyama et al. | |
| 2019/0393856 A1 | 12/2019 | Iwamoto et al. | |
| 2020/0028486 A1 | 1/2020 | Kishino et al. | |
| 2020/0328728 A1 | 10/2020 | Nakagawa et al. | |
| 2022/0029599 A1* | 1/2022 | Iwamoto | H03H 9/02866 |
| 2023/0114497 A1* | 4/2023 | Daimon | H03H 9/02574 |
| | | | 310/313 R |
| 2023/0327641 A1* | 10/2023 | Daimon | H03H 9/02566 |
| 2023/0344404 A1* | 10/2023 | Daimon | H03H 9/25 |
| 2023/0344405 A1* | 10/2023 | Daimon | H03H 9/02637 |
| 2023/0353124 A1* | 11/2023 | Nakamura | H03H 9/25 |
| 2023/0361756 A1* | 11/2023 | Nakamura | H03H 9/02574 |
| 2025/0030400 A1* | 1/2025 | Yabu | H03H 9/6483 |

FOREIGN PATENT DOCUMENTS

| | | |
|---|---|---|
| WO | 2018016169 A1 | 1/2018 |
| WO | 2018151147 A1 | 8/2018 |
| WO | 2018163805 A1 | 9/2018 |
| WO | 2019138810 A1 | 7/2019 |

OTHER PUBLICATIONS

Written Opinion in PCT/JP2021/005611, mailed Apr. 20, 2021, 4 pages.

\* cited by examiner

ACOUSTIC WAVE DEVICE

CROSS REFERENCE TO RELATED APPLICATIONS

This application claims the benefit of priority to Japanese Patent Application No. 2020-024257 filed on Feb. 17, 2020 and is a Continuation Application of PCT Application No. PCT/JP2021/005611 filed on Feb. 16, 2021. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used in filters for mobile phones and the like. Japanese Unexamined Patent Application Publication No. 2015-073331 discloses an example of an acoustic wave device. In this acoustic wave device, a piezoelectric film is laminated above a support substrate, and an interdigital transducer (IDT) electrode is provided on the piezoelectric film. When a wavelength defined by an electrode finger pitch of the IDT electrode is $\lambda$, a thickness of the piezoelectric film is $1\lambda$ or less. In Japanese Unexamined Patent Application Publication No. 2015-073331, silicon is disclosed as an example of a material of the support substrate.

However, in the acoustic wave device described in Japanese Unexamined Patent Application Publication No. 2015-073331, it is difficult to sufficiently suppress spurious influence due to higher-order modes in a wide band.

SUMMARY OF THE INVENTION

Preferred embodiments of the present invention provide acoustic wave devices that are each able to reduce or prevent higher-order modes in a wide band.

An acoustic wave device according to a preferred embodiment of the present invention includes a support substrate, a piezoelectric film directly or indirectly on the support substrate, and an IDT electrode on the piezoelectric film, in which when a wavelength defined by an electrode finger pitch of the IDT electrode is $\lambda$, a thickness of the piezoelectric film is about $1\lambda$ or less, the piezoelectric film is a lithium tantalate film or a lithium niobate film, the piezoelectric film has crystal axes $[X_P, Y_P, Z_P]$, the support substrate includes a first silicon layer and a second silicon layer on the first silicon layer, and the second silicon layer is closer to the piezoelectric film than the first silicon layer is in the support substrate, a plane orientation of each of the first silicon layer and the second silicon layer is one of (100), (110), and (111), in a silicon layer having a plane orientation of (111), when a direction vector obtained by projecting the $Z_P$ axis onto a (111) plane of the silicon layer is $k_{111}$, an angle between the direction vector $k_{111}$ and a [11-2] direction of silicon of the silicon layer is an angle $\alpha_{111}$, in a silicon layer having a plane orientation of (110), when a direction vector obtained by projecting the $Z_P$ axis onto a (110) plane of the silicon layer is $k_{110}$, an angle between the direction vector $k_{110}$ and a [001] direction of silicon of the silicon layer is an angle $\alpha_{110}$, in a silicon layer having a plane orientation of (100), when a direction vector obtained by projecting the $Z_P$ axis onto a (100) plane of the silicon layer is $k_{100}$, an angle between the direction vector $k_{100}$ and the [001] direction of silicon of the silicon layer is an angle $\alpha_{100}$, when an angle between the plane orientation of the first silicon layer and the crystal axes of the piezoelectric film is an angle $\alpha 1$, and an angle between the plane orientation of the second silicon layer and the crystal axes of the piezoelectric film is an angle $\alpha 2$, each of the angle $\alpha 1$ and the angle $\alpha 2$ is one of three types of angles of the angle $\alpha_{100}$, the angle $\alpha_{110}$, and the angle (Xiii, and a type of the angle $\alpha 1$ is different from a type of the angle $\alpha 2$ and/or a value of the angle $\alpha 1$ is different from a value of the angle $\alpha 2$.

Acoustic wave devices according to preferred embodiments of the present invention are each able to reduce or prevent higher-order modes in a wide band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

Each of the preferred embodiments described in the present specification is illustrative and partial replacement or combination of configurations of different preferred embodiments can be provided.

Figure 1:
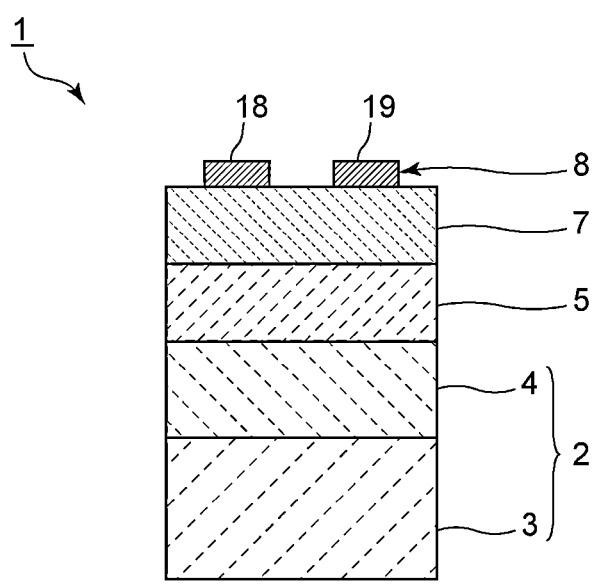
FIG. 1 is a front cross-sectional view illustrating a portion of an acoustic wave device according to a first preferred embodiment of the present invention.
Figure 2:
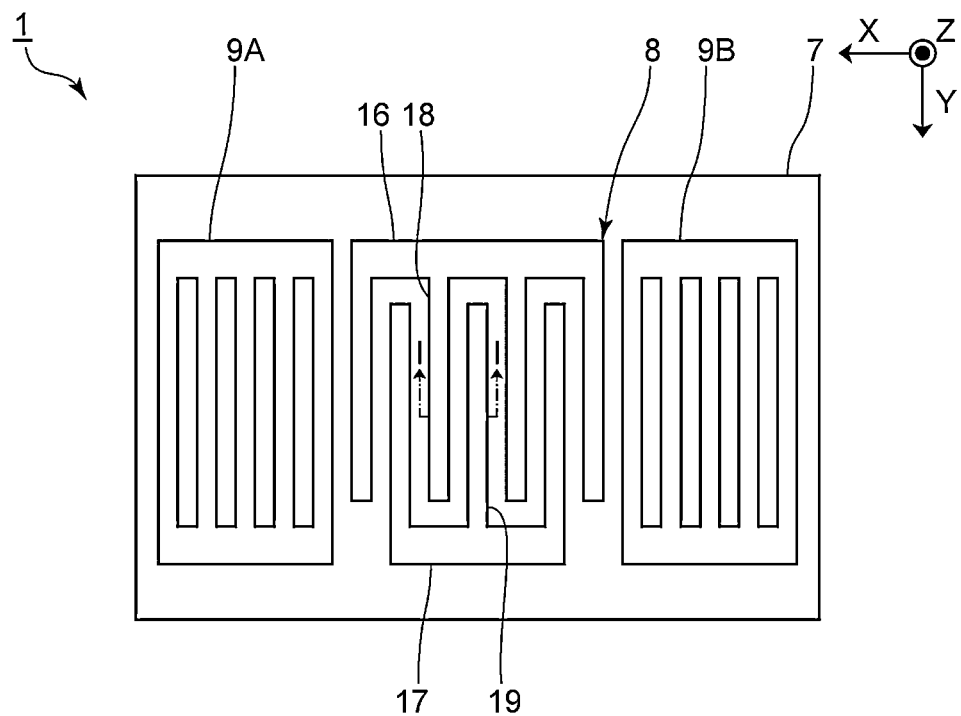
FIG. 2 is a plan view of the acoustic wave device according to the first preferred embodiment of the present invention.

FIG. 1 is a front cross-sectional view illustrating a portion of an acoustic wave device according to a first preferred embodiment of the present invention. FIG. 2 is a plan view of the acoustic wave device according to the first preferred embodiment of the present invention. FIG. 1 is a cross-sectional view taken along line I-I in FIG. 2.

As illustrated in FIG. 1, an acoustic wave device 1 includes a support substrate 2, a first intermediate layer 5, and a piezoelectric film 7. More specifically, the first intermediate layer 5 is provided on the support substrate 2. The piezoelectric film 7 is provided on the first intermediate layer 5.

An IDT electrode 8 is provided on the piezoelectric film 7. By applying an AC voltage to the IDT electrode 8, acoustic waves are excited. As illustrated in FIG. 2, a pair of reflectors 9A and 9B are provided, on the piezoelectric film 7, on both sides of the IDT electrode 8 in an acoustic wave propagation direction. Thus, the acoustic wave device 1 according to the present preferred embodiment is a surface acoustic wave resonator. The acoustic wave device according to preferred embodiments of the present invention is not limited thereto and may be, for example, a filter device including a plurality of surface acoustic wave resonators, a multiplexer, or the like.

As illustrated in FIG. 2, the IDT electrode 8 includes a first busbar 16, a second busbar 17, a plurality of first electrode fingers 18, and a plurality of second electrode fingers 19. The first busbar 16 and the second busbar 17 oppose each other. One end of each of the plurality of first electrode fingers 18 is connected to the first busbar 16. One end of each of the plurality of second electrode fingers 19 is connected to the second busbar 17. The plurality of first electrode fingers 18 and the plurality of second electrode fingers 19 are interdigitated with each other. In this specification, the acoustic wave propagation direction is defined as an X direction. A direction in which the first electrode fingers 18 and the second electrode fingers 19 of the IDT electrode 8 extend is defined as a Y direction. A thickness direction of the IDT electrode 8, the piezoelectric film 7, the support substrate 2, and the like is defined as a Z direction.

The IDT electrodes 8, the reflector 9A, and the reflector 9B may include a single-layer metal film or a multi-layer metal film.

Referring back to FIG. 1, the piezoelectric film 7 is, for example, a lithium tantalate film. The piezoelectric film 7 may be, for example, a lithium tantalate film or a lithium niobate film. The piezoelectric film 7 has crystal axes [$X_P$, $Y_P$, $Z_P$]. Further, the piezoelectric film 7 includes a positive surface and a negative surface. The positive surface and the negative surface are determined by a polarization direction of the piezoelectric film 7. The positive surface is a surface of the piezoelectric film 7 on a positive polarization direction side. The negative surface is a surface of the piezoelectric film 7 on a negative polarization direction side.

Here, when a wavelength defined by an electrode finger pitch of the IDT electrode 8 is λ, a thickness of the piezoelectric film 7 is, for example, about 1λ or less. This can suitably increase a Q factor. The electrode finger pitch refers to a distance between the centers of electrode fingers adjacent to each other. Specifically, the electrode finger pitch refers to a distance between center points of the adjacent electrode fingers in the acoustic wave propagation direction, that is, the X direction. When the distance between the centers of the electrode fingers is not constant, the electrode finger pitch is defined as an average value of the distances between the centers of the electrode fingers.

The first intermediate layer 5 is, for example, a silicon oxide film. The silicon oxide can be represented by $SiO_x$. x is a positive number. In the present preferred embodiment, the first intermediate layer 5 is, for example, a $SiO_2$ film. However, x is not limited to 2. The first intermediate layer 5 may include silicon oxide. Thus, the frequency-temperature characteristic can be improved.

In the acoustic wave device 1, the piezoelectric film 7 is provided directly on the first intermediate layer 5. The piezoelectric film 7 may be indirectly provided on the first intermediate layer 5 with another intermediate layer interposed therebetween. Alternatively, the acoustic wave device 1 does not necessarily include the first intermediate layer 5. The piezoelectric film 7 may be provided directly on the support substrate 2.

The support substrate 2 includes a first silicon layer 3 and a second silicon layer 4. The second silicon layer 4 is laminated on the first silicon layer 3. Here, an adhesive layer having a thickness of, for example, approximately 30 nm or less may be provided between the first silicon layer 3 and the second silicon layer 4. In the support substrate 2, the second silicon layer 4 is located closer to the piezoelectric film 7 than the first silicon layer 3 is.

Here, an angle between a plane orientation of the silicon layer and crystal axes of the piezoelectric film is defined as an angle α. Further, an angle α defined by a relationship between a plane orientation of the first silicon layer 3 and crystal axes of the piezoelectric film 7 is defined as an angle α1. An angle α between a plane orientation of the second silicon layer 4 and the crystal axes of the piezoelectric film 7 is defined as an angle α2. Details of the angle α1 and the angle α2 will be described later.

The present preferred embodiment is characterized in that the support substrate 2 includes the first silicon layer 3 and the second silicon layer 4, and the angle α1 and the angle α2 are different from each other. "The angle α1 and the angle α2 are different from each other" means that the types of angles determined by the plane orientation of the silicon layer are different from each other or the values of the angles are different from each other. This makes it possible to reduce or prevent higher-order modes in a wide band. Details of this advantageous effect will be described below together with definitions of the crystal axes, the plane orientation, the angle α1 and the angle 062, and the like.

Figure 3:
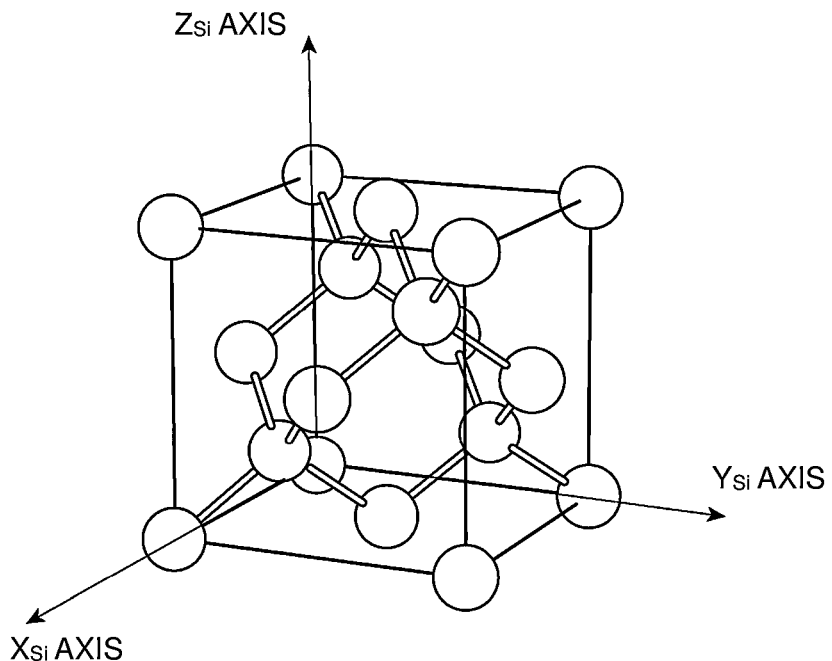
FIG. 3 is a schematic view illustrating a definition of crystal axes of silicon.
Figure 4:
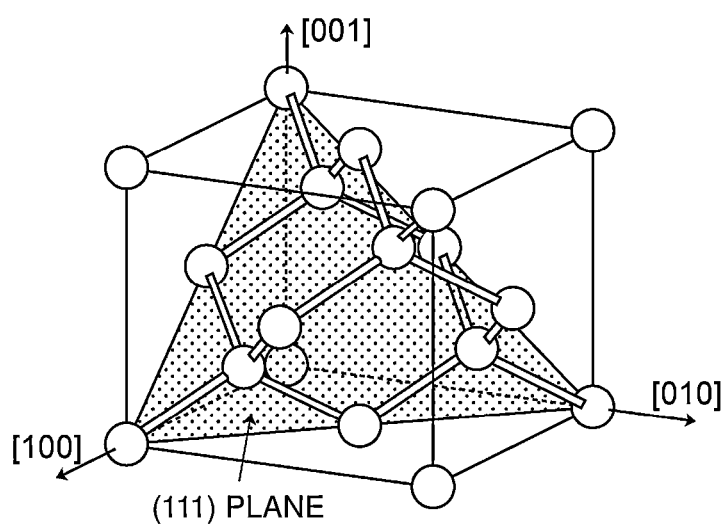
FIG. 4 is a schematic view illustrating a (111) plane of silicon.
Figure 5:
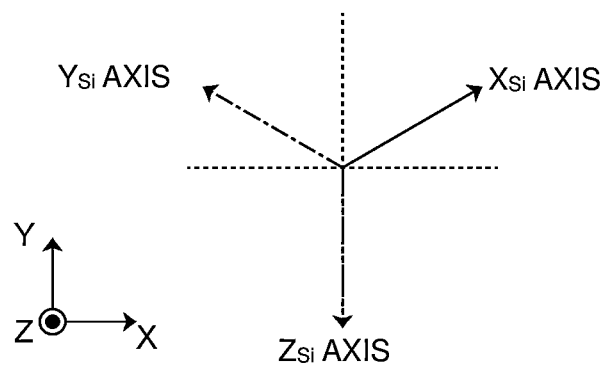
FIG. 5 is a view of the crystal axes of the (111) plane of silicon as viewed from an XY plane.
Figure 6:
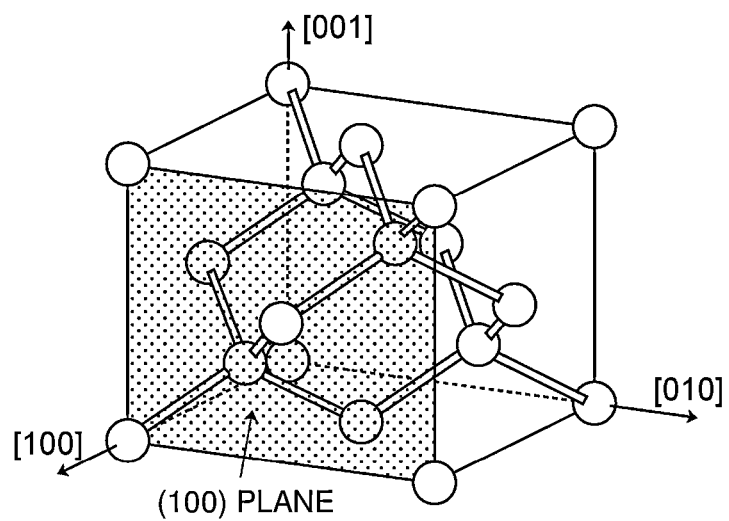
FIG. 6 is a schematic view illustrating a (100) plane of silicon.
Figure 7:
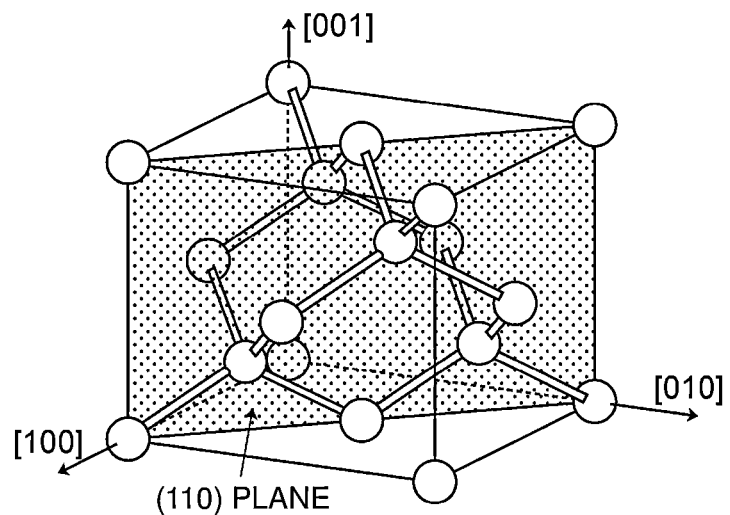
FIG. 7 is a schematic view illustrating a (110) plane of silicon.

FIG. 3 is a schematic view illustrating the definition of the crystal axes of silicon. FIG. 4 is a schematic view illustrating a (111) plane of silicon. FIG. 5 is a view of the crystal axes of the (111) plane of silicon as viewed from an XY plane. FIG. 6 is a schematic view illustrating a (100) plane of silicon. FIG. 7 is a schematic view illustrating a (110) plane of silicon.

The first silicon layer 3 and the second silicon layer 4 are silicon single crystal layers. As illustrated in FIG. 3, silicon has a diamond structure. In the present specification, the crystal axes of silicon of the silicon layer are represented by [$X_{Si}$, $Y_{Si}$, $Z_{Si}$]. In silicon, the $X_{Si}$, $Y_{Si}$, and $Z_{Si}$ axes are equivalent to each other due to the symmetry of the crystal structure. As illustrated in FIG. 5, the crystal structure has in-plane three-fold symmetry in the (111) plane and becomes an equivalent crystal structure when rotated by 120°.

The plane orientation of the first silicon layer 3 of the present preferred embodiment is (111). The plane orientation being (111) indicates that the substrate or layer is cut in the (111) plane orthogonal or substantially orthogonal to crystal axes represented by Miller indices [111] in the crystal structure of silicon having a diamond structure. The (111) plane is a plane illustrated in FIGS. 4 and 5. However, other crystallographically equivalent planes are also included.

The plane orientation of the second silicon layer 4 of the present preferred embodiment is (100). The plane orientation being (100) indicates that the substrate or layer is cut in the (100) plane orthogonal or substantially orthogonal to crystal axes represented by Miller indices [100] in the crystal structure of silicon having a diamond structure. The crystal structure has in-plane four-fold symmetry in the (100) plane and becomes an equivalent crystal structure when rotated by 90°. The (100) plane is a plane illustrated in FIG. 6.

On the other hand, the plane orientation being (110) indicates that the substrate or layer is cut in the (110) plane orthogonal or substantially orthogonal to crystal axes represented by Miller indices [110] in the crystal structure of silicon having a diamond structure. The crystal structure has in-plane two-fold symmetry in the (110) plane and becomes an equivalent crystal structure when rotated by 180°. The (110) plane is a plane illustrated in FIG. 7.

In the following, the angle α and a direction vector k described later will be described in detail. The angle α is one of three types of angles: $α_{111}$, $α_{110}$, and $α_{100}$. The direction vector k is one of $k_{111}$, $k_{110}$, and $k_{100}$.

Figure 8:
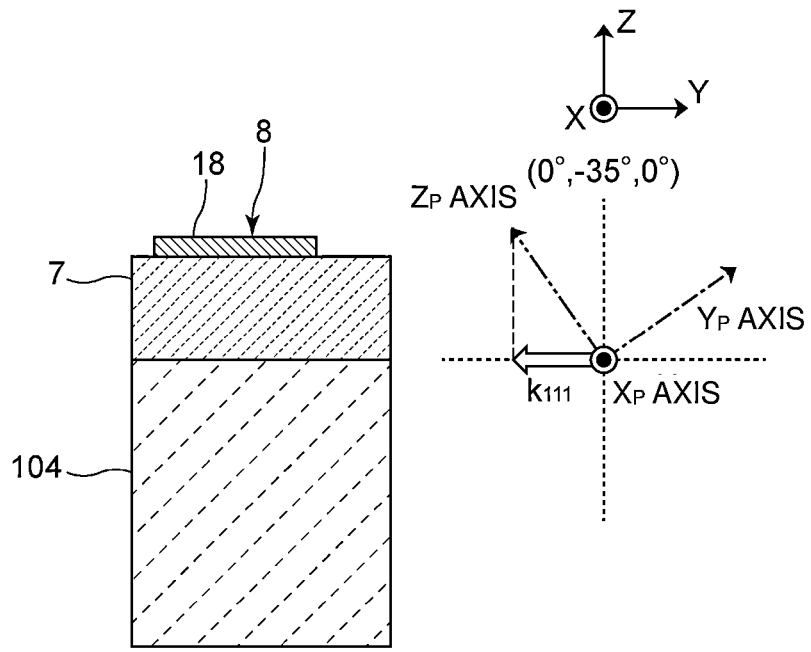
FIG. 8 is a schematic cross-sectional view for explaining a direction vector $k_{111}$.
Figure 9:
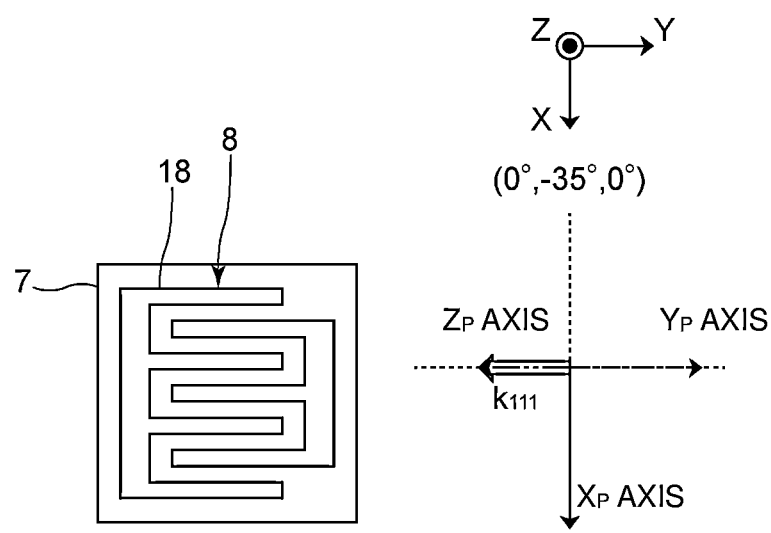
FIG. 9 is a schematic plan view for explaining the direction vector $k_{111}$.

FIG. 8 is a schematic cross-sectional view for explaining the direction vector $k_{111}$. FIG. 9 is a schematic plan view for explaining the direction vector $k_{111}$. Note that the plane orientation of a silicon layer 104 in FIG. 8 is (111).

FIGS. 8 and 9 illustrate an example in which Euler angles of the piezoelectric film 7 are about (0°, −35°, 0°). In this example, the IDT electrode 8 is provided on the positive surface of the piezoelectric film 7. The (111) plane of the silicon layer 104 is in contact with the piezoelectric film 7.

Here, as illustrated in FIG. 8, a direction vector obtained by projecting a $Z_P$ axis of $LiTaO_3$, which is a piezoelectric material including the piezoelectric film 7, onto the (111) plane of the silicon layer 104 is defined as $k_{111}$. As illustrated in FIGS. 8 and 9, the direction vector $k_{111}$ is parallel or substantially parallel to the Y direction in which the electrode fingers of the IDT electrode 8 extend.

Figure 10:
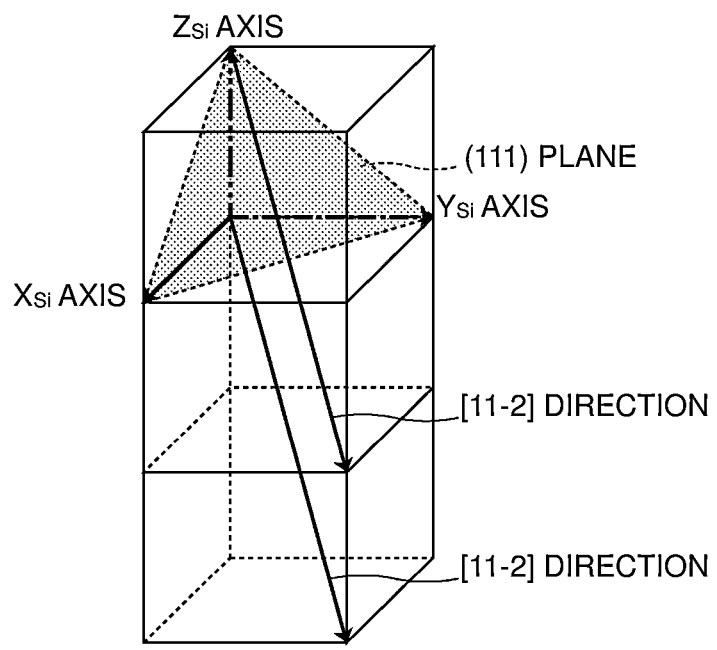
FIG. 10 is a schematic view illustrating a [11-2] direction of silicon.
Figure 11:
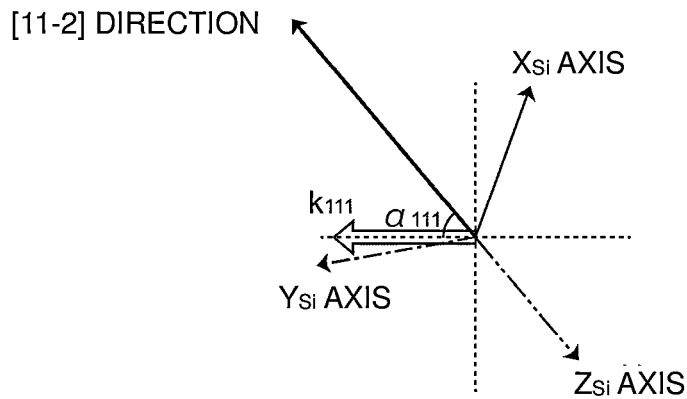
FIG. 11 is a schematic view for explaining an angle $\alpha_{111}$.

FIG. 10 is a schematic view illustrating a [11-2] direction of silicon. FIG. 11 is a schematic view for explaining the angle $α_{111}$.

As illustrated in FIG. 10, the [11-2] direction of silicon is represented as a composite vector of a unit vector in the $X_{Si}$ direction, a unit vector in the $Y_{Si}$ direction, and a vector that is about −2 times a unit vector in the $Z_{Si}$ direction in the crystal structure of silicon. As illustrated in FIG. 11, the angle $\alpha_{111}$ is an angle between the direction vector $k_{111}$ and the [11-2] direction of silicon of the silicon layer 104. As described above, the [11-2] direction, a [1-21] direction, and a [-211] direction are equivalent due to the symmetry of the silicon crystal.

On the other hand, in the silicon layer having the plane orientation of (110), a direction vector obtained by projecting the $Z_P$ axis onto the (110) plane of the silicon layer is defined as $k_{110}$. The angle $\alpha_{110}$ is an angle between the direction vector $k_{110}$ and a [001] direction of silicon of the silicon layer. The [001] direction, a [100] direction, and a [010] direction are equivalent due to the symmetry of the silicon crystal.

In the silicon layer having the plane orientation of (100), a direction vector obtained by projecting the $Z_P$ axis onto the (100) plane of the silicon layer is defined as $k_{100}$. The angle $\alpha_{100}$ is an angle between the direction vector $k_{100}$ and a [001] direction of silicon of the silicon layer.

The definitions of the direction vector k and the angle $\alpha$ are the same regardless of whether the silicon layer is laminated directly on the piezoelectric film or laminated indirectly on the piezoelectric film with another layer interposed therebetween. In the case illustrated in FIG. 1, the first silicon layer 3 and the piezoelectric film 7 are indirectly laminated with the second silicon layer 4 and the first intermediate layer 5 interposed therebetween. The second silicon layer 4 and the piezoelectric film 7 are indirectly laminated with the first intermediate layer 5 interposed therebetween. Also in these cases, the angle $\alpha$ is defined based on the plane orientation of the first silicon layer 3 or the second silicon layer 4. As described above, the angle $\alpha$ defined by the relationship between the plane orientation of the first silicon layer 3 and the crystal axes of the piezoelectric film 7 is the angle $\alpha1$. The angle $\alpha$ defined by the relationship between the plane orientation of the second silicon layer 4 and the crystal axes of the piezoelectric film 7 is the angle $\alpha2$.

However, the plane orientations of the first silicon layer 3 and the second silicon layer 4 are not limited to those described above. The plane orientation of each of the first silicon layer 3 and the second silicon layer 4 may be one of (100), (110), and (111). Each of the angle $\alpha1$ and the angle $\alpha2$ is one of three types of angles: the angle $\alpha_{100}$, the angle $\alpha_{110}$, and the angle $\alpha_{111}$.

More specifically, when the plane orientation of the first silicon layer 3 is (100), the angle $\alpha1$ is the angle $\alpha_{100}$ angle. When the plane orientation of the first silicon layer 3 is (110), the angle $\alpha1$ is the angle $\alpha_{110}$. When the plane orientation of the first silicon layer 3 is (111), the angle $\alpha1$ is the angle $\alpha_{111}$.

Similarly, when the plane orientation of the second silicon layer 4 is (100), the angle $\alpha2$ is the angle $\alpha_{100}$. When the plane orientation of the second silicon layer 4 is (110), the angle $\alpha2$ is the angle $\alpha_{110}$. When the plane orientation of the second silicon layer 4 is (111), the angle $\alpha2$ is the angle $\alpha_{111}$.

In the case in which the plane orientation of the first silicon layer 3 is (100) or (110), the behavior of the acoustic wave device when the IDT electrode 8 is provided on the positive surface of the piezoelectric film 7 is the same or substantially the same as the behavior of the acoustic wave device when the IDT electrode 8 is provided on the negative surface. The same applies to the second silicon layer 4.

On the other hand, in the case in which the plane orientation of the first silicon layer 3 is (111), the behavior of an acoustic wave device 1 when the IDT electrode 8 is provided on the positive surface of the piezoelectric film 7 is different from the behavior of an acoustic wave device 1 when the IDT electrode 8 is provided on the negative surface. More specifically, both of the acoustic wave devices 1 have behaviors in which the angles $\alpha1$ are shifted by about 60° from each other. For example, the behavior when the value of the angle $\alpha1$ satisfies $\alpha1=\alpha$ in the case in which the IDT electrode 8 is provided on the negative surface is the same as the behavior when the value of the angle $\alpha1$ satisfies $\alpha1=a+60°$ in the case in which the IDT electrode 8 is provided on the positive surface. The same applies to the second silicon layer 4.

The plane orientations of the first silicon layer 3 and the second silicon layer 4 may be the same or different. When the plane orientations of the first silicon layer 3 and the second silicon layer 4 are the same, the angle $\alpha1$ and the angle $\alpha2$ are the same type of angles. In this case, the values of the angle $\alpha1$ and the angle $\alpha2$ may be different. On the other hand, when the plane orientations of the first silicon layer 3 and the second silicon layer 4 are different, the angle $\alpha1$ and the angle $\alpha2$ are different types of angles. In this case, the value of the angle $\alpha1$ and the value of the angle $\alpha2$ may be the same or different. In this manner, the type of the angle $\alpha1$ may be different from the type of the angle $\alpha2$ and/or the value of the angle $\alpha1$ may be different from the value of the angle $\alpha2$.

Comparison of the present preferred embodiment with a first comparative example and a second comparative example shows that the higher-order modes can be reduced or prevented in a wide band in the acoustic wave device 1.

Figure 12:
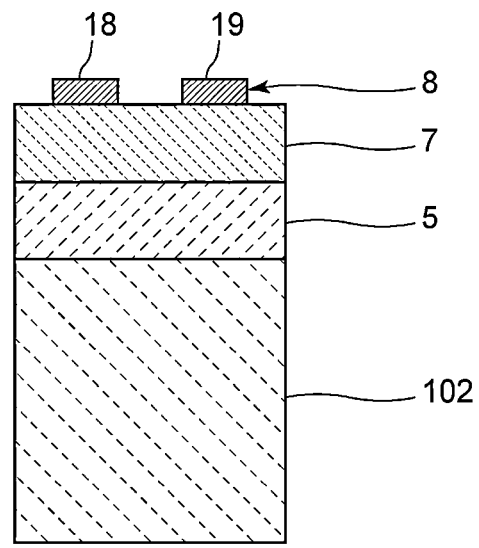
FIG. 12 is a front cross-sectional view illustrating a partial layer configuration of an acoustic wave device according to first and second comparative examples.

As illustrated in FIG. 12, the first comparative example and the second comparative example are different from the first preferred embodiment in that a support substrate 102 includes a single silicon layer. A plane orientation of the support substrate 102 in the first comparative example is (111), and a plane orientation of the support substrate 102 in the second comparative example are (100).

Impedance frequency characteristics of the acoustic wave device having the configuration of the first preferred embodiment and the acoustic wave devices of the first comparative example and the second comparative example were compared. Design parameters of the acoustic wave device having the configuration of the first preferred embodiment are as follows.

First silicon layer 3; plane orientation: (111), Euler angles (about −45°, about −54.7°, about 0°), thickness: about 20 μm Second silicon layer 4; plane orientation: (100), Euler angles (about 0°, about 0°, about 45°), thickness: about 1 μm First intermediate layer 5; material: $SiO_2$, thickness: about 300 nm Piezoelectric film 7; material: 40° Y-cut X-propagation $LiTaO_3$, Euler angles (about 0°, about 130°, about 0°), thickness: about 400 nm Angle $\alpha1$; type: angle $\alpha_{111}$, value: about 0°

Angle $\alpha2$; type: angle $\alpha_{100}$, value: about 45°

Layer configuration of IDT electrode 8; layer configuration: (Ti layer)/(AlCu layer (Cu-1 wt. %))/(Ti layer) from piezoelectric film 7 side, thickness: (about 12 nm)/(about 100 nm)/(about 4 nm) from piezoelectric film 7 side Wavelength λ of IDT electrode 8; about 2 μm Duty ratio of IDT electrode 8; about 0.5

The first comparative example has design parameters the same as or similar to those of the acoustic wave device having the configuration of the first preferred embodiment, except that the plane orientation of the support substrate 102 is (111) and the Euler angles are (about −45°, about −54.7°, about 73°). The second comparative example has design parameters the same as or similar to those of the acoustic wave device having the configuration of the first preferred embodiment, except that the plane orientation of the support substrate 102 is (100) and the Euler angles are (about 0°, about 0°, about 0°).

Figure 13:
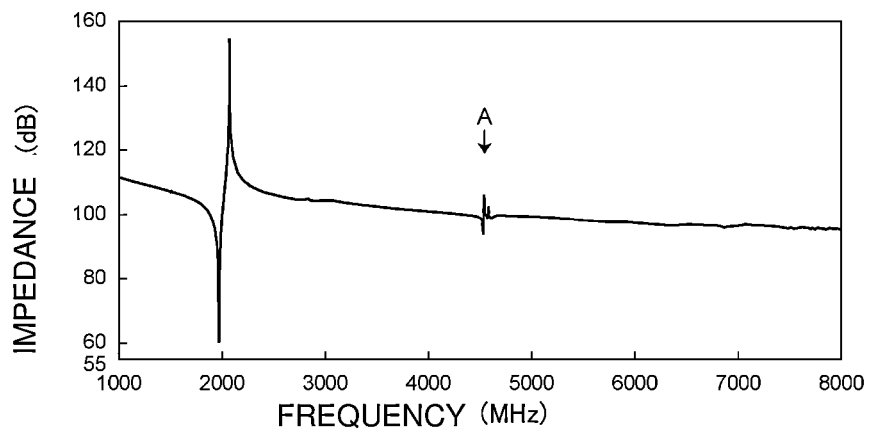
FIG. 13 is a diagram showing an impedance frequency characteristic in the acoustic wave device according to the first comparative example.
Figure 14:
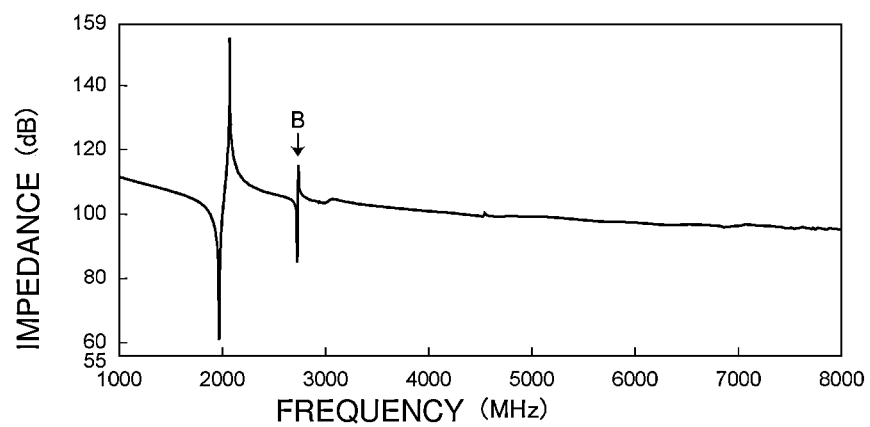
FIG. 14 is a diagram showing an impedance frequency characteristic in the acoustic wave device according to the second comparative example.
Figure 15:
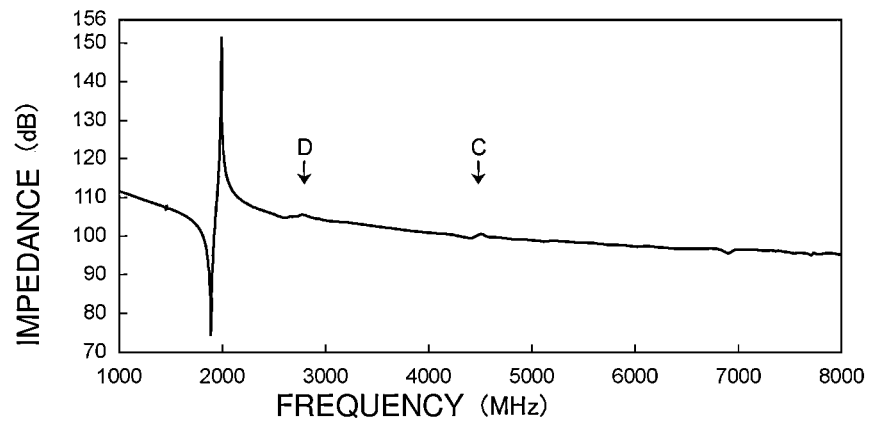
FIG. 15 is a diagram showing an impedance frequency characteristic in the acoustic wave device according to the first preferred embodiment of the present invention.

FIG. 13 is a diagram showing an impedance frequency characteristic of the acoustic wave device according to the first comparative example. FIG. 14 is a diagram showing an impedance frequency characteristic of the acoustic wave device according to the second comparative example. FIG. 15 is a diagram showing an impedance frequency characteristic of the acoustic wave device according to the first preferred embodiment of the present invention.

As indicated by arrow A in FIG. 13, in the first comparative example, a higher-order mode occurs in the vicinity of about 2.2 times the resonant frequency. As indicated by arrow B in FIG. 14, in the second comparative example, a higher-order mode occurs in the vicinity of about 1.5 times the resonant frequency. On the other hand, as indicated by arrows C and D in FIG. 15, in the first preferred embodiment, it can be seen that both higher-order modes in the vicinity of about 1.5 times and about 2.2 times the resonant frequency are reduced or prevented. Thus, in the first preferred embodiment, the higher-order modes can be reduced or prevented in a wide band.

Here, in an acoustic wave device having a configuration the same as or similar to that illustrated in FIG. 1, the angle $\alpha1$ and the angle $\alpha2$ were varied to measure the phase of the higher-order mode. Thus, a combination of the angle $\alpha1$ and the angle $\alpha2$ capable of effectively reducing or preventing the higher-order modes was obtained. Design parameters of each of the acoustic wave devices for which the phases of the higher-order modes were obtained are the same or substantially the same as those of the acoustic wave device for which the impedance frequency characteristic shown in FIG. 15 was obtained, except for the plane orientation of the first silicon layer 3, the plane orientation of the second silicon layer 4, and the angle $\alpha1$ or the angle $\alpha2$. In each of the acoustic wave devices for which the phases of the higher-order modes were obtained, the IDT electrode 8 is provided on the negative surface of the piezoelectric film 7.

The crystal structure has in-plane four-fold symmetry in the (100) plane of the silicon layer and becomes an equivalent crystal structure when rotated by about 90°. Thus, when the plane orientation of the first silicon layer 3 is (100), the value of the angle $\alpha1$ satisfies $\alpha1=\alpha1_{100}+$about 90×n. n is an integer (0, ±1, ±2, . . . ). When the plane orientation of the second silicon layer 4 is (100), the value of the angle $\alpha2$ satisfies $\alpha2=\alpha2_{100}+$about 90×m. m is an integer (0, ±1, ±2, . . . ). n and m may be the same or different.

The crystal structure has in-plane two-fold symmetry in the (110) plane of the silicon layer and becomes an equivalent crystal structure when rotated by about 180°. Thus, when the plane orientation of the first silicon layer 3 is (110), the value of the angle $\alpha1$ satisfies $\alpha1=\alpha1_{110}+$about 180×n. When the plane orientation of the second silicon layer 4 is (110), the value of the angle $\alpha2$ satisfies $\beta2=\beta2_{110}+$about 180×m.

In the case in which the plane orientation of the first silicon layer 3 is (100) or (110), the behavior of the acoustic wave device when the IDT electrode 8 is provided on the positive surface of the piezoelectric film 7 is the same or substantially the same as the behavior of the acoustic wave device when the IDT electrode 8 is provided on the negative surface. The same applies to the second silicon layer 4. Thus, when the plane orientation of the first silicon layer 3 is (100) or (110), the value of the angle $\alpha1$ is expressed as the same or substantially the same value regardless of whether the IDT electrode 8 is provided on the positive surface or the negative surface. When the plane orientation of the second silicon layer 4 is (100) or (110), the value of the angle $\alpha2$ is expressed as the same or substantially the same value regardless of whether the IDT electrode 8 is provided on the positive surface or the negative surface.

The crystal structure has in-plane three-fold symmetry in the (111) plane of the silicon layer and becomes an equivalent crystal structure when rotated by about 120°. Further, in the acoustic wave device used to measure the phase of the higher-order mode, the IDT electrode 8 is provided on the negative surface of the piezoelectric film 7. Thus, in the case in which the plane orientation of the first silicon layer 3 is (111), the value of the angle $\alpha1$ when the IDT electrode 8 is provided on the negative surface of the piezoelectric film 7 satisfies $\alpha1=\alpha1_{111}+$about 120×n. Here, in the case in which the plane orientation of the first silicon layer 3 is (111), the acoustic wave device when the IDT electrode 8 is provided on the positive surface of the piezoelectric film 7 and the acoustic wave device when the IDT electrode 8 is provided on the negative surface exhibit behaviors in which the angles $\alpha1$ are shifted by about 60° from each other. Thus, when the plane orientation of the first silicon layer 3 is (111) and the IDT electrode 8 is provided on the positive surface of the piezoelectric film 7, the value of the angle $\alpha1$ satisfies $\alpha1=\alpha1_{111}+$about 60+about 120×n. Similarly, in the case in which the plane orientation of the second silicon layer 4 is (111), the value of the angle $\alpha2$ when the IDT electrode 8 is provided on the negative surface of the piezoelectric film 7 satisfies $\alpha2=\alpha2_{111}+$about 120×m. When the plane orientation of the second silicon layer 4 is (111) and the IDT electrode 8 is provided on the positive surface of the piezoelectric film 7, the value of the angle $\alpha2$ satisfies $\alpha2=\alpha2_{111}+$about 60+about 120×m.

Ranges in which the angle $\alpha1$ and the angle $\alpha2$ are varied will be described in detail. The plane orientation of the first silicon layer 3 was set to (100), (110), or (111), and the angle $\alpha1$ was varied. When the plane orientation of the first silicon layer 3 was (100), $\alpha1_{100}$ was varied in 5° increments in a range of about 0° to about 45°. When the plane orientation of the first silicon layer 3 was (110), $\alpha1_{110}$ was varied in 10° increments in a range of about 0° to about 90°. When the plane orientation of the first silicon layer 3 was (111), $\alpha1_{111}$ was varied in 5° increments in a range of about 0° to about 60°. Further, the plane orientation of the second silicon layer 4 was set to (100), (110) or (111), and the angle $\alpha2$ was varied. When the plane orientation of the second silicon layer 4 was (100), $\alpha2_{100}$ was varied in 5° increments in a range of about 0° to about 45°. When the plane orientation of the second silicon layer 4 was (110), $\alpha2_{110}$ was varied in 10° increments in a range of about 0° to about 90°. When the plane orientation of the second silicon layer 4 was (111), $\alpha2_{111}$ was varied in 5° increments in a range of about 0° to about 60°. The higher-order modes were measured each time the angle $\alpha1$ and the angle $\alpha2$ were varied. The measured higher-order modes are higher-order modes at about 3.0 times or less the resonant frequency.

In the following, a range for the angle $\alpha1$ and the angle $\alpha2$ in which the phase of the higher-order mode is about −70 deg or less is shown in the drawings and tables. In the present specification, [deg] and [°] are the same units.

Figure 16:
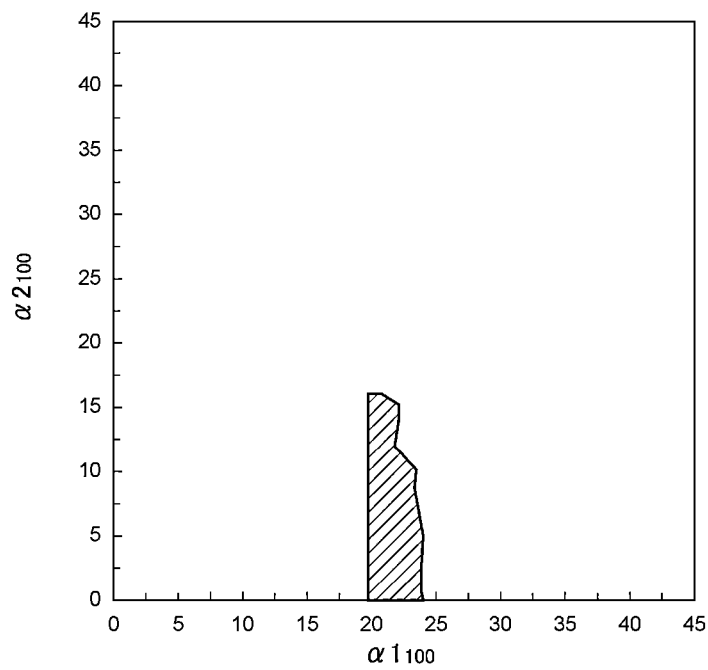
FIG. 16 is a diagram showing a range for $\alpha 1_{100}$ and $\alpha 2_{100}$ in which a phase of a higher-order mode is about $-70$ deg or less.

FIG. 16 is a diagram showing a range for $\alpha1_{100}$ and $\alpha2_{100}$ in which the phase of the higher-order mode is about −70 deg or less. In FIG. 16, the range in which the phase of the higher-order mode is about −70 deg or less is indicated by hatching. The same applies to the diagrams other than FIG. 16 showing the range in which the phase of the higher-order mode is about −70 deg or less.

Table 1 shows the range in which the phase of the higher-order mode is about −70 deg or less shown in FIG. 16.

It is known that the angle α within the range of about ±2.5° or about ±5° does not significantly affect the higher-order mode. Thus, in Table 1, all $\alpha 1_{100}$ and $\alpha 2_{100}$ are described as being within the range of about ±2.5°. In the present specification and each table, for example, 0±about 2.5(°) indicates a range of −about 2.5° to about 2.5°. In tables other than Table 1, the angle α may be described as being within the range of about ±5°.

TABLE 1

| Condition | $\alpha 1_{100}(°)$ | $\alpha 2_{100}(°)$ |
|---|---|---|
| 1 | 20 ± 2.5 | 0 ± 2.5 |
| 2 | 20 ± 2.5 | 5 ± 2.5 |
| 3 | 20 ± 2.5 | 10 ± 2.5 |
| 4 | 20 ± 2.5 | 15 ± 2.5 |

When $\alpha 1_{100}$ and $\alpha 2_{100}$ are any of the combinations shown in Table 1, the phase of the higher-order mode can be reduced or prevented to about −70 deg or less. Thus, the higher-order modes can be effectively reduced or prevented under the conditions shown in Table 1.

Figure 17:
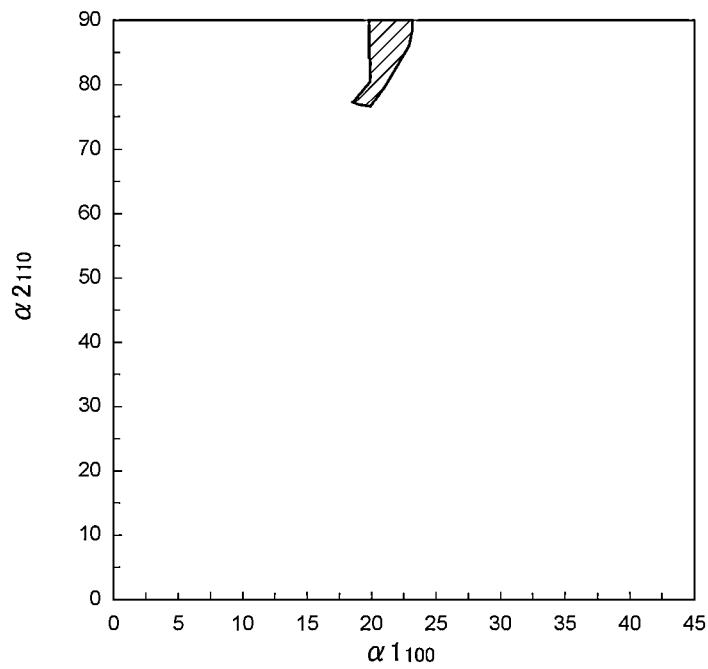
FIG. 17 is a diagram showing a range for $\alpha 1_{100}$ and $\alpha 2_{110}$ in which the phase of the higher-order mode is about $-70$ deg or less.

FIG. 17 is a diagram showing a range for $\alpha 1_{100}$ and $\alpha 2_{110}$ in which the phase of the higher-order mode is about −70 deg or less. Table 2 shows the range in which the phase of the higher-order mode is about −70 deg or less shown in FIG. 17.

TABLE 2

| Condition | $\alpha 1_{100}(°)$ | $\alpha 2_{110}(°)$ |
|---|---|---|
| 1 | 20 ± 2.5 | 80 ± 5 |
| 2 | 20 ± 2.5 | 90 ± 5 |

When $\alpha 1_{100}$ and $\alpha 2_{110}$ are any of the combinations shown in Table 2, the higher-order modes can be effectively reduced or prevented.

Figure 18:
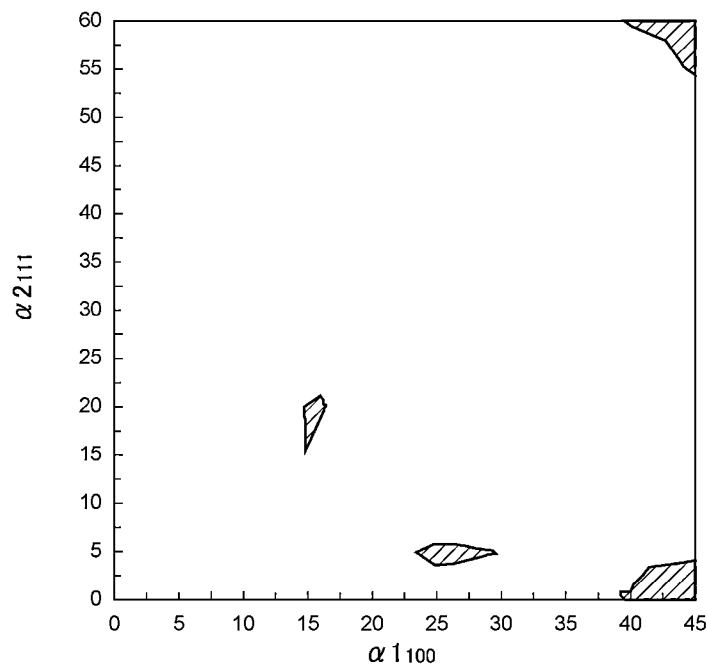
FIG. 18 is a diagram showing a range for $\alpha 1_{100}$ and $\alpha 2_{111}$ in which the phase of the higher-order mode is about $-70$ deg or less.

FIG. 18 is a diagram showing a range for $\alpha 1_{100}$ and $\alpha 2_{111}$ in which the phase of the higher-order mode is about −70 deg or less. Table 3 shows the range in which the phase of the higher-order mode is about −70 deg or less shown in FIG. 18.

TABLE 3

| Condition | $\alpha 1_{100}(°)$ | $\alpha 2_{111}(°)$ |
|---|---|---|
| 1 | 15 ± 2.5 | 20 ± 2.5 |
| 2 | 25 ± 2.5 | 5 ± 2.5 |
| 3 | 30 ± 2.5 | 5 ± 2.5 |
| 4 | 40 ± 2.5 | 0 ± 2.5 |
| 5 | 40 ± 2.5 | 60 ± 2.5 |
| 6 | 45 ± 2.5 | 0 ± 2.5 |
| 7 | 45 ± 2.5 | 55 ± 2.5 |
| 8 | 45 ± 2.5 | 60 ± 2.5 |

When $\alpha 1_{100}$ and $\alpha 2_{111}$ are any of the combinations shown in Table 3, the higher-order modes can be effectively reduced or prevented.

Figure 19:
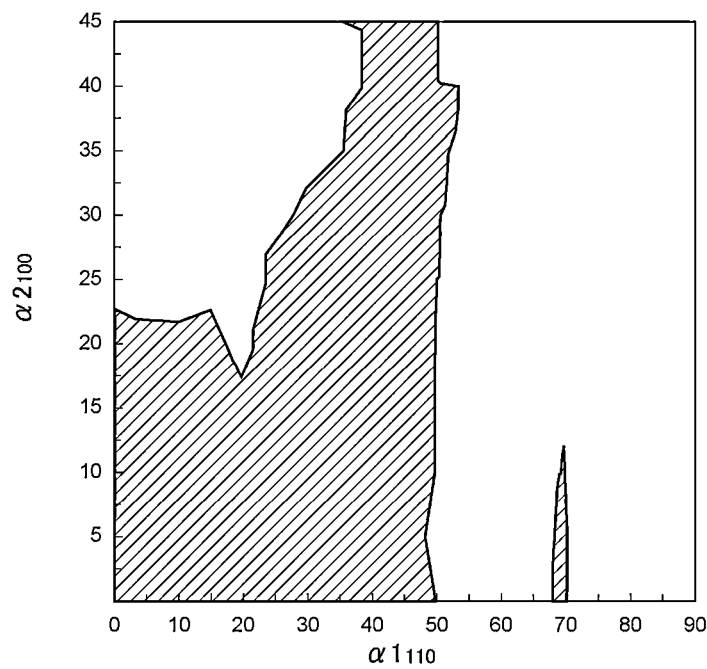
FIG. 19 is a diagram showing a range for $\alpha1_{110}$ and $\alpha2_{100}$ in which the phase of the higher-order mode is about −70 deg or less.

FIG. 19 is a diagram showing a range for $\alpha 1_{110}$ and $\alpha 2_{100}$ in which the phase of the higher-order mode is about −70 deg or less. Table 4 shows the range in which the phase of the higher-order mode is about −70 deg or less shown in FIG. 19. Further, Table 5 shows a range in which the phase of the higher-order mode is about −80 deg or less.

TABLE 4

| Condition | $\alpha 1_{110}(°)$ | $\alpha 2_{100}(°)$ |
|---|---|---|
| 1 | 0 ± 5 | 0 ± 2.5 |
| 2 | 0 ± 5 | 5 ± 2.5 |
| 3 | 0 ± 5 | 10 ± 2.5 |
| 4 | 0 ± 5 | 15 ± 2.5 |
| 5 | 0 ± 5 | 20 ± 2.5 |
| 6 | 0 ± 5 | 25 ± 2.5 |
| 7 | 0 ± 5 | 30 ± 2.5 |
| 8 | 0 ± 5 | 35 ± 2.5 |
| 9 | 0 ± 5 | 40 ± 2.5 |
| 10 | 0 ± 5 | 45 ± 2.5 |
| 11 | 10 ± 5 | 0 ± 2.5 |
| 12 | 10 ± 5 | 5 ± 2.5 |
| 13 | 10 ± 5 | 10 ± 2.5 |
| 14 | 10 ± 5 | 15 ± 2.5 |
| 15 | 10 ± 5 | 20 ± 2.5 |
| 16 | 10 ± 5 | 25 ± 2.5 |
| 17 | 10 ± 5 | 30 ± 2.5 |
| 18 | 10 ± 5 | 35 ± 2.5 |
| 19 | 10 ± 5 | 40 ± 2.5 |
| 20 | 10 ± 5 | 45 ± 2.5 |
| 21 | 20 ± 5 | 0 ± 2.5 |
| 22 | 20 ± 5 | 5 ± 2.5 |
| 23 | 20 ± 5 | 10 ± 2.5 |
| 24 | 20 ± 5 | 15 ± 2.5 |
| 25 | 20 ± 5 | 20 ± 2.5 |
| 26 | 20 ± 5 | 25 ± 2.5 |
| 27 | 20 ± 5 | 30 ± 2.5 |
| 28 | 20 ± 5 | 35 ± 2.5 |
| 29 | 20 ± 5 | 40 ± 2.5 |
| 30 | 20 ± 5 | 45 ± 2.5 |
| 31 | 30 ± 5 | 5 ± 2.5 |
| 32 | 30 ± 5 | 10 ± 2.5 |
| 33 | 30 ± 5 | 15 ± 2.5 |
| 34 | 30 ± 5 | 20 ± 2.5 |
| 35 | 30 ± 5 | 25 ± 2.5 |
| 36 | 30 ± 5 | 30 ± 2.5 |
| 37 | 30 ± 5 | 35 ± 2.5 |
| 38 | 30 ± 5 | 40 ± 2.5 |
| 39 | 30 ± 5 | 45 ± 2.5 |
| 40 | 40 ± 5 | 0 ± 2.5 |
| 41 | 40 ± 5 | 5 ± 2.5 |
| 42 | 40 ± 5 | 10 ± 2.5 |
| 43 | 40 ± 5 | 15 ± 2.5 |
| 44 | 40 ± 5 | 20 ± 2.5 |
| 45 | 40 ± 5 | 25 ± 2.5 |
| 46 | 40 ± 5 | 30 ± 2.5 |
| 47 | 40 ± 5 | 35 ± 2.5 |
| 48 | 40 ± 5 | 40 ± 2.5 |
| 49 | 40 ± 5 | 45 ± 2.5 |
| 50 | 50 ± 5 | 0 ± 2.5 |
| 51 | 50 ± 5 | 5 ± 2.5 |
| 52 | 50 ± 5 | 10 ± 2.5 |
| 53 | 50 ± 5 | 15 ± 2.5 |
| 54 | 50 ± 5 | 20 ± 2.5 |
| 55 | 50 ± 5 | 25 ± 2.5 |
| 56 | 50 ± 5 | 30 ± 2.5 |
| 57 | 50 ± 5 | 35 ± 2.5 |
| 58 | 50 ± 5 | 40 ± 2.5 |
| 59 | 50 ± 5 | 45 ± 2.5 |
| 60 | 60 ± 5 | 0 ± 2.5 |
| 61 | 60 ± 5 | 5 ± 2.5 |
| 62 | 60 ± 5 | 10 ± 2.5 |
| 63 | 60 ± 5 | 15 ± 2.5 |
| 64 | 60 ± 5 | 20 ± 2.5 |
| 65 | 60 ± 5 | 25 ± 2.5 |
| 66 | 60 ± 5 | 30 ± 2.5 |
| 67 | 60 ± 5 | 35 ± 2.5 |
| 68 | 60 ± 5 | 40 ± 2.5 |
| 69 | 60 ± 5 | 45 ± 2.5 |
| 70 | 70 ± 5 | 0 ± 2.5 |
| 71 | 70 ± 5 | 5 ± 2.5 |
| 72 | 70 ± 5 | 10 ± 2.5 |

TABLE 4-continued

| Condition | $\alpha1_{110}(°)$ | $\alpha2_{100}(°)$ |
|---|---|---|
| 73 | 70 ± 5 | 15 ± 2.5 |
| 74 | 70 ± 5 | 20 ± 2.5 |
| 75 | 70 ± 5 | 25 ± 2.5 |
| 76 | 70 ± 5 | 30 ± 2.5 |
| 77 | 70 ± 5 | 35 ± 2.5 |
| 78 | 70 ± 5 | 40 ± 2.5 |
| 79 | 70 ± 5 | 45 ± 2.5 |
| 80 | 80 ± 5 | 0 ± 2.5 |
| 81 | 80 ± 5 | 5 ± 2.5 |
| 82 | 80 ± 5 | 10 ± 2.5 |
| 83 | 80 ± 5 | 15 ± 2.5 |
| 84 | 80 ± 5 | 20 ± 2.5 |
| 85 | 80 ± 5 | 25 ± 2.5 |
| 86 | 80 ± 5 | 30 ± 2.5 |
| 87 | 80 ± 5 | 35 ± 2.5 |
| 88 | 80 ± 5 | 40 ± 2.5 |
| 89 | 80 ± 5 | 45 ± 2.5 |
| 90 | 90 ± 5 | 0 ± 2.5 |
| 91 | 90 ± 5 | 5 ± 2.5 |
| 92 | 90 ± 5 | 10 ± 2.5 |
| 93 | 90 ± 5 | 15 ± 2.5 |
| 94 | 90 ± 5 | 20 ± 2.5 |
| 95 | 90 ± 5 | 25 ± 2.5 |
| 96 | 90 ± 5 | 30 ± 2.5 |
| 97 | 90 ± 5 | 35 ± 2.5 |
| 98 | 90 ± 5 | 40 ± 2.5 |
| 99 | 90 ± 5 | 45 ± 2.5 |

TABLE 5

| Condition | $\alpha1_{110}(°)$ | $\alpha2_{100}(°)$ |
|---|---|---|
| 1 | 40 ± 5 | 0 ± 2.5 |
| 2 | 40 ± 5 | 5 ± 2.5 |
| 3 | 40 ± 5 | 10 ± 2.5 |

When $\alpha1_{110}$ and $\alpha2_{100}$ are any of the combinations shown in Table 4, the higher-order modes can be effectively reduced or prevented. Further, when $\alpha1_{110}$ and $\alpha2_{100}$ are any of the combinations shown in Table 5, the phase of the higher-order mode can be reduced to about −80 deg or less. Thus, the higher-order modes can be further reduced or prevented under the conditions shown in Table 5.

Figure 20:
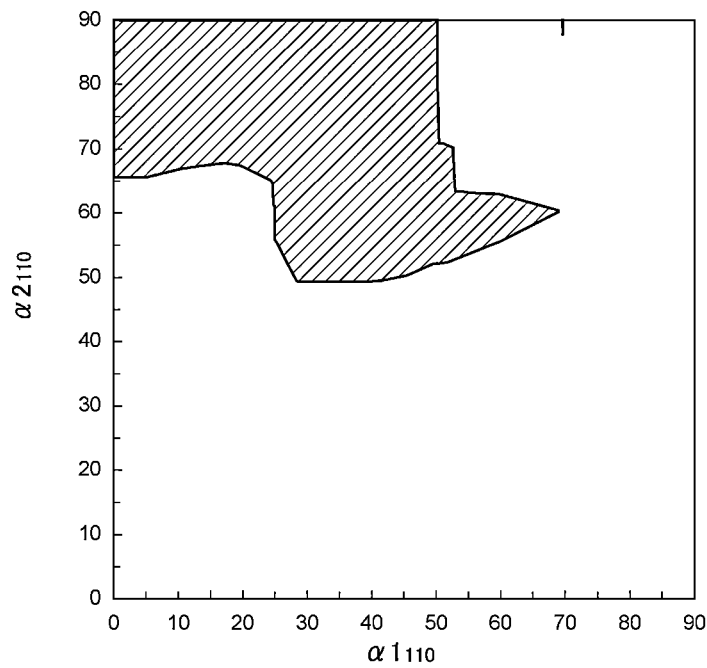
FIG. 20 is a diagram showing a range for $\alpha1_{110}$ and $\alpha2_{110}$ in which the phase of the higher-order mode is about −70 deg or less.

FIG. 20 is a diagram showing a range for $\alpha1_{110}$ and $\alpha2_{110}$ in which the phase of the higher-order mode is about −70 deg or less. Table 6 shows the range in which the phase of the higher-order mode is about −70 deg or less shown in FIG. 20. Further, Table 7 shows a range in which the phase of the higher-order mode is about −80 deg or less.

TABLE 6

| Condition | $\alpha1_{110}(°)$ | $\alpha2_{110}(°)$ |
|---|---|---|
| 1 | 0 ± 5 | 70 ± 5 |
| 2 | 0 ± 5 | 80 ± 5 |
| 3 | 0 ± 5 | 90 ± 5 |
| 4 | 10 ± 5 | 70 ± 5 |
| 5 | 10 ± 5 | 80 ± 5 |
| 6 | 10 ± 5 | 90 ± 5 |
| 7 | 20 ± 5 | 70 ± 5 |
| 8 | 20 ± 5 | 80 ± 5 |
| 9 | 20 ± 5 | 90 ± 5 |
| 10 | 30 ± 5 | 50 ± 5 |
| 11 | 30 ± 5 | 60 ± 5 |
| 12 | 30 ± 5 | 70 ± 5 |
| 13 | 30 ± 5 | 80 ± 5 |
| 14 | 30 ± 5 | 90 ± 5 |
| 15 | 40 ± 5 | 50 ± 5 |
| 16 | 40 ± 5 | 60 ± 5 |
| 17 | 40 ± 5 | 70 ± 5 |
| 18 | 40 ± 5 | 80 ± 5 |
| 19 | 40 ± 5 | 90 ± 5 |
| 20 | 50 ± 5 | 60 ± 5 |
| 21 | 50 ± 5 | 70 ± 5 |
| 22 | 50 ± 5 | 80 ± 5 |
| 23 | 50 ± 5 | 90 ± 5 |
| 24 | 70 ± 5 | 90 ± 5 |

TABLE 7

| Condition | $\alpha1_{110}(°)$ | $\alpha2_{110}(°)$ |
|---|---|---|
| 1 | 0 ± 5 | 80 ± 5 |
| 2 | 0 ± 5 | 90 ± 5 |
| 3 | 10 ± 5 | 80 ± 5 |
| 4 | 10 ± 5 | 90 ± 5 |
| 5 | 20 ± 5 | 80 ± 5 |
| 6 | 20 ± 5 | 90 ± 5 |
| 7 | 30 ± 5 | 60 ± 5 |
| 8 | 30 ± 5 | 70 ± 5 |
| 9 | 30 ± 5 | 80 ± 5 |
| 10 | 30 ± 5 | 90 ± 5 |
| 11 | 40 ± 5 | 60 ± 5 |
| 12 | 40 ± 5 | 70 ± 5 |
| 13 | 40 ± 5 | 80 ± 5 |
| 14 | 40 ± 5 | 90 ± 5 |
| 15 | 50 ± 5 | 60 ± 5 |

When $\alpha1_{110}$ and $\alpha2_{110}$ are any of the combinations shown in Table 6, the higher-order modes can be effectively reduced or prevented. Further, when $\alpha1_{110}$ and $\alpha2_{110}$ are any of the combinations shown in Table 7, the higher-order modes can be further reduced or prevented.

Figure 21:
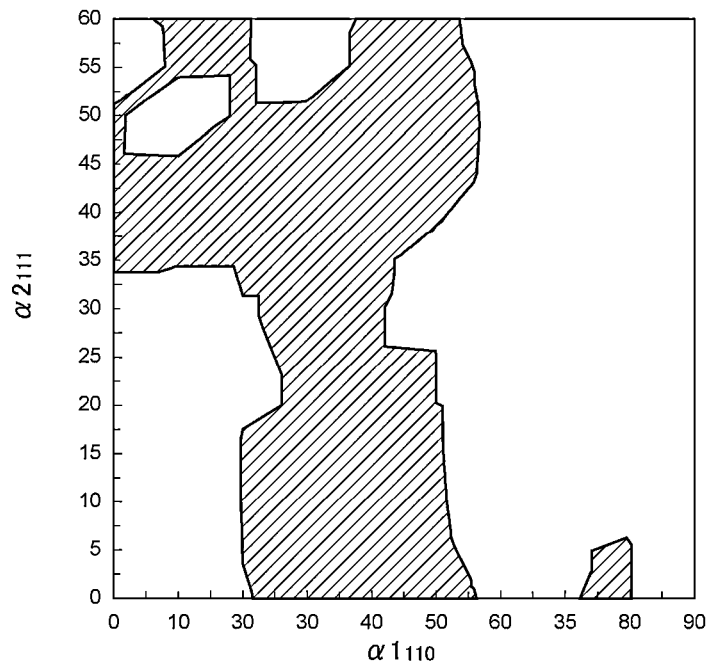
FIG. 21 is a diagram showing a range for $\alpha1_{110}$ and $\alpha2_{111}$ in which the phase of the higher-order mode is about −70 deg or less.

FIG. 21 is a diagram showing a range for $\alpha1_{110}$ and $\alpha2_{111}$ in which the phase of the higher-order mode is about −70 deg or less. Table 8 shows the range in which the phase of the higher-order mode is about −70 deg or less shown in FIG. 21. Further, Table 9 shows a range in which the phase of the higher-order mode is about −80 deg or less.

TABLE 8

| Condition | $\alpha1_{110}(°)$ | $\alpha2_{111}(°)$ |
|---|---|---|
| 1 | 0 ± 5 | 35 ± 2.5 |
| 2 | 0 ± 5 | 40 ± 2.5 |
| 3 | 0 ± 5 | 45 ± 2.5 |
| 4 | 0 ± 5 | 50 ± 2.5 |
| 5 | 10 ± 5 | 35 ± 2.5 |
| 6 | 10 ± 5 | 40 ± 2.5 |
| 7 | 10 ± 5 | 45 ± 2.5 |
| 8 | 10 ± 5 | 55 ± 2.5 |
| 9 | 10 ± 5 | 60 ± 2.5 |
| 10 | 20 ± 5 | 5 ± 2.5 |
| 11 | 20 ± 5 | 10 ± 2.5 |
| 12 | 20 ± 5 | 15 ± 2.5 |
| 13 | 20 ± 5 | 35 ± 2.5 |
| 14 | 20 ± 5 | 40 ± 2.5 |
| 15 | 20 ± 5 | 45 ± 2.5 |
| 16 | 20 ± 5 | 50 ± 2.5 |
| 17 | 20 ± 5 | 55 ± 2.5 |
| 18 | 20 ± 5 | 60 ± 2.5 |
| 19 | 30 ± 5 | 0 ± 2.5 |
| 20 | 30 ± 5 | 5 ± 2.5 |
| 21 | 30 ± 5 | 10 ± 2.5 |
| 22 | 30 ± 5 | 15 ± 2.5 |
| 23 | 30 ± 5 | 20 ± 2.5 |
| 24 | 30 ± 5 | 25 ± 2.5 |
| 25 | 30 ± 5 | 30 ± 2.5 |
| 26 | 30 ± 5 | 35 ± 2.5 |
| 27 | 30 ± 5 | 40 ± 2.5 |
| 28 | 30 ± 5 | 45 ± 2.5 |

TABLE 8-continued

| Condition | $\alpha1_{110}(°)$ | $\alpha2_{111}(°)$ |
|---|---|---|
| 29 | 30 ± 5 | 50 ± 2.5 |
| 30 | 40 ± 5 | 0 ± 2.5 |
| 31 | 40 ± 5 | 5 ± 2.5 |
| 32 | 40 ± 5 | 10 ± 2.5 |
| 33 | 40 ± 5 | 15 ± 2.5 |
| 34 | 40 ± 5 | 20 ± 2.5 |
| 35 | 40 ± 5 | 25 ± 2.5 |
| 36 | 40 ± 5 | 30 ± 2.5 |
| 37 | 40 ± 5 | 35 ± 2.5 |
| 38 | 40 ± 5 | 40 ± 2.5 |
| 39 | 40 ± 5 | 45 ± 2.5 |
| 40 | 40 ± 5 | 50 ± 2.5 |
| 41 | 40 ± 5 | 55 ± 2.5 |
| 42 | 40 ± 5 | 60 ± 2.5 |
| 43 | 50 ± 5 | 0 ± 2.5 |
| 44 | 50 ± 5 | 5 ± 2.5 |
| 45 | 50 ± 5 | 10 ± 2.5 |
| 46 | 50 ± 5 | 15 ± 2.5 |
| 47 | 50 ± 5 | 20 ± 2.5 |
| 48 | 50 ± 5 | 25 ± 2.5 |
| 49 | 50 ± 5 | 40 ± 2.5 |
| 50 | 50 ± 5 | 45 ± 2.5 |
| 51 | 50 ± 5 | 50 ± 2.5 |
| 52 | 50 ± 5 | 55 ± 2.5 |
| 53 | 50 ± 5 | 60 ± 2.5 |
| 54 | 80 ± 5 | 0 ± 2.5 |
| 55 | 80 ± 5 | 5 ± 2.5 |

TABLE 9

| Condition | $\alpha1_{110}(°)$ | $\alpha2_{111}(°)$ |
|---|---|---|
| 1 | 80 ± 5 | 0 ± 2.5 |
| 2 | 80 ± 5 | 5 ± 2.5 |

When $\alpha1_{110}$ and $\alpha2_{111}$ are any of the combinations shown in Table 8, the higher-order modes can be effectively reduced or prevented. Further, when $\alpha1_{110}$ and $\alpha2_{111}$ are any of the combinations shown in Table 9, the higher-order modes can be further reduced or prevented.

Figure 22:
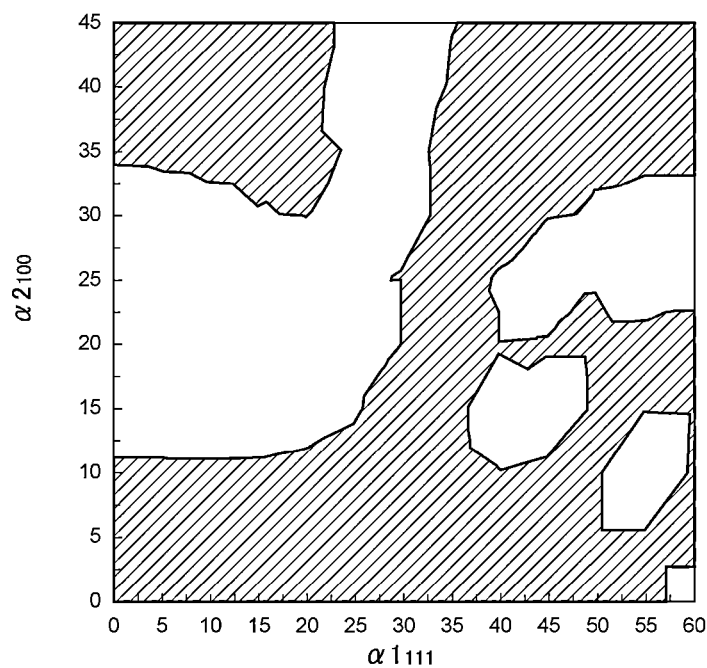
FIG. 22 is a diagram showing a range for $\alpha1_{111}$ and $\alpha2_{100}$ in which the phase of the higher-order mode is about −70 deg or less.

FIG. 22 is a diagram showing a range for $\alpha1_{111}$ and $\alpha2_{100}$ in which the phase of the higher-order mode is about −70 deg or less. Table 10 shows the range in which the phase of the higher-order mode is about −70 deg or less shown in FIG. 22. Further, Table 11 shows a range in which the phase of the higher-order mode is about −80 deg or less.

TABLE 10

| Condition | $\alpha1_{111}(°)$ | $\alpha2_{100}(°)$ |
|---|---|---|
| 1 | 0 ± 2.5 | 0 ± 2.5 |
| 2 | 0 ± 2.5 | 5 ± 2.5 |
| 3 | 0 ± 2.5 | 10 ± 2.5 |
| 4 | 0 ± 2.5 | 35 ± 2.5 |
| 5 | 0 ± 2.5 | 40 ± 2.5 |
| 6 | 0 ± 2.5 | 45 ± 2.5 |
| 7 | 5 ± 2.5 | 0 ± 2.5 |
| 8 | 5 ± 2.5 | 5 ± 2.5 |
| 9 | 5 ± 2.5 | 10 ± 2.5 |
| 10 | 5 ± 2.5 | 35 ± 2.5 |
| 11 | 5 ± 2.5 | 40 ± 2.5 |
| 12 | 5 ± 2.5 | 45 ± 2.5 |
| 13 | 10 ± 2.5 | 0 ± 2.5 |
| 14 | 10 ± 2.5 | 5 ± 2.5 |
| 15 | 10 ± 2.5 | 10 ± 2.5 |
| 16 | 10 ± 2.5 | 35 ± 2.5 |
| 17 | 10 ± 2.5 | 40 ± 2.5 |
| 18 | 10 ± 2.5 | 45 ± 2.5 |
| 19 | 15 ± 2.5 | 0 ± 2.5 |
| 20 | 15 ± 2.5 | 5 ± 2.5 |
| 21 | 15 ± 2.5 | 10 ± 2.5 |

TABLE 10-continued

| Condition | $\alpha1_{111}(°)$ | $\alpha2_{100}(°)$ |
|---|---|---|
| 22 | 15 ± 2.5 | 35 ± 2.5 |
| 23 | 15 ± 2.5 | 40 ± 2.5 |
| 24 | 15 ± 2.5 | 45 ± 2.5 |
| 25 | 20 ± 2.5 | 0 ± 2.5 |
| 26 | 20 ± 2.5 | 5 ± 2.5 |
| 27 | 20 ± 2.5 | 10 ± 2.5 |
| 28 | 20 ± 2.5 | 30 ± 2.5 |
| 29 | 20 ± 2.5 | 35 ± 2.5 |
| 30 | 20 ± 2.5 | 40 ± 2.5 |
| 31 | 20 ± 2.5 | 45 ± 2.5 |
| 32 | 25 ± 2.5 | 0 ± 2.5 |
| 33 | 25 ± 2.5 | 5 ± 2.5 |
| 34 | 25 ± 2.5 | 10 ± 2.5 |
| 35 | 30 ± 2.5 | 0 ± 2.5 |
| 36 | 30 ± 2.5 | 5 ± 2.5 |
| 37 | 30 ± 2.5 | 10 ± 2.5 |
| 38 | 30 ± 2.5 | 15 ± 2.5 |
| 39 | 30 ± 2.5 | 20 ± 2.5 |
| 40 | 30 ± 2.5 | 25 ± 2.5 |
| 41 | 35 ± 2.5 | 0 ± 2.5 |
| 42 | 35 ± 2.5 | 5 ± 2.5 |
| 43 | 35 ± 2.5 | 10 ± 2.5 |
| 44 | 35 ± 2.5 | 15 ± 2.5 |
| 45 | 35 ± 2.5 | 20 ± 2.5 |
| 46 | 35 ± 2.5 | 25 ± 2.5 |
| 47 | 35 ± 2.5 | 30 ± 2.5 |
| 48 | 35 ± 2.5 | 35 ± 2.5 |
| 49 | 35 ± 2.5 | 40 ± 2.5 |
| 50 | 40 ± 2.5 | 0 ± 2.5 |
| 51 | 40 ± 2.5 | 5 ± 2.5 |
| 52 | 40 ± 2.5 | 10 ± 2.5 |
| 53 | 40 ± 2.5 | 20 ± 2.5 |
| 54 | 40 ± 2.5 | 30 ± 2.5 |
| 55 | 40 ± 2.5 | 35 ± 2.5 |
| 56 | 40 ± 2.5 | 40 ± 2.5 |
| 57 | 40 ± 2.5 | 45 ± 2.5 |
| 58 | 45 ± 2.5 | 0 ± 2.5 |
| 59 | 45 ± 2.5 | 5 ± 2.5 |
| 60 | 45 ± 2.5 | 10 ± 2.5 |
| 61 | 45 ± 2.5 | 20 ± 2.5 |
| 62 | 45 ± 2.5 | 30 ± 2.5 |
| 63 | 45 ± 2.5 | 35 ± 2.5 |
| 64 | 45 ± 2.5 | 40 ± 2.5 |
| 65 | 45 ± 2.5 | 45 ± 2.5 |
| 66 | 50 ± 2.5 | 0 ± 2.5 |
| 67 | 50 ± 2.5 | 5 ± 2.5 |
| 68 | 50 ± 2.5 | 10 ± 2.5 |
| 69 | 50 ± 2.5 | 15 ± 2.5 |
| 70 | 50 ± 2.5 | 20 ± 2.5 |
| 71 | 50 ± 2.5 | 35 ± 2.5 |
| 72 | 50 ± 2.5 | 40 ± 2.5 |
| 73 | 50 ± 2.5 | 45 ± 2.5 |
| 74 | 55 ± 2.5 | 0 ± 2.5 |
| 75 | 55 ± 2.5 | 5 ± 2.5 |
| 76 | 55 ± 2.5 | 15 ± 2.5 |
| 77 | 55 ± 2.5 | 20 ± 2.5 |
| 78 | 55 ± 2.5 | 35 ± 2.5 |
| 79 | 55 ± 2.5 | 40 ± 2.5 |
| 80 | 55 ± 2.5 | 45 ± 2.5 |
| 81 | 60 ± 2.5 | 5 ± 2.5 |
| 82 | 60 ± 2.5 | 10 ± 2.5 |
| 83 | 60 ± 2.5 | 15 ± 2.5 |
| 84 | 60 ± 2.5 | 20 ± 2.5 |
| 85 | 60 ± 2.5 | 35 ± 2.5 |
| 86 | 60 ± 2.5 | 40 ± 2.5 |
| 87 | 60 ± 2.5 | 45 ± 2.5 |

TABLE 11

| Condition | $\alpha1_{111}(°)$ | $\alpha2_{100}(°)$ |
|---|---|---|
| 1 | 0 ± 2.5 | 40 ± 2.5 |
| 2 | 0 ± 2.5 | 45 ± 2.5 |
| 3 | 5 ± 2.5 | 40 ± 2.5 |
| 4 | 5 ± 2.5 | 45 ± 2.5 |

TABLE 11-continued

| Condition | $\alpha 1_{111}(°)$ | $\alpha 2_{100}(°)$ |
|---|---|---|
| 5 | 10 ± 2.5 | 40 ± 2.5 |
| 6 | 10 ± 2.5 | 45 ± 2.5 |
| 7 | 15 ± 2.5 | 40 ± 2.5 |
| 8 | 15 ± 2.5 | 45 ± 2.5 |

When $\alpha 1_{111}$ and $\alpha 2_{100}$ are any of the combinations shown in Table 10, the higher-order modes can be effectively reduced or prevented. Further, when $\alpha 1_{111}$ and $\alpha 2_{100}$ are any of the combinations shown in Table 11, the higher-order modes can be further reduced or prevented.

Figure 23:
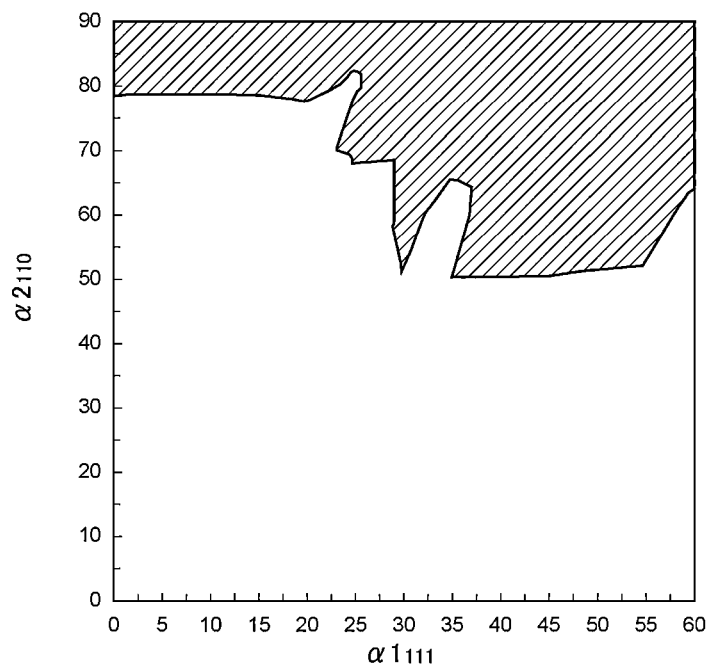
FIG. 23 is a diagram showing a range for $\alpha1_{111}$ and $\alpha2_{110}$ in which the phase of the higher-order mode is about −70 deg or less.

FIG. 23 is a diagram showing a range for $\alpha 1_{111}$ and $\alpha 2_{110}$ in which the phase of the higher-order mode is about −70 deg or less. Table 12 shows the range in which the phase of the higher-order mode is about −70 deg or less shown in FIG. 23. Further, Table 13 shows a range in which the phase of the higher-order mode is about −80 deg or less.

TABLE 12

| Condition | $\alpha 1_{111}(°)$ | $\alpha 2_{110}(°)$ |
|---|---|---|
| 1 | 0 ± 2.5 | 80 ± 5 |
| 2 | 0 ± 2.5 | 90 ± 5 |
| 3 | 5 ± 2.5 | 80 ± 5 |
| 4 | 5 ± 2.5 | 90 ± 5 |
| 5 | 10 ± 2.5 | 80 ± 5 |
| 6 | 10 ± 2.5 | 90 ± 5 |
| 7 | 15 ± 2.5 | 80 ± 5 |
| 8 | 15 ± 2.5 | 90 ± 5 |
| 9 | 20 ± 2.5 | 80 ± 5 |
| 10 | 20 ± 2.5 | 90 ± 5 |
| 11 | 25 ± 2.5 | 70 ± 5 |
| 12 | 25 ± 2.5 | 90 ± 5 |
| 13 | 30 ± 2.5 | 60 ± 5 |
| 14 | 30 ± 2.5 | 70 ± 5 |
| 15 | 30 ± 2.5 | 80 ± 5 |
| 16 | 30 ± 2.5 | 90 ± 5 |
| 17 | 35 ± 2.5 | 70 ± 5 |
| 18 | 35 ± 2.5 | 80 ± 5 |
| 19 | 35 ± 2.5 | 90 ± 5 |
| 20 | 40 ± 2.5 | 60 ± 5 |
| 21 | 40 ± 2.5 | 70 ± 5 |
| 22 | 40 ± 2.5 | 80 ± 5 |
| 23 | 40 ± 2.5 | 90 ± 5 |
| 24 | 45 ± 2.5 | 60 ± 5 |
| 25 | 45 ± 2.5 | 70 ± 5 |
| 26 | 45 ± 2.5 | 80 ± 5 |
| 27 | 45 ± 2.5 | 90 ± 5 |
| 28 | 50 ± 2.5 | 60 ± 5 |
| 29 | 50 ± 2.5 | 70 ± 5 |
| 30 | 50 ± 2.5 | 80 ± 5 |
| 31 | 50 ± 2.5 | 90 ± 5 |
| 32 | 55 ± 2.5 | 60 ± 5 |
| 33 | 55 ± 2.5 | 70 ± 5 |
| 34 | 55 ± 2.5 | 80 ± 5 |
| 35 | 55 ± 2.5 | 90 ± 5 |
| 36 | 60 ± 2.5 | 70 ± 5 |
| 37 | 60 ± 2.5 | 80 ± 5 |
| 38 | 60 ± 2.5 | 90 ± 5 |

TABLE 13

| Condition | $\alpha 1_{111}(°)$ | $\alpha 2_{110}(°)$ |
|---|---|---|
| 1 | 30 ± 2.5 | 80 ± 5 |
| 2 | 30 ± 2.5 | 90 ± 5 |
| 3 | 35 ± 2.5 | 80 ± 5 |
| 4 | 35 ± 2.5 | 90 ± 5 |
| 5 | 40 ± 2.5 | 60 ± 5 |
| 6 | 40 ± 2.5 | 80 ± 5 |
| 7 | 45 ± 2.5 | 60 ± 5 |

When $\alpha 1_{111}$ and $\alpha 2_{110}$ are any of the combinations shown in Table 12, the higher-order modes can be effectively reduced or prevented. Further, when $\alpha 1_{111}$ and $\alpha 2_{110}$ are any of the combinations shown in Table 13, the higher-order modes can be further reduced or prevented.

Figure 24:
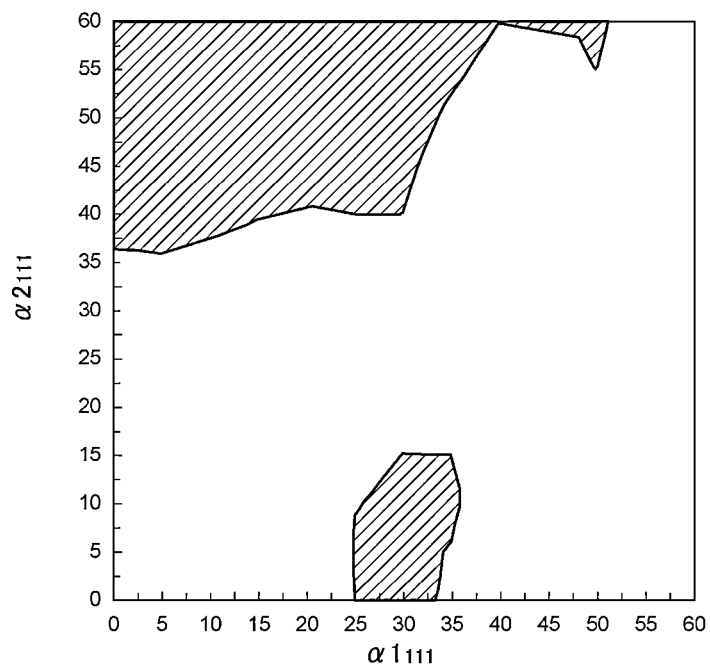
FIG. 24 is a diagram showing a range for $\alpha1_{111}$ and $\alpha2_{111}$ in which the phase of the higher-order mode is about −70 deg or less.

FIG. 24 is a diagram showing a range for $\alpha 1_{111}$ and $\alpha 2_{111}$ in which the phase of the higher-order mode is about −70 deg or less. Table 14 shows the range in which the phase of the higher-order mode is about −70 deg or less shown in FIG. 24.

TABLE 14

| Condition | $\alpha 1_{111}(°)$ | $\alpha 2_{111}(°)$ |
|---|---|---|
| 1 | 0 ± 2.5 | 40 ± 2.5 |
| 2 | 0 ± 2.5 | 45 ± 2.5 |
| 3 | 0 ± 2.5 | 50 ± 2.5 |
| 4 | 0 ± 2.5 | 55 ± 2.5 |
| 5 | 0 ± 2.5 | 60 ± 2.5 |
| 6 | 5 ± 2.5 | 40 ± 2.5 |
| 7 | 5 ± 2.5 | 45 ± 2.5 |
| 8 | 5 ± 2.5 | 50 ± 2.5 |
| 9 | 5 ± 2.5 | 55 ± 2.5 |
| 10 | 5 ± 2.5 | 60 ± 2.5 |
| 11 | 10 ± 2.5 | 40 ± 2.5 |
| 12 | 10 ± 2.5 | 45 ± 2.5 |
| 13 | 10 ± 2.5 | 50 ± 2.5 |
| 14 | 10 ± 2.5 | 55 ± 2.5 |
| 15 | 10 ± 2.5 | 60 ± 2.5 |
| 16 | 15 ± 2.5 | 40 ± 2.5 |
| 17 | 15 ± 2.5 | 45 ± 2.5 |
| 18 | 15 ± 2.5 | 50 ± 2.5 |
| 19 | 15 ± 2.5 | 55 ± 2.5 |
| 20 | 15 ± 2.5 | 60 ± 2.5 |
| 21 | 20 ± 2.5 | 45 ± 2.5 |
| 22 | 20 ± 2.5 | 50 ± 2.5 |
| 23 | 20 ± 2.5 | 55 ± 2.5 |
| 24 | 20 ± 2.5 | 60 ± 2.5 |
| 25 | 25 ± 2.5 | 0 ± 2.5 |
| 26 | 25 ± 2.5 | 5 ± 2.5 |
| 27 | 25 ± 2.5 | 40 ± 2.5 |
| 28 | 25 ± 2.5 | 45 ± 2.5 |
| 29 | 25 ± 2.5 | 50 ± 2.5 |
| 30 | 25 ± 2.5 | 55 ± 2.5 |
| 31 | 25 ± 2.5 | 60 ± 2.5 |
| 32 | 30 ± 2.5 | 0 ± 2.5 |
| 33 | 30 ± 2.5 | 5 ± 2.5 |
| 34 | 30 ± 2.5 | 10 ± 2.5 |
| 35 | 30 ± 2.5 | 15 ± 2.5 |
| 36 | 30 ± 2.5 | 40 ± 2.5 |
| 37 | 30 ± 2.5 | 45 ± 2.5 |
| 38 | 30 ± 2.5 | 50 ± 2.5 |
| 39 | 30 ± 2.5 | 55 ± 2.5 |
| 40 | 30 ± 2.5 | 60 ± 2.5 |
| 41 | 35 ± 2.5 | 10 ± 2.5 |
| 42 | 35 ± 2.5 | 15 ± 2.5 |
| 43 | 35 ± 2.5 | 60 ± 2.5 |
| 44 | 40 ± 2.5 | 60 ± 2.5 |
| 45 | 50 ± 2.5 | 55 ± 2.5 |
| 46 | 50 ± 2.5 | 60 ± 2.5 |

When $\alpha 1_{111}$ and $\alpha 2_{111}$ are any of the combinations shown in Table 14, the higher-order modes can be effectively reduced or prevented.

Figure 25:
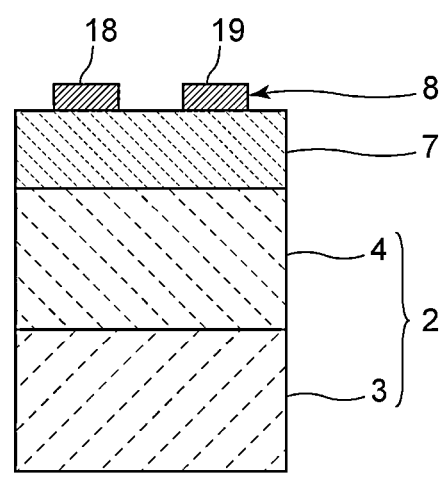
FIG. 25 is a front cross-sectional view illustrating a portion of an acoustic wave device according to a modified example of the first preferred embodiment of the present invention.

As illustrated in FIG. 1, in the first preferred embodiment, the first intermediate layer 5 is provided between the support substrate 2 and the piezoelectric film 7. The first intermediate layer 5 does not necessarily have to be provided. In a modified example of the first preferred embodiment illustrated in FIG. 25, the piezoelectric film 7 is provided directly on the second silicon layer 4 of the support substrate 2. Also in this case, similarly to the first preferred embodiment, the higher-order modes can be reduced or prevented in a wide band.

A thickness of the second silicon layer 4 is preferably equal to or less than a thickness of the first silicon layer 3.

The thickness of the second silicon layer 4 is more preferably smaller than the thickness of the first silicon layer 3. In these cases, since waves excited by the IDT electrode 8 suitably propagate to the first silicon layer 3, the advantageous effect of reducing or preventing the higher-order modes in a wide range is suitably achieved.

Figure 26:
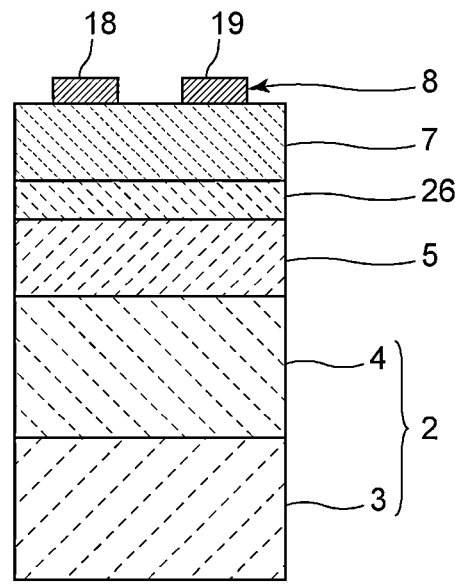
FIG. 26 is a front cross-sectional view illustrating a portion of an acoustic wave device according to a second preferred embodiment of the present invention.

FIG. 26 is a front cross-sectional view illustrating a portion of an acoustic wave device according to a second preferred embodiment of the present invention.

The present preferred embodiment is different from the first preferred embodiment in that a second intermediate layer 26 is provided between the first intermediate layer 5 and the piezoelectric film 7. Except for the above point, the acoustic wave device according to the present preferred embodiment has a configuration the same as or similar to that of the acoustic wave device 1 according to the first preferred embodiment.

The plane orientation of the first silicon layer 3 in the present preferred embodiment is (111), the Euler angles are (−about 45°, about −54.7°, about 0°), the angle α1 is the angle $\alpha_{111}$, and the value of the angle α1 is about 0°. The plane orientation of the second silicon layer 4 is (100), the Euler angles are (about 0°, about 0°, about 45°), the angle α2 is the angle $\alpha_{100}$, and the value of the angle α2 is about 45°. The second intermediate layer 26 is, for example, a silicon nitride film. The second intermediate layer 26 may be, for example, a film including silicon nitride.

Also in the present preferred embodiment, the higher-order modes can be reduced or prevented in a wide band. This will be demonstrated in the following by comparing the second preferred embodiment with the first preferred embodiment. Design parameters of the acoustic wave device having the configuration of the second preferred embodiment are as follows.

First silicon layer 3; plane orientation: (111), Euler angles (about −45°, about −54.7°, about 0°), thickness: about 20 μm Second silicon layer 4; plane orientation: (100), Euler angles (about 0°, about 0°, about 45°), thickness: about 1 μm First intermediate layer 5; material: SiO$_2$, thickness: about 300 nm Second intermediate layer 26; material: SiN, thickness: about 50 nm Piezoelectric film 7; material: 40° Y-cut X-propagation LiTaO$_3$, Euler angles (about 0°, about 130°, about 0°), thickness: about 400 nm Angle α1; type: angle $\alpha_{111}$, value: about 0°

Angle α2; type: angle $\alpha_{100}$, value: about 45°

Layer configuration of IDT electrode 8; layer configuration: (Ti layer)/(AlCu layer (Cu-1 wt. %))/(Ti layer) from piezoelectric film 7 side, thickness: (about 12 nm)/(about 100 nm)/(about 4 nm) from piezoelectric film 7 side Wavelength λ of IDT electrode 8; about 2 μm Duty ratio of IDT electrode 8; about 0.5

Figure 27:
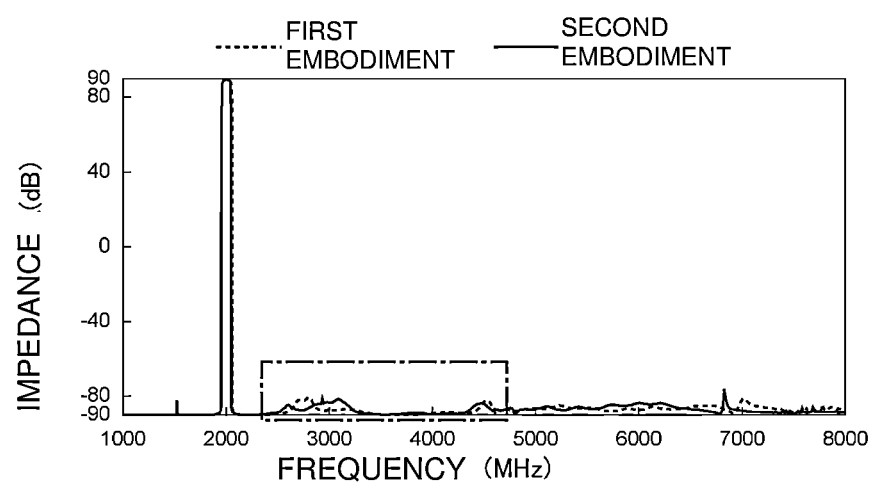
FIG. 27 is a diagram showing phase characteristics of the acoustic wave devices according to the first and second preferred embodiments of the present invention.
Figure 28:
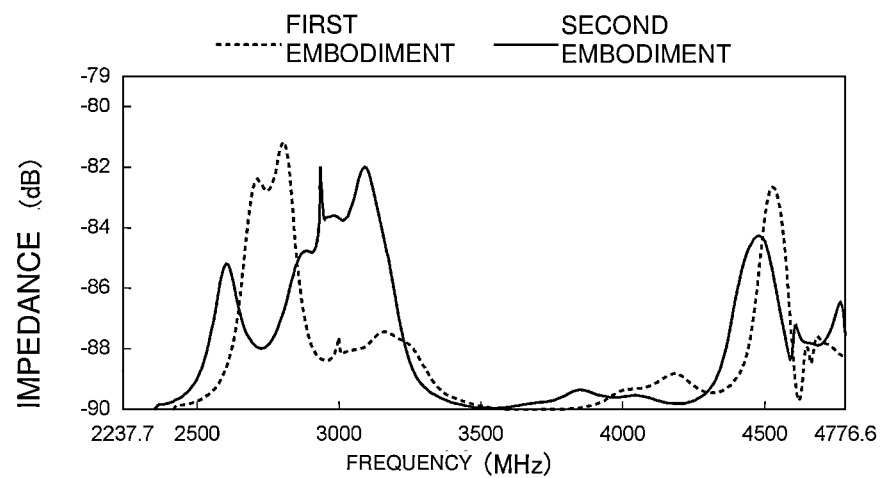
FIG. 28 is a diagram showing the phase characteristics in a partial range of the frequency in FIG. 27.

FIG. 27 is a diagram showing phase characteristics of the acoustic wave devices according to the first preferred embodiment and the second preferred embodiment. FIG. 28 is a diagram showing the phase characteristics in a partial range of the frequency in FIG. 27.

In both of the first preferred embodiment and the second preferred embodiment, it is possible to reduce or prevent the higher-order modes in a wide band indicated by a long dashed short dashed line in FIG. 27. As shown in FIG. 28, when the highest portions in the waveforms of the higher-order modes in the first preferred embodiment and the second preferred embodiment are compared, it can be seen that the higher-order modes are further reduced or prevented in the second preferred embodiment.

The piezoelectric film 7 may be, for example, a lithium tantalate film or a lithium niobate film. On the other hand, the second intermediate layer 26 is, for example, a silicon nitride film. In this case, the acoustic velocity of the bulk wave propagating through the second intermediate layer 26 is higher than the acoustic velocity of the acoustic wave propagating through the piezoelectric film 7. Thus, the second intermediate layer 26 is a high acoustic velocity film. In the present preferred embodiment, since the second intermediate layer 26 as a high acoustic velocity film is laminated, the higher-order modes can be further reduced or prevented.

Here, the phase of the higher-order mode was measured for different thicknesses of the second silicon layer 4. The measured higher-order modes are higher-order modes at about 3.0 times or less the resonant frequency. More specifically, the thickness of the second silicon layer 4 was varied in 0.1 μm increments in a range of about 0.1 μm to about 3 μm. The wavelength λ was set to about 2 μm. Thus, when expressed based on λ, the thickness of the second silicon layer 4 is varied in 0.05λ increments in a range of about 0.05λ to about 1.5λ. Design parameters of the acoustic wave device for which the phase of the higher-order mode were measured are as follows.

First silicon layer 3; plane orientation: (111), Euler angles (about −45°, about −54.7°, about 0°), thickness: about 20 μm Second silicon layer 4; plane orientation: (100), Euler angles (0°, 0°, 45°), thickness: varied in 0.1 μm increments in the range of 0.1 μm to 3 μm.

First intermediate layer 5; material: SiO$_2$, thickness: about 300 nm

Second intermediate layer 26; material: SiN, thickness: about 50 nm

Piezoelectric film 7; material: about 40° Y-cut X-propagation LiTaO$_3$, Euler angles (about 0°, about 130°, about 0°), thickness: about 400 nm Angle α1; type: angle $\alpha_{111}$, value: about 0°

Angle α2; type: angle $\alpha_{100}$, value: about 45°

Layer configuration of IDT electrode 8; layer configuration: (Ti layer)/(AlCu layer (Cu-1 wt. %))/(Ti layer) from piezoelectric film 7 side, thickness: (about 12 nm)/(about 100 nm)/(about 4 nm) from piezoelectric film 7 side Wavelength λ of IDT electrode 8; about 2 μm Duty ratio of IDT electrode 8; about 0.5

Figure 29:
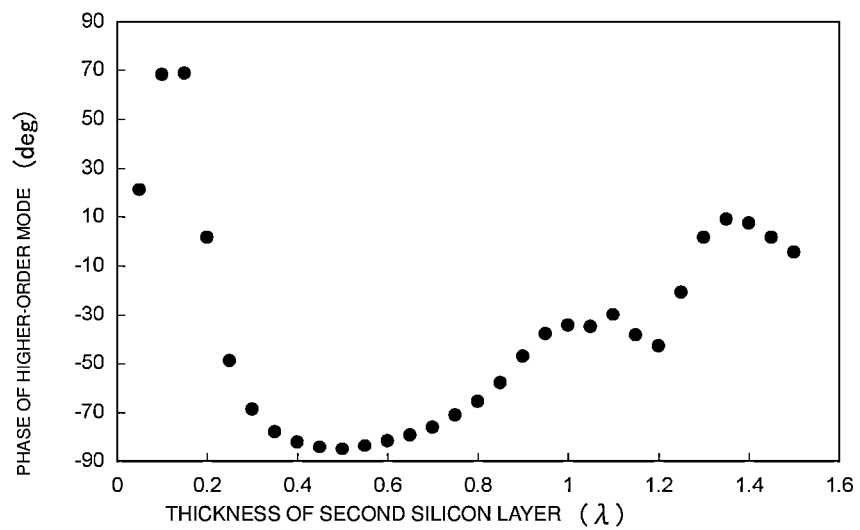
FIG. 29 is a diagram showing a relationship between a thickness of a second silicon layer and the phase of the higher-order mode, in the acoustic wave device according to the second preferred embodiment of the present invention.
Figure 30:
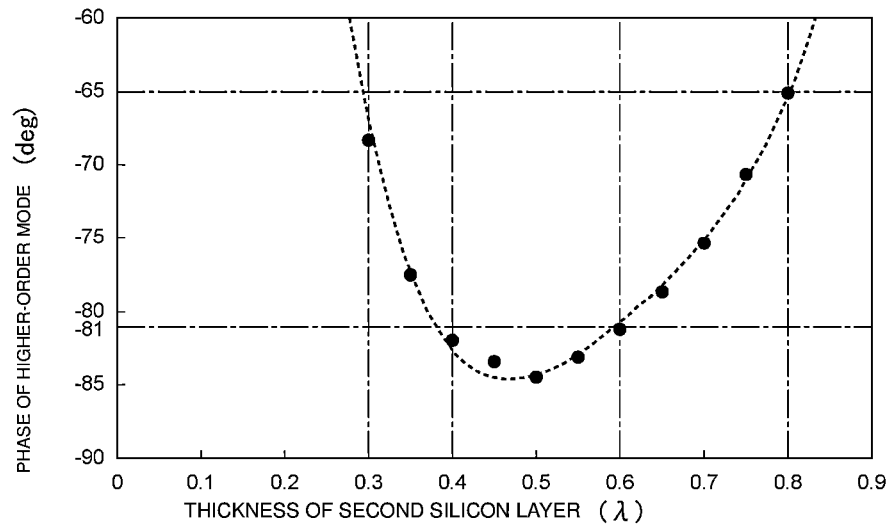
FIG. 30 is a diagram showing the relationship between the thickness of the second silicon layer and the phase of the higher-order mode in a partial range of the thickness of the second silicon layer in FIG. 29.

FIG. 29 is a diagram showing a relationship between the thickness of the second silicon layer and the phase of the higher-order mode in the acoustic wave device according to the second preferred embodiment. FIG. 30 is a diagram showing the relationship between the thickness of the second silicon layer and the phase of the higher-order mode in a partial range of the thickness of the second silicon layer in FIG. 29.

As shown in FIGS. 29 and 30, when the thickness of the second silicon layer 4 is about 0.3λ to about 0.8λ, the higher-order mode can be reduced to about −65 deg or less. Further, when the thickness of the second silicon layer 4 is about 0.4λ to about 0.6λ, the higher-order mode can be reduced to less than −81 deg. Thus, the thickness of the second silicon layer 4 is preferably about 0.3λ to about 0.8λ, and more preferably about 0.4λ to about 0.6λ, for example. This makes it possible to effectively reduce or prevent higher-order modes.

Further, by varying θ in Euler angles (φ, θ, ψ) of the piezoelectric film 7, a phase of Rayleigh waves as unwanted waves was measured. Note that φ and ψ in the Euler angles were set to about 0°. Design parameters of the acoustic wave device for which the phase of Rayleigh waves was measured are as follows.

First silicon layer 3; plane orientation: (111), Euler angles (about −45°, about −54.7°, about 0°), thickness: about 20 μm Second silicon layer 4; plane orientation: (100), Euler angles (about 0°, about 0°, about 45°), thickness: about 1 μm First intermediate layer 5; material: $SiO_2$, thickness: about 300 nm Second intermediate layer 26; material: SiN, thickness: about 50 nm Piezoelectric film 7; material: Y-cut X-propagation $LiTaO_3$, cut-angles: varied in 5° increments in a range of about 0° to about 60°. θ in Euler angles (0°, θ, 0°): varied in 5° increments in a range of about 900 to about 150°. Thickness: about 400 nm Angle α1; type: angle $\alpha_{111}$, value: about 0°

Angle α2; type: angle $\alpha_{100}$, value: about 450

Layer configuration of IDT electrode 8; layer configuration: (Ti layer)/(AlCu layer (Cu-1 wt. %))/(Ti layer) from piezoelectric film 7 side, thickness: (about 12 nm)/(about 100 nm)/(about 4 nm) from piezoelectric film 7 side Wavelength λ of IDT electrode 8; about 2 μm Duty ratio of IDT electrode 8; about 0.5

Figure 31:
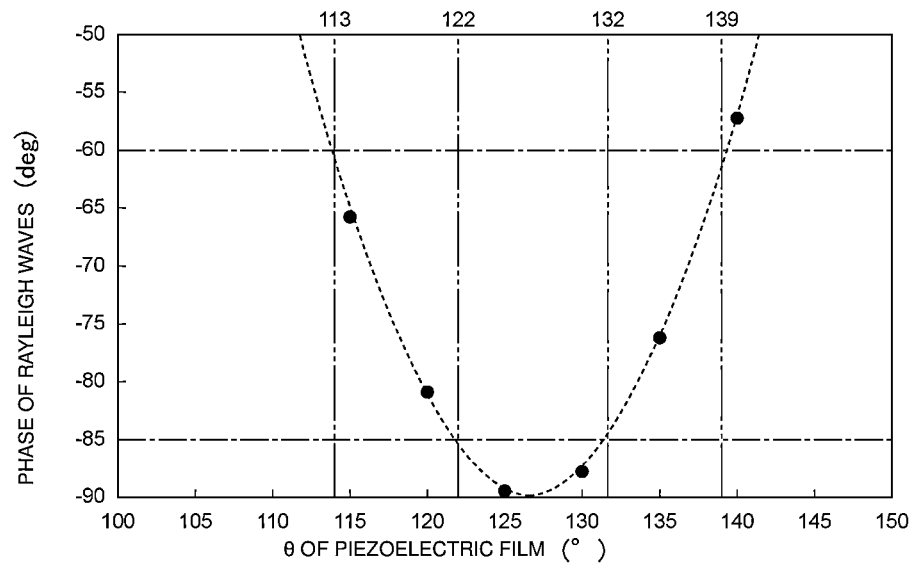
FIG. 31 is a diagram showing a relationship between θ in Euler angles of a piezoelectric film and a phase of Rayleigh waves.

FIG. 31 is a diagram showing a relationship between 0 in the Euler angles of the piezoelectric film and the phase of the Rayleigh waves.

As shown in FIG. 31, when θ in the Euler angles of the piezoelectric film 7 is about 113° to about 139°, the phase of the Rayleigh waves as unwanted waves can be reduced to −60 deg or less. Further, when θ is about 1220 to about 132°, the phase of the Rayleigh waves can be reduced to approximately about −85 deg or less. Thus, θ in the Euler angles of the piezoelectric film 7 is preferably about 113° to about 139°, and more preferably about 122° to about 132°, for example. This makes it possible to effectively reduce or prevent the Rayleigh waves as unwanted waves.

Here, in an acoustic wave device having a configuration the same as or similar to that illustrated in FIG. 26, the angle α1 and the angle α2 were varied to measure the phase of the higher-order mode. Thus, a combination of the angle α1 and the angle α2 capable of effectively reducing or preventing the higher-order modes was obtained. Design parameters of each of the acoustic wave devices for which the phases of the higher-order modes were obtained are the same or substantially the same as those of the acoustic wave device for which the impedance frequency characteristic shown in FIG. 27 was obtained, except for the plane orientation of the first silicon layer 3, the plane orientation of the second silicon layer 4, and the angle α1 or α2. In each of the acoustic wave devices for which the phases of the higher-order modes were obtained, the IDT electrode 8 is provided on the negative surface of the piezoelectric film 7. Types of the angle α1 and the angle α2 and ranges in which the values of the angle α1 and the angle α2 were varied are the same or substantially the same as those when the combinations of the angle α1 and the angle α2 in Tables 1 to 14 were obtained. The measured higher-order modes are higher-order modes at about 3.0 times or less the resonant frequency.

Figure 32:
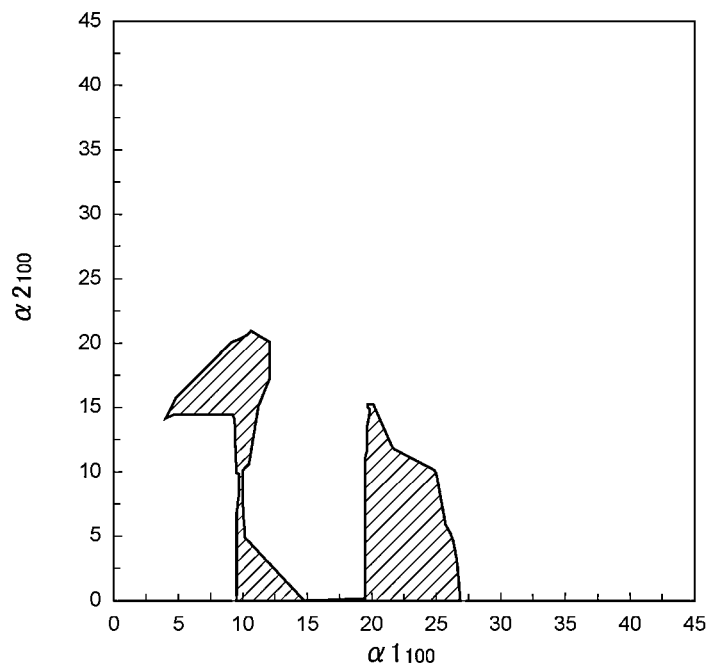
FIG. 32 is a diagram showing a range for $\alpha1_{100}$ and $\alpha2_{100}$ in which the phase of the higher-order mode is about −70 deg or less.

FIG. 32 is a diagram showing a range for $\alpha1_{100}$ and $\alpha2_{100}$ in which the phase of the higher-order mode is about −70 deg or less. Table 15 shows the range in which the phase of the higher-order mode is about −70 deg or less shown in FIG. 32.

TABLE 15

| Condition | $\alpha1_{100}(°)$ | $\alpha2_{100}(°)$ |
|---|---|---|
| 1 | 0 ± 2.5 | 20 ± 2.5 |
| 2 | 5 ± 2.5 | 15 ± 2.5 |
| 3 | 5 ± 2.5 | 30 ± 2.5 |
| 4 | 10 ± 2.5 | 0 ± 2.5 |
| 5 | 10 ± 2.5 | 5 ± 2.5 |
| 6 | 10 ± 2.5 | 15 ± 2.5 |
| 7 | 10 ± 2.5 | 20 ± 2.5 |
| 8 | 20 ± 2.5 | 0 ± 2.5 |
| 9 | 20 ± 2.5 | 5 ± 2.5 |
| 10 | 20 ± 2.5 | 10 ± 2.5 |
| 11 | 20 ± 2.5 | 15 ± 2.5 |
| 12 | 25 ± 2.5 | 0 ± 2.5 |
| 13 | 25 ± 2.5 | 5 ± 2.5 |
| 14 | 25 ± 2.5 | 10 ± 2.5 |

When $\alpha1_{100}$ and $\alpha2_{100}$ are any of the combinations shown in Table 15, the phase of the higher-order mode can be suppressed to about −70 deg or less. Thus, the higher-order modes can be effectively reduced or prevented under the conditions shown in Table 15.

Figure 33:
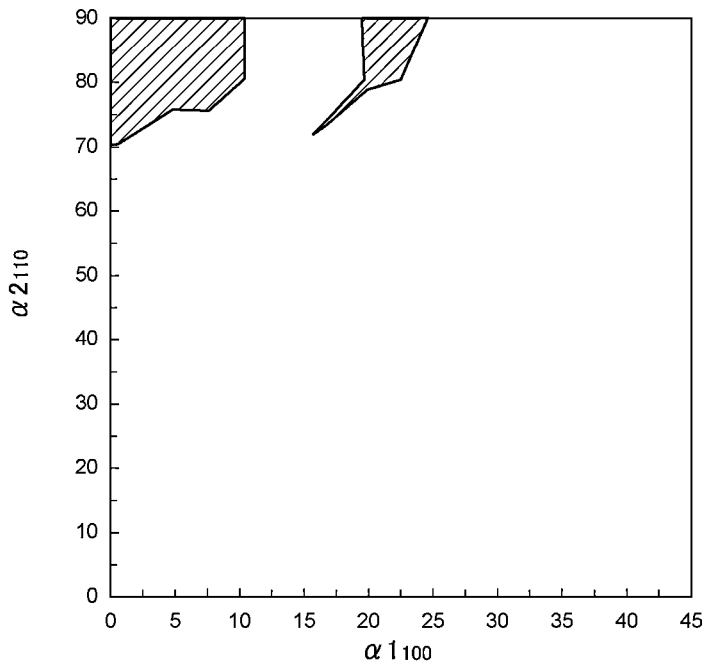
FIG. 33 is a diagram showing a range for $\alpha1_{100}$ and $\alpha2_{110}$ in which the phase of the higher-order mode is about −70 deg or less.

FIG. 33 is a diagram showing a range for $\alpha1_{100}$ and $\alpha2_{110}$ in which the phase of the higher-order mode is about −70 deg or less. Table 16 shows the range in which the phase of the higher-order mode is about −70 deg or less shown in FIG. 33.

TABLE 16

| Condition | $\alpha1_{100}(°)$ | $\alpha2_{110}(°)$ |
|---|---|---|
| 1 | 0 ± 2.5 | 70 ± 5 |
| 2 | 0 ± 2.5 | 80 ± 5 |
| 3 | 0 ± 2.5 | 90 ± 5 |
| 4 | 5 ± 2.5 | 80 ± 5 |
| 5 | 5 ± 2.5 | 90 ± 5 |
| 6 | 10 ± 2.5 | 80 ± 5 |
| 7 | 10 ± 2.5 | 90 ± 5 |
| 8 | 20 ± 2.5 | 80 ± 5 |
| 9 | 20 ± 2.5 | 90 ± 5 |

When $\alpha1_{100}$ and $\alpha2_{110}$ are any of the combinations shown in Table 16, the higher-order modes can be effectively reduced or prevented.

Figure 34:
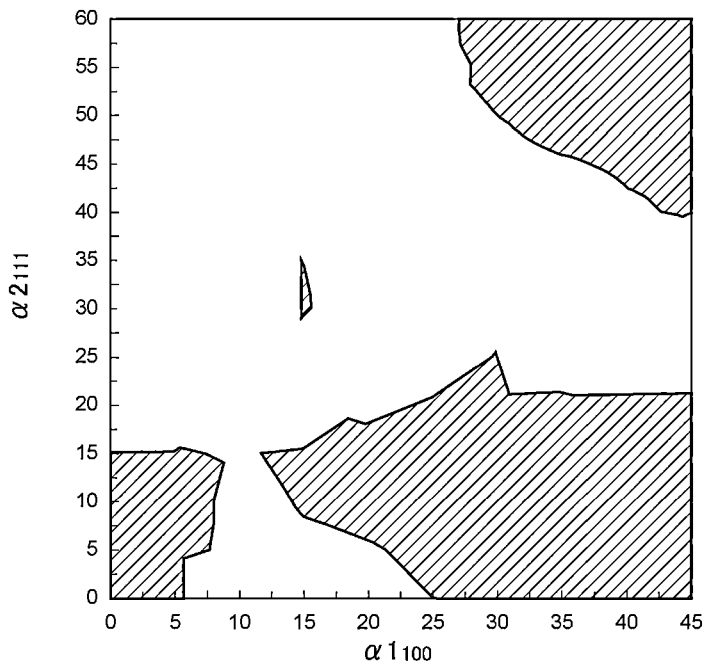
FIG. 34 is a diagram showing a range for $\alpha1_{100}$ and $\alpha2_{111}$ in which the phase of the higher-order mode is about −70 deg or less.

FIG. 34 is a diagram showing a range for $\alpha1_{100}$ and $\alpha2_{111}$ in which the phase of the higher-order mode is about −70 deg or less. Table 17 shows the range in which the phase of the higher-order mode is about −70 deg or less shown in FIG. 34. Further, Table 18 shows a range in which the phase of the higher-order mode is about −80 deg or less.

TABLE 17

| Condition | $\alpha1_{100}(°)$ | $\alpha2_{111}(°)$ |
|---|---|---|
| 1 | 0 ± 2.5 | 0 ± 2.5 |
| 2 | 0 ± 2.5 | 5 ± 2.5 |
| 3 | 0 ± 2.5 | 10 ± 2.5 |
| 4 | 0 ± 2.5 | 15 ± 2.5 |
| 5 | 0 ± 2.5 | 30 ± 2.5 |
| 6 | 5 ± 2.5 | 0 ± 2.5 |
| 7 | 5 ± 2.5 | 5 ± 2.5 |
| 8 | 5 ± 2.5 | 10 ± 2.5 |
| 9 | 5 ± 2.5 | 15 ± 2.5 |

TABLE 17-continued

| Condition | $\alpha1_{100}(°)$ | $\alpha2_{111}(°)$ |
|---|---|---|
| 10 | 5 ± 2.5 | 30 ± 2.5 |
| 11 | 15 ± 2.5 | 10 ± 2.5 |
| 12 | 15 ± 2.5 | 15 ± 2.5 |
| 13 | 15 ± 2.5 | 30 ± 2.5 |
| 14 | 15 ± 2.5 | 35 ± 2.5 |
| 15 | 20 ± 2.5 | 10 ± 2.5 |
| 16 | 20 ± 2.5 | 15 ± 2.5 |
| 17 | 25 ± 2.5 | 5 ± 2.5 |
| 18 | 25 ± 2.5 | 10 ± 2.5 |
| 19 | 25 ± 2.5 | 15 ± 2.5 |
| 20 | 25 ± 2.5 | 20 ± 2.5 |
| 21 | 30 ± 2.5 | 0 ± 2.5 |
| 22 | 30 ± 2.5 | 5 ± 2.5 |
| 23 | 30 ± 2.5 | 10 ± 2.5 |
| 24 | 30 ± 2.5 | 15 ± 2.5 |
| 25 | 30 ± 2.5 | 20 ± 2.5 |
| 26 | 30 ± 2.5 | 25 ± 2.5 |
| 27 | 30 ± 2.5 | 50 ± 2.5 |
| 28 | 30 ± 2.5 | 55 ± 2.5 |
| 29 | 30 ± 2.5 | 60 ± 2.5 |
| 30 | 35 ± 2.5 | 0 ± 2.5 |
| 31 | 35 ± 2.5 | 5 ± 2.5 |
| 32 | 35 ± 2.5 | 10 ± 2.5 |
| 33 | 35 ± 2.5 | 15 ± 2.5 |
| 34 | 35 ± 2.5 | 20 ± 2.5 |
| 35 | 35 ± 2.5 | 50 ± 2.5 |
| 36 | 35 ± 2.5 | 55 ± 2.5 |
| 37 | 35 ± 2.5 | 60 ± 2.5 |
| 38 | 40 ± 2.5 | 0 ± 2.5 |
| 39 | 40 ± 2.5 | 5 ± 2.5 |
| 40 | 40 ± 2.5 | 10 ± 2.5 |
| 41 | 40 ± 2.5 | 15 ± 2.5 |
| 42 | 40 ± 2.5 | 20 ± 2.5 |
| 43 | 40 ± 2.5 | 45 ± 2.5 |
| 44 | 40 ± 2.5 | 50 ± 2.5 |
| 45 | 40 ± 2.5 | 55 ± 2.5 |
| 46 | 40 ± 2.5 | 60 ± 2.5 |
| 47 | 45 ± 2.5 | 0 ± 2.5 |
| 48 | 45 ± 2.5 | 5 ± 2.5 |
| 49 | 45 ± 2.5 | 10 ± 2.5 |
| 50 | 45 ± 2.5 | 15 ± 2.5 |
| 51 | 45 ± 2.5 | 20 ± 2.5 |
| 52 | 45 ± 2.5 | 40 ± 2.5 |
| 53 | 45 ± 2.5 | 45 ± 2.5 |
| 54 | 45 ± 2.5 | 50 ± 2.5 |
| 55 | 45 ± 2.5 | 55 ± 2.5 |
| 56 | 45 ± 2.5 | 60 ± 2.5 |

TABLE 18

| Condition | $\alpha1_{100}(°)$ | $\alpha2_{111}(°)$ |
|---|---|---|
| 1 | 0 ± 2.5 | 0 ± 2.5 |
| 2 | 0 ± 2.5 | 5 ± 2.5 |
| 3 | 0 ± 2.5 | 10 ± 2.5 |
| 4 | 5 ± 2.5 | 0 ± 2.5 |
| 5 | 5 ± 2.5 | 5 ± 2.5 |
| 6 | 5 ± 2.5 | 10 ± 2.5 |

When $\alpha1_{100}$ and $\alpha2_{111}$ are any of the combinations shown in Table 17, the higher-order modes can be effectively reduced or prevented. Further, when $\alpha1_{100}$ and $\alpha2_{111}$ are any of the combinations shown in Table 18, the phase of the higher-order mode can be suppressed to about −80 deg or less. Thus, the higher-order modes can be further reduced or prevented under the conditions shown in Table 18.

Figure 35:
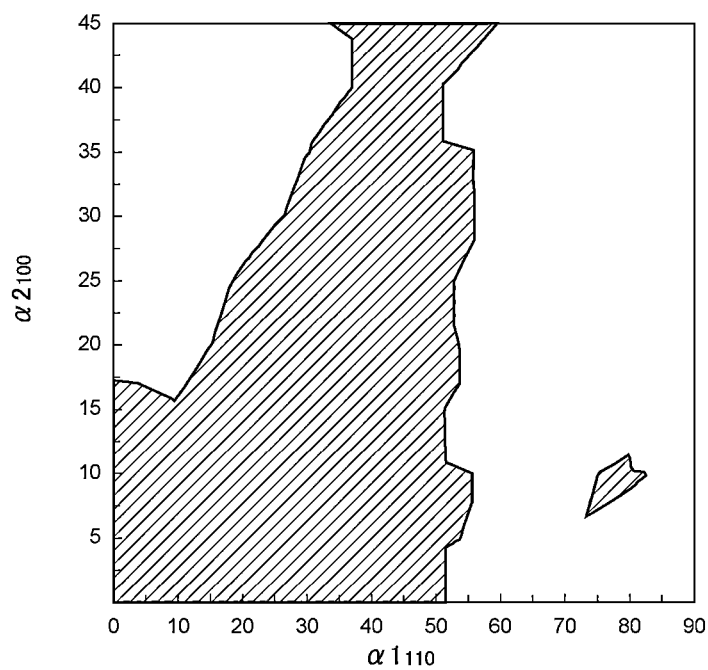
FIG. 35 is a diagram showing a range for $\alpha1_{110}$ and $\alpha2_{100}$ in which the phase of the higher-order mode is about −70 deg or less.

FIG. 35 is a diagram showing a range for $\alpha1_{110}$ and $\alpha2_{100}$ in which the phase of the higher-order mode is about −70 deg or less. Table 19 shows the range in which the phase of the higher-order mode is about −70 deg or less shown in FIG. 35. Further, Table 20 shows a range in which the phase of the higher-order mode is about −80 deg or less.

TABLE 19

| Condition | $\alpha1_{110}(°)$ | $\alpha2_{100}(°)$ |
|---|---|---|
| 1 | 0 ± 5 | 0 ± 2.5 |
| 2 | 0 ± 5 | 5 ± 2.5 |
| 3 | 0 ± 5 | 10 ± 2.5 |
| 4 | 0 ± 5 | 15 ± 2.5 |
| 5 | 10 ± 5 | 0 ± 2.5 |
| 6 | 10 ± 5 | 5 ± 2.5 |
| 7 | 10 ± 5 | 10 ± 2.5 |
| 8 | 10 ± 5 | 15 ± 2.5 |
| 9 | 20 ± 5 | 0 ± 2.5 |
| 10 | 20 ± 5 | 5 ± 2.5 |
| 11 | 20 ± 5 | 10 ± 2.5 |
| 12 | 20 ± 5 | 15 ± 2.5 |
| 13 | 20 ± 5 | 20 ± 2.5 |
| 14 | 20 ± 5 | 25 ± 2.5 |
| 15 | 30 ± 5 | 0 ± 2.5 |
| 16 | 30 ± 5 | 5 ± 2.5 |
| 17 | 30 ± 5 | 10 ± 2.5 |
| 18 | 30 ± 5 | 15 ± 2.5 |
| 19 | 30 ± 5 | 20 ± 2.5 |
| 20 | 30 ± 5 | 25 ± 2.5 |
| 21 | 30 ± 5 | 30 ± 2.5 |
| 22 | 40 ± 5 | 0 ± 2.5 |
| 23 | 40 ± 5 | 5 ± 2.5 |
| 24 | 40 ± 5 | 10 ± 2.5 |
| 25 | 40 ± 5 | 15 ± 2.5 |
| 26 | 40 ± 5 | 20 ± 2.5 |
| 27 | 40 ± 5 | 25 ± 2.5 |
| 28 | 40 ± 5 | 30 ± 2.5 |
| 29 | 40 ± 5 | 35 ± 2.5 |
| 30 | 40 ± 5 | 40 ± 2.5 |
| 31 | 40 ± 5 | 45 ± 2.5 |
| 32 | 50 ± 5 | 0 ± 2.5 |
| 33 | 50 ± 5 | 5 ± 2.5 |
| 34 | 50 ± 5 | 10 ± 2.5 |
| 35 | 50 ± 5 | 15 ± 2.5 |
| 36 | 50 ± 5 | 20 ± 2.5 |
| 37 | 50 ± 5 | 25 ± 2.5 |
| 38 | 50 ± 5 | 30 ± 2.5 |
| 39 | 50 ± 5 | 35 ± 2.5 |
| 40 | 50 ± 5 | 40 ± 2.5 |
| 41 | 50 ± 5 | 45 ± 2.5 |
| 42 | 60 ± 5 | 45 ± 2.5 |
| 43 | 80 ± 5 | 10 ± 2.5 |

TABLE 20

| Condition | $\alpha1_{110}(°)$ | $\alpha2_{100}(°)$ |
|---|---|---|
| 1 | 0 ± 5 | 0 ± 2.5 |
| 2 | 0 ± 5 | 5 ± 2.5 |
| 3 | 10 ± 5 | 0 ± 2.5 |
| 4 | 10 ± 5 | 5 ± 2.5 |
| 5 | 20 ± 5 | 0 ± 2.5 |
| 6 | 20 ± 5 | 5 ± 2.5 |
| 7 | 20 ± 5 | 10 ± 2.5 |
| 8 | 20 ± 5 | 15 ± 2.5 |
| 9 | 30 ± 5 | 0 ± 2.5 |
| 10 | 30 ± 5 | 5 ± 2.5 |
| 11 | 30 ± 5 | 10 ± 2.5 |
| 12 | 30 ± 5 | 15 ± 2.5 |
| 13 | 30 ± 5 | 20 ± 2.5 |
| 14 | 30 ± 5 | 25 ± 2.5 |
| 15 | 40 ± 5 | 0 ± 2.5 |
| 16 | 40 ± 5 | 5 ± 2.5 |
| 17 | 40 ± 5 | 10 ± 2.5 |
| 18 | 40 ± 5 | 15 ± 2.5 |
| 19 | 40 ± 5 | 20 ± 2.5 |
| 20 | 40 ± 5 | 25 ± 2.5 |
| 21 | 40 ± 5 | 30 ± 2.5 |
| 22 | 40 ± 5 | 40 ± 2.5 |
| 23 | 40 ± 5 | 45 ± 2.5 |
| 24 | 50 ± 5 | 0 ± 2.5 |
| 25 | 50 ± 5 | 5 ± 2.5 |
| 26 | 50 ± 5 | 10 ± 2.5 |
| 27 | 50 ± 5 | 15 ± 2.5 |

TABLE 20-continued

| Condition | $\alpha1_{110}(°)$ | $\alpha2_{100}(°)$ |
|---|---|---|
| 28 | 50 ± 5 | 20 ± 2.5 |
| 29 | 50 ± 5 | 25 ± 2.5 |
| 30 | 50 ± 5 | 30 ± 2.5 |
| 31 | 50 ± 5 | 35 ± 2.5 |
| 32 | 50 ± 5 | 40 ± 2.5 |
| 33 | 50 ± 5 | 45 ± 2.5 |

When $\alpha1_{110}$ and $\alpha2_{100}$ are any of the combinations shown in Table 19, the higher-order modes can be effectively reduced or prevented. Further, when $\alpha1_{110}$ and $\alpha2_{100}$ are any of the combinations shown in Table 20, the phase of the higher-order mode can be suppressed to about −80 deg or less. Thus, the higher-order modes can be further reduced or prevented under the conditions shown in Table 20.

Figure 36:
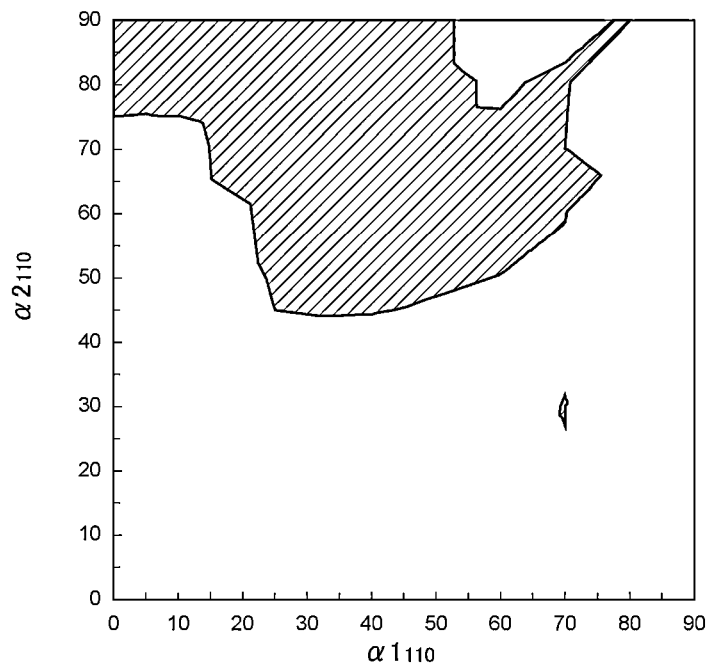
FIG. 36 is a diagram showing a range for $\alpha1_{110}$ and $\alpha2_{110}$ in which the phase of the higher-order mode is about −70 deg or less.

FIG. 36 is a diagram showing a range for $\alpha1_{110}$ and $\alpha2_{110}$ in which the phase of the higher-order mode is about −70 deg or less. Table 21 shows the range in which the phase of the higher-order mode is about −70 deg or less shown in FIG. 36. Further, Table 22 shows a range in which the phase of the higher-order mode is about −80 deg or less.

TABLE 21

| Condition | $\alpha1_{110}(°)$ | $\alpha2_{110}(°)$ |
|---|---|---|
| 1 | 0 ± 5 | 80 ± 5 |
| 2 | 0 ± 5 | 90 ± 5 |
| 3 | 10 ± 5 | 80 ± 5 |
| 4 | 10 ± 5 | 90 ± 5 |
| 5 | 20 ± 5 | 70 ± 5 |
| 6 | 20 ± 5 | 80 ± 5 |
| 7 | 20 ± 5 | 90 ± 5 |
| 8 | 30 ± 5 | 50 ± 5 |
| 9 | 30 ± 5 | 60 ± 5 |
| 10 | 30 ± 5 | 70 ± 5 |
| 11 | 30 ± 5 | 80 ± 5 |
| 12 | 30 ± 5 | 90 ± 5 |
| 13 | 40 ± 5 | 50 ± 5 |
| 14 | 40 ± 5 | 60 ± 5 |
| 15 | 40 ± 5 | 70 ± 5 |
| 16 | 40 ± 5 | 80 ± 5 |
| 17 | 40 ± 5 | 90 ± 5 |
| 18 | 50 ± 5 | 60 ± 5 |
| 19 | 50 ± 5 | 70 ± 5 |
| 20 | 50 ± 5 | 80 ± 5 |
| 21 | 50 ± 5 | 90 ± 5 |
| 22 | 60 ± 5 | 70 ± 5 |
| 23 | 70 ± 5 | 30 ± 5 |
| 24 | 70 ± 5 | 60 ± 5 |
| 25 | 70 ± 5 | 80 ± 5 |
| 26 | 80 ± 5 | 90 ± 5 |

TABLE 22

| Condition | $\alpha1_{110}(°)$ | $\alpha2_{110}(°)$ |
|---|---|---|
| 1 | 0 ± 5 | 90 ± 5 |
| 2 | 10 ± 5 | 90 ± 5 |
| 3 | 20 ± 5 | 80 ± 5 |
| 4 | 20 ± 5 | 90 ± 5 |
| 5 | 30 ± 5 | 60 ± 5 |
| 6 | 30 ± 5 | 70 ± 5 |
| 7 | 30 ± 5 | 80 ± 5 |
| 8 | 30 ± 5 | 90 ± 5 |
| 9 | 40 ± 5 | 60 ± 5 |
| 10 | 40 ± 5 | 70 ± 5 |
| 11 | 40 ± 5 | 80 ± 5 |
| 12 | 40 ± 5 | 90 ± 5 |
| 13 | 50 ± 5 | 60 ± 5 |
| 14 | 50 ± 5 | 70 ± 5 |
| 15 | 50 ± 5 | 80 ± 5 |
| 16 | 50 ± 5 | 90 ± 5 |
| 17 | 60 ± 5 | 70 ± 5 |
| 18 | 70 ± 5 | 80 ± 5 |

When $\alpha1_{110}$ and $\alpha2_{110}$ are any of the combinations shown in Table 21, the higher-order modes can be effectively reduced or prevented. Further, when $\alpha1_{110}$ and $\alpha2_{110}$ are any of the combinations shown in Table 22, the higher-order modes can be further reduced or prevented.

Figure 37:
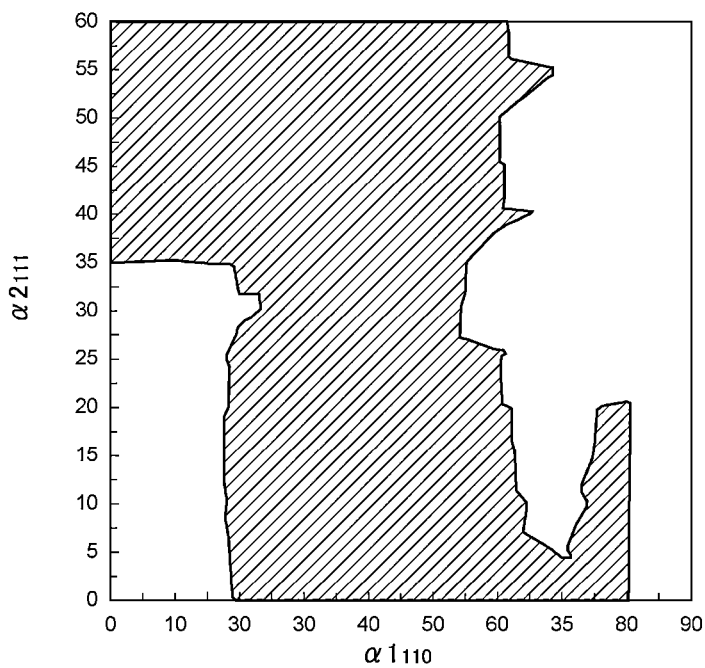
FIG. 37 is a diagram showing a range for $\alpha1_{110}$ and $\alpha2_{111}$ in which the phase of the higher-order mode is about −70 deg or less.

FIG. 37 is a diagram showing a range for $\alpha1_{110}$ and $\alpha2_{111}$ in which the phase of the higher-order mode is about −70 deg or less. Table 23 shows the range in which the phase of the higher-order mode is about −70 deg or less shown in FIG. 37. Further, Table 24 shows a range in which the phase of the higher-order mode is about −80 deg or less.

TABLE 23

| Condition | $\alpha1_{110}(°)$ | $\alpha2_{111}(°)$ |
|---|---|---|
| 1 | 30 ± 5 | 55 ± 2.5 |
| 2 | 40 ± 5 | 50 ± 2.5 |
| 3 | 40 ± 5 | 55 ± 2.5 |
| 4 | 40 ± 5 | 60 ± 2.5 |
| 5 | 0 ± 5 | 55 ± 2.5 |
| 6 | 0 ± 5 | 60 ± 2.5 |
| 7 | 10 ± 5 | 40 ± 2.5 |
| 8 | 10 ± 5 | 45 ± 2.5 |
| 9 | 10 ± 5 | 50 ± 2.5 |
| 10 | 10 ± 5 | 55 ± 2.5 |
| 11 | 10 ± 5 | 60 ± 2.5 |
| 12 | 20 ± 5 | 0 ± 2.5 |
| 13 | 20 ± 5 | 5 ± 2.5 |
| 14 | 20 ± 5 | 10 ± 2.5 |
| 15 | 20 ± 5 | 15 ± 2.5 |
| 16 | 20 ± 5 | 20 ± 2.5 |
| 17 | 20 ± 5 | 25 ± 2.5 |
| 18 | 20 ± 5 | 35 ± 2.5 |
| 19 | 20 ± 5 | 40 ± 2.5 |
| 20 | 20 ± 5 | 45 ± 2.5 |
| 21 | 20 ± 5 | 50 ± 2.5 |
| 22 | 20 ± 5 | 55 ± 2.5 |
| 23 | 20 ± 5 | 60 ± 2.5 |
| 24 | 30 ± 5 | 0 ± 2.5 |
| 25 | 30 ± 5 | 5 ± 2.5 |
| 26 | 30 ± 5 | 10 ± 2.5 |
| 27 | 30 ± 5 | 15 ± 2.5 |
| 28 | 30 ± 5 | 20 ± 2.5 |
| 29 | 30 ± 5 | 25 ± 2.5 |
| 30 | 30 ± 5 | 30 ± 2.5 |
| 31 | 30 ± 5 | 35 ± 2.5 |
| 32 | 30 ± 5 | 40 ± 2.5 |
| 33 | 30 ± 5 | 45 ± 2.5 |
| 34 | 30 ± 5 | 50 ± 2.5 |
| 35 | 30 ± 5 | 55 ± 2.5 |
| 36 | 30 ± 5 | 60 ± 2.5 |
| 37 | 40 ± 5 | 0 ± 2.5 |
| 38 | 40 ± 5 | 5 ± 2.5 |
| 39 | 40 ± 5 | 10 ± 2.5 |
| 40 | 40 ± 5 | 15 ± 2.5 |
| 41 | 40 ± 5 | 20 ± 2.5 |
| 42 | 40 ± 5 | 25 ± 2.5 |
| 43 | 40 ± 5 | 30 ± 2.5 |
| 44 | 40 ± 5 | 35 ± 2.5 |
| 45 | 40 ± 5 | 40 ± 2.5 |
| 46 | 40 ± 5 | 45 ± 2.5 |
| 47 | 40 ± 5 | 50 ± 2.5 |
| 48 | 40 ± 5 | 55 ± 2.5 |
| 49 | 40 ± 5 | 60 ± 2.5 |
| 50 | 50 ± 5 | 0 ± 2.5 |
| 51 | 50 ± 5 | 5 ± 2.5 |
| 52 | 50 ± 5 | 10 ± 2.5 |
| 53 | 50 ± 5 | 15 ± 2.5 |
| 54 | 50 ± 5 | 20 ± 2.5 |

TABLE 23-continued

| Condition | α1₁₁₀(°) | α2₁₁₁(°) |
|---|---|---|
| 55 | 50 ± 5 | 25 ± 2.5 |
| 56 | 50 ± 5 | 30 ± 2.5 |
| 57 | 50 ± 5 | 35 ± 2.5 |
| 58 | 50 ± 5 | 40 ± 2.5 |
| 59 | 50 ± 5 | 45 ± 2.5 |
| 60 | 50 ± 5 | 50 ± 2.5 |
| 61 | 50 ± 5 | 55 ± 2.5 |
| 62 | 50 ± 5 | 60 ± 2.5 |
| 63 | 60 ± 5 | 0 ± 2.5 |
| 64 | 60 ± 5 | 5 ± 2.5 |
| 65 | 60 ± 5 | 10 ± 2.5 |
| 66 | 60 ± 5 | 15 ± 2.5 |
| 67 | 60 ± 5 | 20 ± 2.5 |
| 68 | 60 ± 5 | 25 ± 2.5 |
| 69 | 60 ± 5 | 40 ± 2.5 |
| 70 | 60 ± 5 | 45 ± 2.5 |
| 71 | 60 ± 5 | 50 ± 2.5 |
| 72 | 60 ± 5 | 55 ± 2.5 |
| 73 | 60 ± 5 | 60 ± 2.5 |
| 74 | 70 ± 5 | 0 ± 2.5 |
| 75 | 80 ± 5 | 0 ± 2.5 |
| 76 | 80 ± 5 | 5 ± 2.5 |
| 77 | 80 ± 5 | 10 ± 2.5 |
| 78 | 80 ± 5 | 15 ± 2.5 |
| 79 | 80 ± 5 | 20 ± 2.5 |

TABLE 24

| Condition | α1₁₁₀(°) | α2₁₁₁(°) |
|---|---|---|
| 1 | 30 ± 5 | 55 ± 2.5 |
| 2 | 40 ± 5 | 50 ± 2.5 |
| 3 | 40 ± 5 | 55 ± 2.5 |
| 4 | 40 ± 5 | 60 ± 2.5 |

When $α1_{110}$ and $α2_{111}$ are any of the combinations shown in Table 23, the higher-order modes can be effectively reduced or prevented. Further, when $α1_{110}$ and $α2_{111}$ are any of the combinations shown in Table 24, the higher-order modes can be further reduced or prevented.

Figure 38:
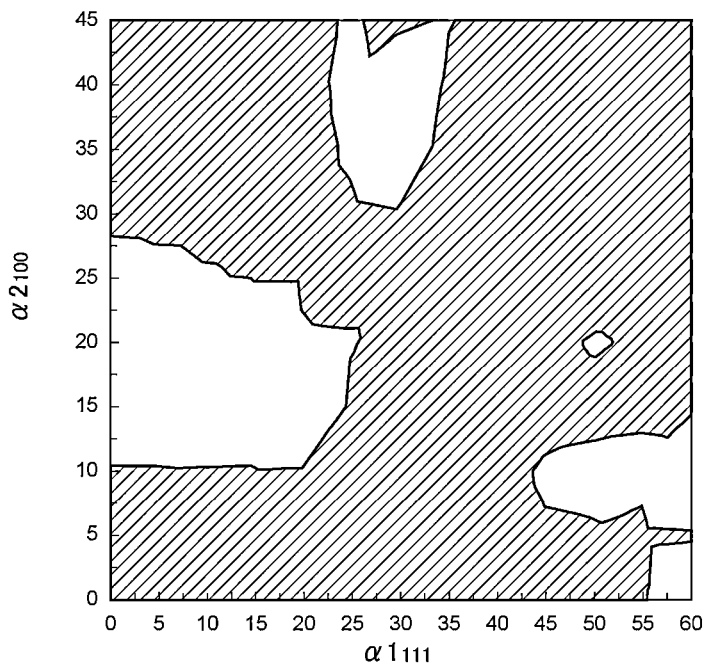
FIG. 38 is a diagram showing a range for $\alpha1_{111}$ and $\alpha2_{100}$ in which the phase of the higher-order mode is about −70 deg or less.

FIG. 38 is a diagram showing a range for $α1_{111}$ and $α2_{100}$ in which the phase of the higher-order mode is about −70 deg or less. Table 25 shows the range in which the phase of the higher-order mode is about −70 deg or less shown in FIG. 38. Further, Table 26 shows a range in which the phase of the higher-order mode is about −80 deg or less.

TABLE 25

| Condition | α1₁₁₁(°) | α2₁₀₀(°) |
|---|---|---|
| 1 | 0 ± 2.5 | 0 ± 2.5 |
| 2 | 0 ± 2.5 | 5 ± 2.5 |
| 3 | 0 ± 2.5 | 10 ± 2.5 |
| 4 | 0 ± 2.5 | 30 ± 2.5 |
| 5 | 0 ± 2.5 | 35 ± 2.5 |
| 6 | 0 ± 2.5 | 40 ± 2.5 |
| 7 | 0 ± 2.5 | 45 ± 2.5 |
| 8 | 5 ± 2.5 | 0 ± 2.5 |
| 9 | 5 ± 2.5 | 5 ± 2.5 |
| 10 | 5 ± 2.5 | 10 ± 2.5 |
| 11 | 5 ± 2.5 | 30 ± 2.5 |
| 12 | 5 ± 2.5 | 35 ± 2.5 |
| 13 | 5 ± 2.5 | 40 ± 2.5 |
| 14 | 5 ± 2.5 | 45 ± 2.5 |
| 15 | 10 ± 2.5 | 0 ± 2.5 |
| 16 | 10 ± 2.5 | 5 ± 2.5 |
| 17 | 10 ± 2.5 | 10 ± 2.5 |
| 18 | 10 ± 2.5 | 30 ± 2.5 |
| 19 | 10 ± 2.5 | 35 ± 2.5 |
| 20 | 10 ± 2.5 | 40 ± 2.5 |
| 21 | 10 ± 2.5 | 45 ± 2.5 |

TABLE 25-continued

| Condition | α1₁₁₁(°) | α2₁₀₀(°) |
|---|---|---|
| 22 | 15 ± 2.5 | 0 ± 2.5 |
| 23 | 15 ± 2.5 | 5 ± 2.5 |
| 24 | 15 ± 2.5 | 10 ± 2.5 |
| 25 | 15 ± 2.5 | 25 ± 2.5 |
| 26 | 15 ± 2.5 | 30 ± 2.5 |
| 27 | 15 ± 2.5 | 35 ± 2.5 |
| 28 | 15 ± 2.5 | 40 ± 2.5 |
| 29 | 15 ± 2.5 | 45 ± 2.5 |
| 30 | 20 ± 2.5 | 0 ± 2.5 |
| 31 | 20 ± 2.5 | 5 ± 2.5 |
| 32 | 20 ± 2.5 | 10 ± 2.5 |
| 33 | 20 ± 2.5 | 25 ± 2.5 |
| 34 | 20 ± 2.5 | 30 ± 2.5 |
| 35 | 20 ± 2.5 | 35 ± 2.5 |
| 36 | 20 ± 2.5 | 40 ± 2.5 |
| 37 | 20 ± 2.5 | 45 ± 2.5 |
| 38 | 25 ± 2.5 | 0 ± 2.5 |
| 39 | 25 ± 2.5 | 5 ± 2.5 |
| 40 | 25 ± 2.5 | 10 ± 2.5 |
| 41 | 25 ± 2.5 | 15 ± 2.5 |
| 42 | 25 ± 2.5 | 25 ± 2.5 |
| 43 | 25 ± 2.5 | 30 ± 2.5 |
| 44 | 30 ± 2.5 | 0 ± 2.5 |
| 45 | 30 ± 2.5 | 5 ± 2.5 |
| 46 | 30 ± 2.5 | 10 ± 2.5 |
| 47 | 30 ± 2.5 | 15 ± 2.5 |
| 48 | 30 ± 2.5 | 20 ± 2.5 |
| 49 | 30 ± 2.5 | 25 ± 2.5 |
| 50 | 30 ± 2.5 | 30 ± 2.5 |
| 51 | 30 ± 2.5 | 45 ± 2.5 |
| 52 | 35 ± 2.5 | 0 ± 2.5 |
| 53 | 35 ± 2.5 | 5 ± 2.5 |
| 54 | 35 ± 2.5 | 10 ± 2.5 |
| 55 | 35 ± 2.5 | 15 ± 2.5 |
| 56 | 35 ± 2.5 | 20 ± 2.5 |
| 57 | 35 ± 2.5 | 25 ± 2.5 |
| 58 | 35 ± 2.5 | 30 ± 2.5 |
| 59 | 35 ± 2.5 | 35 ± 2.5 |
| 60 | 35 ± 2.5 | 40 ± 2.5 |
| 61 | 40 ± 2.5 | 0 ± 2.5 |
| 62 | 40 ± 2.5 | 5 ± 2.5 |
| 63 | 40 ± 2.5 | 10 ± 2.5 |
| 64 | 40 ± 2.5 | 15 ± 2.5 |
| 65 | 40 ± 2.5 | 20 ± 2.5 |
| 66 | 40 ± 2.5 | 25 ± 2.5 |
| 67 | 40 ± 2.5 | 30 ± 2.5 |
| 68 | 40 ± 2.5 | 35 ± 2.5 |
| 69 | 40 ± 2.5 | 40 ± 2.5 |
| 70 | 40 ± 2.5 | 45 ± 2.5 |
| 71 | 45 ± 2.5 | 0 ± 2.5 |
| 72 | 45 ± 2.5 | 5 ± 2.5 |
| 73 | 45 ± 2.5 | 15 ± 2.5 |
| 74 | 45 ± 2.5 | 20 ± 2.5 |
| 75 | 45 ± 2.5 | 25 ± 2.5 |
| 76 | 45 ± 2.5 | 30 ± 2.5 |
| 77 | 45 ± 2.5 | 35 ± 2.5 |
| 78 | 45 ± 2.5 | 40 ± 2.5 |
| 79 | 45 ± 2.5 | 45 ± 2.5 |
| 80 | 50 ± 2.5 | 0 ± 2.5 |
| 81 | 50 ± 2.5 | 5 ± 2.5 |
| 82 | 50 ± 2.5 | 15 ± 2.5 |
| 83 | 50 ± 2.5 | 25 ± 2.5 |
| 84 | 50 ± 2.5 | 30 ± 2.5 |
| 85 | 50 ± 2.5 | 35 ± 2.5 |
| 86 | 50 ± 2.5 | 40 ± 2.5 |
| 87 | 50 ± 2.5 | 45 ± 2.5 |
| 88 | 55 ± 2.5 | 0 ± 2.5 |
| 89 | 55 ± 2.5 | 5 ± 2.5 |
| 90 | 55 ± 2.5 | 15 ± 2.5 |
| 91 | 55 ± 2.5 | 20 ± 2.5 |
| 92 | 55 ± 2.5 | 25 ± 2.5 |
| 93 | 55 ± 2.5 | 30 ± 2.5 |
| 94 | 55 ± 2.5 | 35 ± 2.5 |
| 95 | 55 ± 2.5 | 40 ± 2.5 |
| 96 | 55 ± 2.5 | 45 ± 2.5 |
| 97 | 60 ± 2.5 | 5 ± 2.5 |
| 98 | 60 ± 2.5 | 15 ± 2.5 |
| 99 | 60 ± 2.5 | 20 ± 2.5 |

TABLE 25-continued

| Condition | α1₁₁₁(°) | α2₁₀₀(°) |
|---|---|---|
| 100 | 60 ± 2.5 | 25 ± 2.5 |
| 101 | 60 ± 2.5 | 30 ± 2.5 |
| 102 | 60 ± 2.5 | 35 ± 2.5 |
| 103 | 60 ± 2.5 | 40 ± 2.5 |
| 104 | 60 ± 2.5 | 45 ± 2.5 |

TABLE 26

| Condition | $\alpha1_{111}$(°) | $\alpha2_{100}$(°) |
|---|---|---|
| 1 | 0 ± 2.5 | 35 ± 2.5 |
| 2 | 0 ± 2.5 | 40 ± 2.5 |
| 3 | 0 ± 2.5 | 45 ± 2.5 |
| 4 | 5 ± 2.5 | 30 ± 2.5 |
| 5 | 5 ± 2.5 | 35 ± 2.5 |
| 6 | 5 ± 2.5 | 40 ± 2.5 |
| 7 | 5 ± 2.5 | 45 ± 2.5 |
| 8 | 10 ± 2.5 | 30 ± 2.5 |
| 9 | 10 ± 2.5 | 35 ± 2.5 |
| 10 | 10 ± 2.5 | 40 ± 2.5 |
| 11 | 10 ± 2.5 | 45 ± 2.5 |
| 12 | 15 ± 2.5 | 30 ± 2.5 |
| 13 | 15 ± 2.5 | 35 ± 2.5 |
| 14 | 20 ± 2.5 | 30 ± 2.5 |
| 15 | 20 ± 2.5 | 35 ± 2.5 |
| 16 | 20 ± 2.5 | 45 ± 2.5 |
| 17 | 25 ± 2.5 | 0 ± 2.5 |
| 18 | 25 ± 2.5 | 5 ± 2.5 |
| 19 | 25 ± 2.5 | 10 ± 2.5 |
| 20 | 30 ± 2.5 | 0 ± 2.5 |
| 21 | 30 ± 2.5 | 5 ± 2.5 |
| 22 | 30 ± 2.5 | 10 ± 2.5 |
| 23 | 30 ± 2.5 | 15 ± 2.5 |
| 24 | 30 ± 2.5 | 20 ± 2.5 |
| 25 | 30 ± 2.5 | 45 ± 2.5 |
| 26 | 35 ± 2.5 | 0 ± 2.5 |
| 27 | 35 ± 2.5 | 5 ± 2.5 |
| 28 | 35 ± 2.5 | 10 ± 2.5 |
| 29 | 35 ± 2.5 | 15 ± 2.5 |
| 30 | 35 ± 2.5 | 20 ± 2.5 |
| 31 | 35 ± 2.5 | 25 ± 2.5 |
| 32 | 35 ± 2.5 | 30 ± 2.5 |
| 33 | 35 ± 2.5 | 35 ± 2.5 |
| 34 | 40 ± 2.5 | 0 ± 2.5 |
| 35 | 40 ± 2.5 | 5 ± 2.5 |
| 36 | 40 ± 2.5 | 10 ± 2.5 |
| 37 | 40 ± 2.5 | 25 ± 2.5 |
| 38 | 40 ± 2.5 | 30 ± 2.5 |
| 39 | 40 ± 2.5 | 35 ± 2.5 |
| 40 | 40 ± 2.5 | 40 ± 2.5 |
| 41 | 40 ± 2.5 | 45 ± 2.5 |
| 42 | 45 ± 2.5 | 25 ± 2.5 |
| 43 | 45 ± 2.5 | 30 ± 2.5 |
| 44 | 50 ± 2.5 | 25 ± 2.5 |
| 45 | 50 ± 2.5 | 30 ± 2.5 |
| 46 | 50 ± 2.5 | 35 ± 2.5 |
| 47 | 50 ± 2.5 | 40 ± 2.5 |
| 48 | 55 ± 2.5 | 25 ± 2.5 |
| 49 | 55 ± 2.5 | 30 ± 2.5 |
| 50 | 55 ± 2.5 | 35 ± 2.5 |
| 51 | 60 ± 2.5 | 25 ± 2.5 |
| 52 | 60 ± 2.5 | 30 ± 2.5 |

When $\alpha1_{111}$ and $\alpha2_{100}$ are any of the combinations shown in Table 25, the higher-order modes can be effectively reduced or prevented. Further, when $\alpha1_{111}$ and $\alpha2_{100}$ are any of the combinations shown in Table 26, the higher-order modes can be further reduced or prevented.

Figure 39:
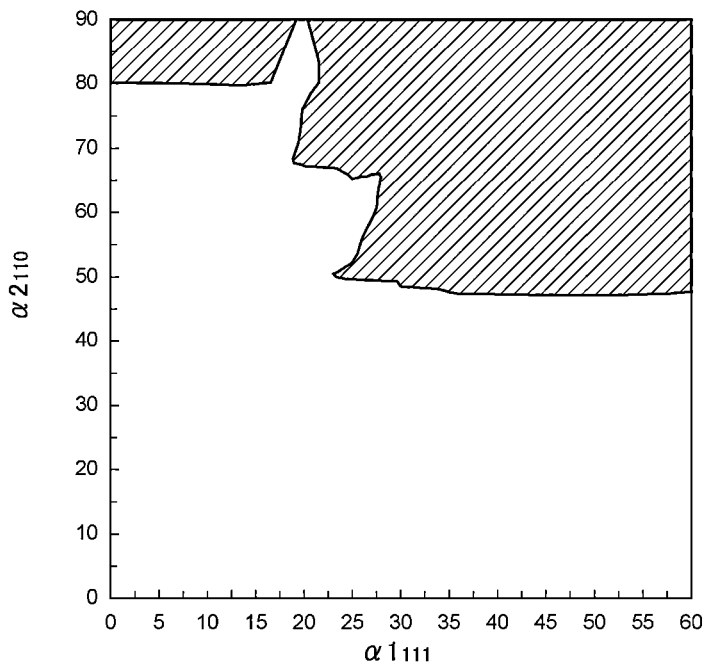
FIG. 39 is a diagram showing a range for $\alpha1_{111}$ and $\alpha2_{110}$ in which the phase of the higher-order mode is about −70 deg or less.

FIG. 39 is a diagram showing a range for $\alpha1_{111}$ and $\alpha2_{110}$ in which the phase of the higher-order mode is about −70 deg or less. Table 27 shows the range in which the phase of the higher-order mode is about −70 deg or less shown in FIG. 39. Further, Table 28 shows a range in which the phase of the higher-order mode is about −80 deg or less.

TABLE 27

| Condition | $\alpha1_{111}$(°) | $\alpha2_{110}$(°) |
|---|---|---|
| 1 | 0 ± 2.5 | 80 ± 5 |
| 2 | 0 ± 2.5 | 90 ± 5 |
| 3 | 5 ± 2.5 | 80 ± 5 |
| 4 | 5 ± 2.5 | 90 ± 5 |
| 5 | 10 ± 2.5 | 80 ± 5 |
| 6 | 10 ± 2.5 | 90 ± 5 |
| 7 | 15 ± 2.5 | 80 ± 5 |
| 8 | 15 ± 2.5 | 90 ± 5 |
| 9 | 20 ± 2.5 | 70 ± 5 |
| 10 | 25 ± 2.5 | 50 ± 5 |
| 11 | 25 ± 2.5 | 70 ± 5 |
| 12 | 25 ± 2.5 | 80 ± 5 |
| 13 | 25 ± 2.5 | 90 ± 5 |
| 14 | 30 ± 2.5 | 50 ± 5 |
| 15 | 30 ± 2.5 | 60 ± 5 |
| 16 | 30 ± 2.5 | 70 ± 5 |
| 17 | 30 ± 2.5 | 80 ± 5 |
| 18 | 30 ± 2.5 | 90 ± 5 |
| 19 | 35 ± 2.5 | 50 ± 5 |
| 20 | 35 ± 2.5 | 60 ± 5 |
| 21 | 35 ± 2.5 | 70 ± 5 |
| 22 | 35 ± 2.5 | 80 ± 5 |
| 23 | 35 ± 2.5 | 90 ± 5 |
| 24 | 40 ± 2.5 | 50 ± 5 |
| 25 | 40 ± 2.5 | 60 ± 5 |
| 26 | 40 ± 2.5 | 70 ± 5 |
| 27 | 40 ± 2.5 | 80 ± 5 |
| 28 | 40 ± 2.5 | 90 ± 5 |
| 29 | 45 ± 2.5 | 50 ± 5 |
| 30 | 45 ± 2.5 | 60 ± 5 |
| 31 | 45 ± 2.5 | 70 ± 5 |
| 32 | 45 ± 2.5 | 80 ± 5 |
| 33 | 45 ± 2.5 | 90 ± 5 |
| 34 | 50 ± 2.5 | 50 ± 5 |
| 35 | 50 ± 2.5 | 60 ± 5 |
| 36 | 50 ± 2.5 | 70 ± 5 |
| 37 | 50 ± 2.5 | 80 ± 5 |
| 38 | 50 ± 2.5 | 90 ± 5 |
| 39 | 55 ± 2.5 | 50 ± 5 |
| 40 | 55 ± 2.5 | 60 ± 5 |
| 41 | 55 ± 2.5 | 70 ± 5 |
| 42 | 55 ± 2.5 | 80 ± 5 |
| 43 | 55 ± 2.5 | 90 ± 5 |
| 44 | 60 ± 2.5 | 50 ± 5 |
| 45 | 60 ± 2.5 | 60 ± 5 |
| 46 | 60 ± 2.5 | 70 ± 5 |
| 47 | 60 ± 2.5 | 80 ± 5 |
| 48 | 60 ± 2.5 | 90 ± 5 |

TABLE 28

| Condition | $\alpha1_{111}$(°) | $\alpha2_{110}$(°) |
|---|---|---|
| 1 | 25 ± 2.5 | 80 ± 5 |
| 2 | 25 ± 2.5 | 90 ± 5 |
| 3 | 30 ± 2.5 | 60 ± 5 |
| 4 | 30 ± 2.5 | 80 ± 5 |
| 5 | 30 ± 2.5 | 90 ± 5 |
| 6 | 35 ± 2.5 | 60 ± 5 |
| 7 | 35 ± 2.5 | 80 ± 5 |
| 8 | 35 ± 2.5 | 90 ± 5 |
| 9 | 40 ± 2.5 | 60 ± 5 |
| 10 | 40 ± 2.5 | 70 ± 5 |
| 11 | 40 ± 2.5 | 80 ± 5 |
| 12 | 40 ± 2.5 | 90 ± 5 |
| 13 | 45 ± 2.5 | 60 ± 5 |
| 14 | 45 ± 2.5 | 70 ± 5 |
| 15 | 45 ± 2.5 | 80 ± 5 |
| 16 | 50 ± 2.5 | 60 ± 5 |
| 17 | 50 ± 2.5 | 70 ± 5 |
| 18 | 50 ± 2.5 | 90 ± 5 |
| 19 | 55 ± 2.5 | 60 ± 5 |
| 20 | 60 ± 2.5 | 60 ± 5 |
| 21 | 60 ± 2.5 | 70 ± 5 |

When $\alpha 1_{111}$ and $\alpha 2_{110}$ are any of the combinations shown in Table 27, the higher-order modes can be effectively reduced or prevented. Further, when $\alpha 1_{111}$ and $\alpha 2_{110}$ are any of the combinations shown in Table 28, the higher-order modes can be further reduced or prevented.

Figure 40:
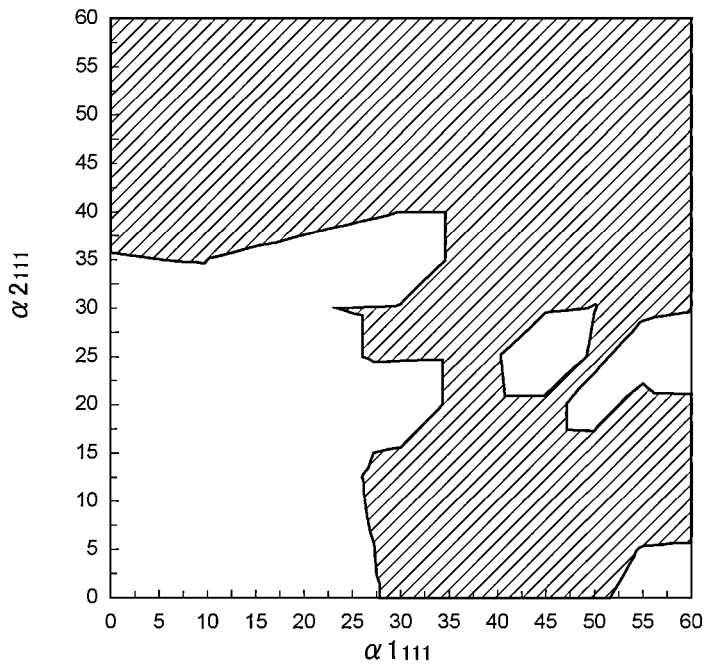
FIG. 40 is a diagram showing a range for $\alpha1_{111}$ and $\alpha2_{111}$ in which the phase of the higher-order mode is about −70 deg or less.

FIG. 40 is a diagram showing a range for $\alpha 1_{111}$ and $\alpha 2_{111}$ in which the phase of the higher-order mode is about −70 deg or less. Table 29 shows the range in which the phase of the higher-order mode is about −70 deg or less shown in FIG. 40.

TABLE 29

| Condition | $\alpha 1_{111}(°)$ | $\alpha 2_{111}(°)$ |
|---|---|---|
| 1 | 0 ± 2.5 | 40 ± 2.5 |
| 2 | 0 ± 2.5 | 45 ± 2.5 |
| 3 | 0 ± 2.5 | 50 ± 2.5 |
| 4 | 0 ± 2.5 | 55 ± 2.5 |
| 5 | 0 ± 2.5 | 60 ± 2.5 |
| 6 | 5 ± 2.5 | 40 ± 2.5 |
| 7 | 5 ± 2.5 | 45 ± 2.5 |
| 8 | 5 ± 2.5 | 50 ± 2.5 |
| 9 | 5 ± 2.5 | 55 ± 2.5 |
| 10 | 5 ± 2.5 | 60 ± 2.5 |
| 11 | 10 ± 2.5 | 35 ± 2.5 |
| 12 | 10 ± 2.5 | 40 ± 2.5 |
| 13 | 10 ± 2.5 | 45 ± 2.5 |
| 14 | 10 ± 2.5 | 50 ± 2.5 |
| 15 | 10 ± 2.5 | 55 ± 2.5 |
| 16 | 10 ± 2.5 | 60 ± 2.5 |
| 17 | 25 ± 2.5 | 60 ± 2.5 |
| 18 | 30 ± 2.5 | 0 ± 2.5 |
| 19 | 30 ± 2.5 | 5 ± 2.5 |
| 20 | 30 ± 2.5 | 10 ± 2.5 |
| 21 | 30 ± 2.5 | 15 ± 2.5 |
| 22 | 30 ± 2.5 | 25 ± 2.5 |
| 23 | 30 ± 2.5 | 30 ± 2.5 |
| 24 | 30 ± 2.5 | 40 ± 2.5 |
| 25 | 30 ± 2.5 | 45 ± 2.5 |
| 26 | 30 ± 2.5 | 50 ± 2.5 |
| 27 | 30 ± 2.5 | 55 ± 2.5 |
| 28 | 30 ± 2.5 | 60 ± 2.5 |
| 29 | 35 ± 2.5 | 0 ± 2.5 |
| 30 | 35 ± 2.5 | 5 ± 2.5 |
| 31 | 35 ± 2.5 | 10 ± 2.5 |
| 32 | 35 ± 2.5 | 15 ± 2.5 |
| 33 | 35 ± 2.5 | 20 ± 2.5 |
| 34 | 35 ± 2.5 | 25 ± 2.5 |
| 35 | 35 ± 2.5 | 30 ± 2.5 |
| 36 | 35 ± 2.5 | 35 ± 2.5 |
| 37 | 35 ± 2.5 | 40 ± 2.5 |
| 38 | 35 ± 2.5 | 45 ± 2.5 |
| 39 | 35 ± 2.5 | 50 ± 2.5 |
| 40 | 35 ± 2.5 | 55 ± 2.5 |
| 41 | 35 ± 2.5 | 60 ± 2.5 |
| 42 | 40 ± 2.5 | 0 ± 2.5 |
| 43 | 40 ± 2.5 | 5 ± 2.5 |
| 44 | 40 ± 2.5 | 10 ± 2.5 |
| 45 | 40 ± 2.5 | 15 ± 2.5 |
| 46 | 40 ± 2.5 | 20 ± 2.5 |
| 47 | 40 ± 2.5 | 25 ± 2.5 |
| 48 | 40 ± 2.5 | 30 ± 2.5 |
| 49 | 40 ± 2.5 | 35 ± 2.5 |
| 50 | 40 ± 2.5 | 40 ± 2.5 |
| 51 | 40 ± 2.5 | 45 ± 2.5 |
| 52 | 40 ± 2.5 | 50 ± 2.5 |
| 53 | 40 ± 2.5 | 55 ± 2.5 |
| 54 | 40 ± 2.5 | 60 ± 2.5 |
| 55 | 45 ± 2.5 | 0 ± 2.5 |
| 56 | 45 ± 2.5 | 5 ± 2.5 |
| 57 | 45 ± 2.5 | 10 ± 2.5 |
| 58 | 45 ± 2.5 | 15 ± 2.5 |
| 59 | 45 ± 2.5 | 20 ± 2.5 |
| 60 | 45 ± 2.5 | 30 ± 2.5 |
| 61 | 45 ± 2.5 | 35 ± 2.5 |
| 62 | 45 ± 2.5 | 40 ± 2.5 |
| 63 | 45 ± 2.5 | 45 ± 2.5 |
| 64 | 45 ± 2.5 | 50 ± 2.5 |
| 65 | 45 ± 2.5 | 55 ± 2.5 |
| 66 | 45 ± 2.5 | 60 ± 2.5 |
| 67 | 50 ± 2.5 | 0 ± 2.5 |
| 68 | 50 ± 2.5 | 5 ± 2.5 |
| 69 | 50 ± 2.5 | 10 ± 2.5 |
| 70 | 50 ± 2.5 | 15 ± 2.5 |
| 71 | 50 ± 2.5 | 25 ± 2.5 |
| 72 | 50 ± 2.5 | 35 ± 2.5 |
| 73 | 50 ± 2.5 | 40 ± 2.5 |
| 74 | 50 ± 2.5 | 45 ± 2.5 |
| 75 | 50 ± 2.5 | 50 ± 2.5 |
| 76 | 50 ± 2.5 | 55 ± 2.5 |
| 77 | 50 ± 2.5 | 60 ± 2.5 |
| 78 | 55 ± 2.5 | 10 ± 2.5 |
| 79 | 55 ± 2.5 | 15 ± 2.5 |
| 80 | 55 ± 2.5 | 20 ± 2.5 |
| 81 | 55 ± 2.5 | 30 ± 2.5 |
| 82 | 55 ± 2.5 | 35 ± 2.5 |
| 83 | 55 ± 2.5 | 40 ± 2.5 |
| 84 | 55 ± 2.5 | 45 ± 2.5 |
| 85 | 55 ± 2.5 | 50 ± 2.5 |
| 86 | 55 ± 2.5 | 55 ± 2.5 |
| 87 | 55 ± 2.5 | 60 ± 2.5 |
| 88 | 60 ± 2.5 | 10 ± 2.5 |
| 89 | 60 ± 2.5 | 15 ± 2.5 |
| 90 | 60 ± 2.5 | 20 ± 2.5 |
| 91 | 60 ± 2.5 | 30 ± 2.5 |
| 92 | 60 ± 2.5 | 35 ± 2.5 |
| 93 | 60 ± 2.5 | 40 ± 2.5 |
| 94 | 60 ± 2.5 | 45 ± 2.5 |
| 95 | 60 ± 2.5 | 50 ± 2.5 |
| 96 | 60 ± 2.5 | 55 ± 2.5 |
| 97 | 60 ± 2.5 | 60 ± 2.5 |

When $\alpha 1_{111}$ and $\alpha 2_{111}$ are any of the combinations shown in Table 29, the higher-order modes can be effectively reduced or prevented.

In the above, an example in which the piezoelectric film 7 is a lithium tantalate film is described. In the following, an example in which the piezoelectric film 7 is a lithium niobate film will be described with reference to FIG. 26.

A third preferred embodiment of the present invention is different from the second preferred embodiment in that the piezoelectric film 7 is a lithium niobate film. Except for the above point, the acoustic wave device according to the third preferred embodiment has a configuration the same as or similar to that of the acoustic wave device according to the second preferred embodiment.

Here, phase characteristics were compared between the acoustic wave device having the configuration of the third preferred embodiment and a third comparative example. The third comparative example is different from the third preferred embodiment in that the support substrate includes a single silicon layer. Design parameters of the acoustic wave device having the configuration of the third preferred embodiment in which the phase characteristic was measured are as follows.

First silicon layer 3; plane orientation: (111), Euler angles (about −45°, about −54.7°, about 0°), thickness: about 20 μm Second silicon layer 4; plane orientation: (100), Euler angles (about 0°, about 0°, about 45°), thickness: about 1 μm First intermediate layer 5; material: $SiO_2$, thickness: about 300 nm Second intermediate layer 26; material: SiN, thickness: about 50 nm Piezoelectric film 7; material: about 0° Y-cut X-propagation $LiNbO_3$, Euler angles (about 0°, about 120°, about 0°), thickness: about 400 nm Angle α1; type: angle $α_{111}$, value: about 0°
Angle α2; type: angle $α_{100}$, value: about 45°
Layer configuration of IDT electrode 8; layer configuration: (Ti layer)/(AlCu layer (Cu-1 wt. %))/(Ti layer) from piezoelectric film 7 side, thickness: (about 12 nm)/(about 100 nm)/(about 4 nm) from piezoelectric film 7 side
Wavelength λ of IDT electrode 8; about 2 μm
Duty ratio of IDT electrode 8; about 0.5

Figure 41:
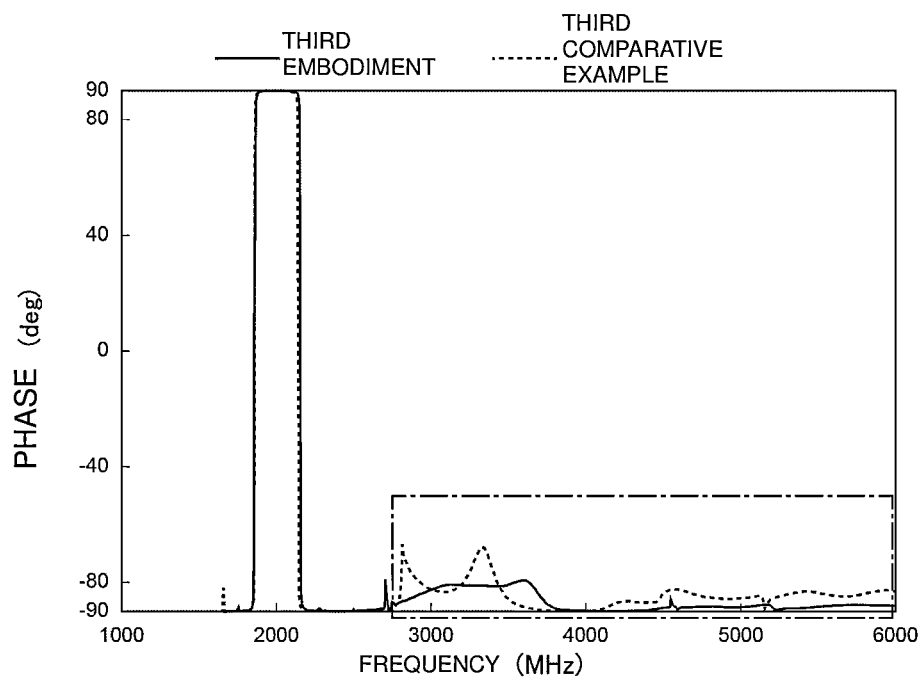
FIG. 41 is a diagram showing phase characteristics of acoustic wave devices according to a third preferred embodiment of the present invention and a third comparative example.

FIG. 41 is a diagram showing phase characteristics of the acoustic wave devices according to the third preferred embodiment and the third comparative example.

As shown in FIG. 41, in the third preferred embodiment, the higher-order modes can be reduced or prevented more than in the third comparative example in a wide band indicated by a long dashed short dashed line. As described above, also in the third preferred embodiment, the higher-order modes can be reduced or prevented in a wide band, similarly to the second preferred embodiment.

Figure 42:
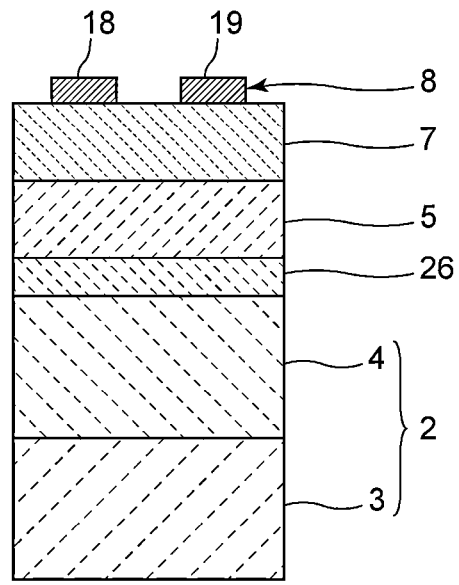
FIG. 42 is a front cross-sectional view illustrating a portion of an acoustic wave device according to a fourth preferred embodiment of the present invention.

FIG. 42 is a front cross-sectional view illustrating a portion of an acoustic wave device according to a fourth preferred embodiment of the present invention.

The fourth preferred embodiment is different from the second preferred embodiment in that the second intermediate layer 26 is provided between the first intermediate layer 5 and the support substrate. Except for the above point, the acoustic wave device according to the fourth preferred embodiment has a configuration the same as or similar to the acoustic wave device according to the second preferred embodiment.

Here, as an example, it is shown that the higher-order modes can be effectively reduced or prevented when 40° Y-cut X-propagation LiTaO₃ is used for the piezoelectric film 7. In the acoustic wave device having the configuration of the fourth preferred embodiment, the phase of the higher-order mode was measured by varying specific parameters. Thus, a relationship between the specific parameters and the phase of the higher-order mode was obtained. As the specific parameters mentioned above, ψ in Euler angles (φ, θ, ψ) of the first silicon layer 3 is Si_psi [deg], ψ in Euler angles (φ, θ, ψ) of the second silicon layer 4 is si_psi_2 [deg], the thickness of the second silicon layer 4 is t_Si2 [λ], the thickness of the second intermediate layer 26 is t_SiN [λ], the thickness of the first intermediate layer 5 is t_SiO2 [λ], and the thickness of the piezoelectric film 7 is t_LT [X]. The phase of the higher-order mode is represented by Pkj [deg]. As described above, [deg] and [°] are the same units. Design parameters of the acoustic wave device for which the phase of the higher-order mode was obtained are as follows.

First silicon layer 3; plane orientation: (111), Euler angles (about −45°, about −54.7°, Si_psi), thickness: about 20 μm
Second silicon layer 4; plane orientation: (100), Euler angles (about 0°, about 0°, si_psi_2), thickness: t_Si2
Second intermediate layer 26; material: SiN, thickness: t_SiN
First intermediate layer 5; materials: SiO₂, thickness: t_SiO2
Piezoelectric film 7; material: about 40° Y-cut X-propagation LiTaO₃, Euler angles (about 0°, about 130°, about 0°), thickness: t_LT
Angle α1; type: angle $α_{111}$, value: varied in 5° increments in a range of about 0° to about 60°.
Angle α2; type: angle $α_{100}$, value: varied in 5° increments in a range of about 0° to about 45°.
Layer configuration of IDT electrode 8; layer configuration: (Ti layer)/(AlCu layer (Cu-1 wt. %))/(Ti layer) from piezoelectric film 7 side, thickness: (about 12 nm)/(about 100 nm)/(about 4 nm) from piezoelectric film 7 side
Wavelength λ of IDT electrode 8; about 2 μm
Duty ratio of IDT electrode 8; about 0.5

The specific parameters were varied in the following ranges:

Si_psi; the angle α1 was varied as described above by varying in 5 deg increments in a range of about 0 deg to about 60 deg.
si_psi_2; the angle α2 was varied as described above by varying in 5 deg increments in a range of about 0 deg to about 45 deg.
t_Si2; varied 0.05λ increments in a range of about 0.05λ to about 1λ.
t_SiN; varied in 0.1λ increments in a range of about 0.05λ to about 0.35λ.
t_SiO2; varied in 0.025λ increments in a range of about 0.1λ to about 0.2λ.
t_LT; varied in 0.025λ increments in a range of about 0.15λ to about 0.2Δ.

In the acoustic wave device for which the phase of the higher-order mode was obtained, the IDT electrode 8 is provided on the negative surface of the piezoelectric film 7. The measured higher-order modes are higher-order modes at about 3.0 times or less the resonant frequency. Equation 1, which is a relational equation between the specific parameters and the phase of the higher-order mode, was derived from the above measurements.

Pkj [deg]=(−71.2068602606219)+
331.629446317838×(t_LTλ]−
0.173291148291141)+(−22.7224910522243)×(t−
SiO2[λ]1−0.133361933361938)+
70.1603362058α21×(t_SiN[λ]1−
0.0694258544258521)+20.4186870884974×
(t_Si2[λ]−0.432632632632632)+(−
0.0795718195965644)×(si_psi_2 [deg]−
15.1794651794652)+(−0.0801661426763212)×
(Si_psi [deg]−21.3234663234663)+(−
8265.27531314391)×((t−LTλ]−
0.173291148291141)×(t_LTλ]−
0.173291148291141)−0.000254658833416191)+
(−702.352467513552)×((t_LTλ]−
0.173291148291141)×(t_SiO2[λ]−
0.133361933361938))+(−159.217489977571)×
(((t_SiO2[λ1]−0.133361933361938)×(t_SiO2[λ]−
0.133361933361938)−0.00220941097478356)+
1181.94608028125×((t_LTλ]−
0.173291148291141)×(t_SiN[λ]−
0.0694258544258521))+148.194177052574×
(((t_SiO2[λ1]−0.133361933361938)×(t_SiN[λ]−
0.0694258544258521))+(−138.414297240254)×
(((t_SiN[λ]−0.0694258544258521)×(t_SiN[λ]−
0.0694258544258521)−0.00607933216152169)+
(−73.8108320642126)×((t_LT[λ]−
0.173291148291141)×(t_Si2[λ]−
0.432632632632632))+22.3596977549241×
((t_SiO2[λ]−0.133361933361938)×(t_Si2[λ]−
0.432632632632632))+(−180.302445874872)×
(((t_SiN[λ]−0.0694258544258521)×(t_Si2[λ]−
0.432632632632632))+58.1189523422145×
((t_Si2[λ]−0.432632632632632)×(t_Si2[λ]−
0.432632632632632)−0.0206911530435046)+(−
0.0892573877283934)×((t_LT[λ]−
0.173291148291141)×(si_psi−2 [deg]−15−
1794651794652))+0.1α2191016582739×
(((t_SiO2[λ]−0.133361933361938)×(si_psi_2
[deg]−15.1794651794652)+(−
0.566877950267944)×((t_SiN[λ]−0,
0694258544258521)×(si_psi_2 [deg]−
15.1794651794652))+(−0.523218662939604)×
(((t_Si2[λ1]−0.432632632632632)×(si_psi_2
[deg]−15.1794651794652))+
0.0α111049675010859×((si_psi_2 [deg]−
15.1794651794652)×(si_psi_2 [deg]−

15.1794651794652)−260,117227398797)+
2.43575857272564×(($t\_LT\lambda$]−0.173291148291−
141)×(Si_psi [deg]−21.3234663234663))+(−
0.269547003578196)×(($t\_SiO2[\lambda$]−
0.133161933361938)×(Si_psi [deg]−
21.3234663234663))+(−0.235856493743728)×
(($t\_SiN[\lambda$]−0.0694258544258521)×(Si_psi
[deg]−21.3234663234663))+
0.475976492439799×(($t\_Si2[\lambda$]−
0.432632632632632)×(Si_psi [deg]−
21.3234663234663))+0.00288777512919308×
((si_psi_2 [deg]−15.1794651794652)×(Si_psi
[deg]−21.3234663234663))+
0.00174948079902691×((Si_psi [deg]−
213234663234663)×(Si_psi [deg]−
21.3234663234663)−553.32136696361)      Equation 1

It is preferable that Si_psi, si_psi_2, t_Si2, t_SiN, t_SiO2, and t_LT are within ranges of angles and thicknesses in which Pkj in Equation 1 is about −70 deg or less. This makes it possible to reduce or prevent higher-order modes more reliably and effectively.

Further, it is shown that the higher-order modes can be effectively reduced or prevented when, for example, 35° Y-cut X-propagation LiTaO$_3$ is used for the piezoelectric film 7. Euler angles of this piezoelectric film 7 are (about 0°, about 125°, about 0°). In the acoustic wave device having the configuration of the fourth preferred embodiment, Equation 2, which is a relational equation between the specific parameters and the phase of the higher-order mode, was derived. Design parameters of the acoustic wave device other than the cut-angles and the Euler angles of the piezoelectric film 7 were the same or substantially the same as those used when Equation 1 was derived. The ranges of variations of the specific parameters were the same as when Equation 1 was derived.

Pkj [deg]=(−68.3045028100257)+
148.009830991658×($t\_LT[\lambda$]−
0.182938408896478)+(−31.7023619287189)×
($t\_SiO2[\lambda$1]−0.131180496150558)+59.9941−
196381256×($t\_SiN[\lambda$]−0.0722326775621397)+
28.3891130547491×($t\_Si2[\lambda$]−
0.457408041060735)+(−0.0551187486931435)×
(si_psi_2 [deg]−23.8177929854577)+
0.00621179951505866×(Si_psi [deg]−
33.7339606501283)+(−307.104268249355)×
(($t\_LT[\lambda$]−0,182938408896478)×($t\_SiO2[\lambda$]−
0.131180496150558))+$k$(−221.090307531174)×
(($t\_SiO2[\lambda$]−0.131180496150558)×($t\_SiO2[\lambda$]−
0131180496150558)−0.00245634808837649)+
3.0630243958978×(($t\_LT[\lambda$]−
0.182938408896478)×($t\_SiN[\lambda$]−
0.0722326775021397))+26.3784321839523×
(($t\_SiO2[\lambda$1]−0.131180496150558)×($t\_SiN[\lambda$]−
0.0722326775021397))+(−149.210462980265)×
(($t\_SiN[\lambda$]−0.0722326775021397)×($t\_SiN[\lambda$]−
0.0722326775021397)−0.00538017340609054)+
16.5185556736186×(($t\_LT[\lambda$]−
0.182938408896478)×($t\_Si2[\lambda$]−
0.457408041060735))+56.1146358518209×
(($t\_SiO2[\lambda$]−0.1311804961.50558)×($t\_Si2[\lambda$]−
0.457408041060735))+(−231.9230984773)×
(($t\_SiN[\lambda$]−0.0722326775021397)×($t\_Si2[\lambda$]−
0.457408041060735))+(−9,26166386908678)×
(($t\_Si2[\lambda$]−0.457408041060735)×($t\_Si2[\lambda$]−
0.457408041060735)−0.00796565129547814)+
(−0.0982556479630247)×(($t\_LT[\lambda$]−
0.182938408896478)×(si_psi_2 [deg]−
23.8177929854577))+(−0.144777667964478)×
(($t\_SiO2[\lambda$]−0.131180496150558)×(si_psi_2
[deg]−23.8177929854577))+(−
0.121859651665675)×(($t\_SiN[\lambda$]−
0.0722326775$\alpha$21397)×(si_psi_2 [deg]−
23.8177929854577))+(−0.337942081738039)×
(($t\_Si2[\lambda$]−0.457408041060735)×(si_psi_2
[deg]−23.8177929854577))+
0.000009255044587$4239×$((si_psi_2 [deg]−
23.8177929854577)×(si_psi_2 [deg]−
23.8177929854577)−211.955679987944)+
1.28762234468537×(($t\_LT[\lambda$]−
0.182938408896478)×(Si_psi [deg]−
33.7339606501283))+(−0.350061531387324)×
(($t\_SiO2[\lambda$]−0.13118049615055$8)×(Si_psi
[deg]−33.7339606501283))+(−
0.155177588775029)×(($t\_SiN[\lambda$]−
0.0722326775$\alpha$21397)×(Si_psi [deg]−
33.7339606501283))+0.305377220918695×
(($t\_Si2[\lambda$]−0.457408041060735)×(Si_psi [deg]−
33.7339606501283))+0.00184222592354461×
((si_psi_2 [deg]−23.8177929854577)×(Si_psi
[deg]−33.7339606501283))+
0.00210385689952457×((Si_psi [deg]−
33.7339606501283)×(Si_psi [deg]−
33.7339606501283)−454.804329993321)      Equation 2

It is preferable that Si_psi, si_psi_2, t_Si2, t_SiN, t_SiO2, and t_LT are within ranges of angles and thicknesses in which Pkj in Equation 2 is about −70 deg or less. This makes it possible to reduce or prevent higher-order modes more reliably and effectively.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a piezoelectric film directly or indirectly on the support substrate; and
an IDT electrode on the piezoelectric film; wherein
when a wavelength defined by an electrode finger pitch of the IDT electrode is $\lambda$, a thickness of the piezoelectric film is about 1$\lambda$ or less;
the piezoelectric film is a lithium tantalate film or a lithium niobate film;
the piezoelectric film has crystal axes [$X_P$, $Y_P$, $Z_P$];
the support substrate includes a first silicon layer and a second silicon layer laminated on the first silicon layer, and the second silicon layer is located closer to the piezoelectric film than the first silicon layer is in the support substrate;
a plane orientation of each of the first silicon layer and the second silicon layer is one of (100), (110), and (111);
in a silicon layer having a plane orientation of (111), when a direction vector obtained by projecting the $Z_P$ axis onto a (111) plane of the silicon layer is $k_{111}$, an angle between the direction vector $k_{111}$ and a [11-2] direction of silicon of the silicon layer is an angle $\alpha_{111}$;
in a silicon layer having a plane orientation of (110), when a direction vector obtained by projecting the $Z_P$ axis onto a (110) plane of the silicon layer is $k_{110}$, an angle between the direction vector $k_{110}$ and a [001] direction of silicon of the silicon layer is an angle $\alpha_{110}$;
in a silicon layer having a plane orientation of (100), when a direction vector obtained by projecting the $Z_P$ axis onto a (100) plane of the silicon layer is $k_{100}$, an angle between the direction vector $k_{110}$ and the [001] direction of silicon of the silicon layer is an angle $\alpha_{100}$;
when an angle between the plane orientation of the first silicon layer and the crystal axes of the piezoelectric film is an angle $\alpha$1, and an angle between the plane orientation of the second silicon layer and the crystal axes of the piezoelectric film is an angle $\alpha$2, each of the angle $\alpha$1 and the angle $\alpha$2 is one of three types of angles of the angle $\alpha_{100}$, the angle $\alpha_{110}$, and the angle $\alpha_{111}$; and a type of the angle α1 is different from a type of the angle α2 and/or a value of the angle α1 is different from a value of the angle α2.

2. The acoustic wave device according to claim 1, further comprising a first intermediate layer between the support substrate and the piezoelectric film.

3. The acoustic wave device according to claim 2, further comprising a second intermediate layer between the first intermediate layer and the piezoelectric film.

4. The acoustic wave device according to claim 3, wherein the first intermediate layer is a silicon oxide film;
the second intermediate layer is a silicon nitride film;
the piezoelectric film is a lithium tantalate film;
the plane orientation of the first silicon layer is (100), and the plane orientation of the second silicon layer is (100);
the angle α1 is the angle $\alpha_{100}$, and the angle α2 is the angle $\alpha_{100}$;
the value of the angle α1 satisfies $\alpha1=\alpha1_{100}+90\times n$, where n is an integer (0, ±1, ±2, . . . ), and the value of the angle α2 satisfies $\alpha2=\alpha2_{100}+90\times m$, where m is an integer (0, ±1, ±2, . . . ); and
the $\alpha1_{100}$ and the $\alpha2_{100}$ are any of combinations shown in Table 10:

TABLE 10

| Condition | $\alpha1_{100}(°)$ | $\alpha2_{100}(°)$ |
|---|---|---|
| 1 | 0 ± 2.5 | 20 ± 2.5 |
| 2 | 5 ± 2.5 | 15 ± 2.5 |
| 3 | 5 ± 2.5 | 30 ± 2.5 |
| 4 | 10 ± 2.5 | 0 ± 2.5 |
| 5 | 10 ± 2.5 | 5 ± 2.5 |
| 6 | 10 ± 2.5 | 15 ± 2.5 |
| 7 | 10 ± 2.5 | 20 ± 2.5 |
| 8 | 20 ± 2.5 | 0 ± 2.5 |
| 9 | 20 ± 2.5 | 5 ± 2.5 |
| 10 | 20 ± 2.5 | 10 ± 2.5 |
| 11 | 20 ± 2.5 | 15 ± 2.5 |
| 12 | 25 ± 2.5 | 0 ± 2.5 |
| 13 | 25 ± 2.5 | 5 ± 2.5 |
| 14 | 25 ± 2.5 | 10 ± 2.5. |

5. The acoustic wave device according to claim 3, wherein the first intermediate layer is a silicon oxide film;
the second intermediate layer is a silicon nitride film;
the piezoelectric film is a lithium tantalate film;
the plane orientation of the first silicon layer is (100), and the plane orientation of the second silicon layer is (110);
the angle α1 is the angle $\alpha_{100}$, and the angle α2 is the angle $\alpha_{110}$;
the value of the angle α1 is $\alpha1=\alpha1_{100}+90\times n$, where n is an integer (0, ±1, ±2, . . . ), and the value of the angle α2 satisfies $\alpha2=\alpha2_{110}+180\times m$, where m is an integer (0, ±1, ±2, . . . ); and
the $\alpha1_{100}$ and the $\alpha2_{110}$ are any of combinations shown in Table 11:

TABLE 11

| Condition | $\alpha1_{100}(°)$ | $\alpha2_{110}(°)$ |
|---|---|---|
| 1 | 0 ± 2.5 | 70 ± 5 |
| 2 | 0 ± 2.5 | 80 ± 5 |
| 3 | 0 ± 2.5 | 90 ± 5 |
| 4 | 5 ± 2.5 | 80 ± 5 |
| 5 | 5 ± 2.5 | 90 ± 5 |
| 6 | 10 ± 2.5 | 80 ± 5 |
| 7 | 10 ± 2.5 | 90 ± 5 |

TABLE 11-continued

| Condition | $\alpha1_{100}(°)$ | $\alpha2_{110}(°)$ |
|---|---|---|
| 8 | 20 ± 2.5 | 80 ± 5 |
| 9 | 20 ± 2.5 | 90 ± 5. |

6. The acoustic wave device according to claim 3, wherein the first intermediate layer is a silicon oxide film;
the second intermediate layer is a silicon nitride film;
the piezoelectric film is a lithium tantalate film;
the piezoelectric film includes a positive surface and a negative surface determined by a polarization direction of the piezoelectric film;
the plane orientation of the first silicon layer is (100), and the plane orientation of the second silicon layer is (111);
the angle α1 is the angle $\alpha_{100}$, and the angle α2 is the angle $\alpha_{111}$;
the value of the angle α1 satisfies $\alpha1=\alpha1_{100}+90\times n$, where n is an integer (0, ±1, ±2, . . . );
when the IDT electrode is on the negative surface of the piezoelectric film, the value of the angle α2 satisfies $\alpha2=\alpha2_{111}+120\times m$, where m is an integer (0, ±1, ±2, . . . );
when the IDT electrode is on the positive surface of the piezoelectric film, the value of the angle α2 satisfies $\alpha2=\alpha2_{111}+60+120\times m$, where m is the integer (0, ±1, ±2, . . . ); and
the $\alpha1_{100}$ and the $\alpha2_{111}$ are any of combinations shown in Table 12:

TABLE 12

| Condition | $\alpha1_{100}(°)$ | $\alpha2_{111}(°)$ |
|---|---|---|
| 1 | 0 ± 2.5 | 0 ± 2.5 |
| 2 | 0 ± 2.5 | 5 ± 2.5 |
| 3 | 0 ± 2.5 | 10 ± 2.5 |
| 4 | 0 ± 2.5 | 15 ± 2.5 |
| 5 | 0 ± 2.5 | 30 ± 2.5 |
| 6 | 5 ± 2.5 | 0 ± 2.5 |
| 7 | 5 ± 2.5 | 5 ± 2.5 |
| 8 | 5 ± 2.5 | 10 ± 2.5 |
| 9 | 5 ± 2.5 | 15 ± 2.5 |
| 10 | 5 ± 2.5 | 30 ± 2.5 |
| 11 | 15 ± 2.5 | 10 ± 2.5 |
| 12 | 15 ± 2.5 | 15 ± 2.5 |
| 13 | 15 ± 2.5 | 30 ± 2.5 |
| 14 | 15 ± 2.5 | 35 ± 2.5 |
| 15 | 20 ± 2.5 | 10 ± 2.5 |
| 16 | 20 ± 2.5 | 15 ± 2.5 |
| 17 | 25 ± 2.5 | 5 ± 2.5 |
| 18 | 25 ± 2.5 | 10 ± 2.5 |
| 19 | 25 ± 2.5 | 15 ± 2.5 |
| 20 | 25 ± 2.5 | 20 ± 2.5 |
| 21 | 30 ± 2.5 | 0 ± 2.5 |
| 22 | 30 ± 2.5 | 5 ± 2.5 |
| 23 | 30 ± 2.5 | 10 ± 2.5 |
| 24 | 30 ± 2.5 | 15 ± 2.5 |
| 25 | 30 ± 2.5 | 20 ± 2.5 |
| 26 | 30 ± 2.5 | 25 ± 2.5 |
| 27 | 30 ± 2.5 | 50 ± 2.5 |
| 28 | 30 ± 2.5 | 55 ± 2.5 |
| 29 | 30 ± 2.5 | 60 ± 2.5 |
| 30 | 35 ± 2.5 | 0 ± 2.5 |
| 31 | 35 ± 2.5 | 5 ± 2.5 |
| 32 | 35 ± 2.5 | 10 ± 2.5 |
| 33 | 35 ± 2.5 | 15 ± 2.5 |
| 34 | 35 ± 2.5 | 20 ± 2.5 |
| 35 | 35 ± 2.5 | 50 ± 2.5 |
| 36 | 35 ± 2.5 | 55 ± 2.5 |
| 37 | 35 ± 2.5 | 60 ± 2.5 |
| 38 | 40 ± 2.5 | 0 ± 2.5 |

TABLE 12-continued

| Condition | $\alpha 1_{100}(°)$ | $\alpha 2_{111}(°)$ |
|---|---|---|
| 39 | 40 ± 2.5 | 5 ± 2.5 |
| 40 | 40 ± 2.5 | 10 ± 2.5 |
| 41 | 40 ± 2.5 | 15 ± 2.5 |
| 42 | 40 ± 2.5 | 20 ± 2.5 |
| 43 | 40 ± 2.5 | 45 ± 2.5 |
| 44 | 40 ± 2.5 | 50 ± 2.5 |
| 45 | 40 ± 2.5 | 55 ± 2.5 |
| 46 | 40 ± 2.5 | 60 ± 2.5 |
| 47 | 45 ± 2.5 | 0 ± 2.5 |
| 48 | 45 ± 2.5 | 5 ± 2.5 |
| 49 | 45 ± 2.5 | 10 ± 2.5 |
| 50 | 45 ± 2.5 | 15 ± 2.5 |
| 51 | 45 ± 2.5 | 20 ± 2.5 |
| 52 | 45 ± 2.5 | 40 ± 2.5 |
| 53 | 45 ± 2.5 | 45 ± 2.5 |
| 54 | 45 ± 2.5 | 50 ± 2.5 |
| 55 | 45 ± 2.5 | 55 ± 2.5 |
| 56 | 45 ± 2.5 | 60 ± 2.5. |

7. The acoustic wave device according to claim 3, wherein
the first intermediate layer is a silicon oxide film;
the second intermediate layer is a silicon nitride film;
the piezoelectric film is a lithium tantalate film;
the plane orientation of the first silicon layer is (110), and the plane orientation of the second silicon layer is (100);
the angle $\alpha 1$ is the angle $\alpha_{110}$, and the angle $\alpha 2$ is the angle $\alpha_{100}$;
the value of the angle $\alpha 1$ is $\alpha 1 = \alpha 1_{110} + 180 \times n$, where n is an integer (0, ±1, ±2, ... ), and the value of the angle $\alpha 2$ satisfies $\alpha 2 = \alpha 2_{100} + 90 \times m$, where m is an integer (0, ±1, ±2, ... ); and
the $\alpha 1_{110}$ and the $\alpha 2_{100}$ are any of combinations shown in Table 13:

TABLE 13

| Condition | $\alpha 1_{110}(°)$ | $\alpha 2_{100}(°)$ |
|---|---|---|
| 1 | 0 ± 5 | 0 ± 2.5 |
| 2 | 0 ± 5 | 5 ± 2.5 |
| 3 | 0 ± 5 | 10 ± 2.5 |
| 4 | 0 ± 5 | 15 ± 2.5 |
| 5 | 10 ± 5 | 0 ± 2.5 |
| 6 | 10 ± 5 | 5 ± 2.5 |
| 7 | 10 ± 5 | 10 ± 2.5 |
| 8 | 10 ± 5 | 15 ± 2.5 |
| 9 | 20 ± 5 | 0 ± 2.5 |
| 10 | 20 ± 5 | 5 ± 2.5 |
| 11 | 20 ± 5 | 10 ± 2.5 |
| 12 | 20 ± 5 | 15 ± 2.5 |
| 13 | 20 ± 5 | 20 ± 2.5 |
| 14 | 20 ± 5 | 25 ± 2.5 |
| 15 | 30 ± 5 | 0 ± 2.5 |
| 16 | 30 ± 5 | 5 ± 2.5 |
| 17 | 30 ± 5 | 10 ± 2.5 |
| 18 | 30 ± 5 | 15 ± 2.5 |
| 19 | 30 ± 5 | 20 ± 2.5 |
| 20 | 30 ± 5 | 25 ± 2.5 |
| 21 | 30 ± 5 | 30 ± 2.5 |
| 22 | 40 ± 5 | 0 ± 2.5 |
| 23 | 40 ± 5 | 5 ± 2.5 |
| 24 | 40 ± 5 | 10 ± 2.5 |
| 25 | 40 ± 5 | 15 ± 2.5 |
| 26 | 40 ± 5 | 20 ± 2.5 |
| 27 | 40 ± 5 | 25 ± 2.5 |
| 28 | 40 ± 5 | 30 ± 2.5 |
| 29 | 40 ± 5 | 35 ± 2.5 |
| 30 | 40 ± 5 | 40 ± 2.5 |
| 31 | 40 ± 5 | 45 ± 2.5 |
| 32 | 50 ± 5 | 0 ± 2.5 |
| 33 | 50 ± 5 | 5 ± 2.5 |
| 34 | 50 ± 5 | 10 ± 2.5 |

TABLE 13-continued

| Condition | $\alpha 1_{110}(°)$ | $\alpha 2_{100}(°)$ |
|---|---|---|
| 35 | 50 ± 5 | 15 ± 2.5 |
| 36 | 50 ± 5 | 20 ± 2.5 |
| 37 | 50 ± 5 | 25 ± 2.5 |
| 38 | 50 ± 5 | 30 ± 2.5 |
| 39 | 50 ± 5 | 35 ± 2.5 |
| 40 | 50 ± 5 | 40 ± 2.5 |
| 41 | 50 ± 5 | 45 ± 2.5 |
| 42 | 60 ± 5 | 45 ± 2.5 |
| 43 | 80 ± 5 | 10 ± 2.5. |

8. The acoustic wave device according to claim 3, wherein
the first intermediate layer is a silicon oxide film;
the second intermediate layer is a silicon nitride film;
the piezoelectric film is a lithium tantalate film;
the plane orientation of the first silicon layer is (110), and the plane orientation of the second silicon layer is (110);
the angle $\alpha 1$ is the angle $\alpha_{110}$, and the angle $\alpha 2$ is the angle $\alpha 1_{110}$;
the value of the angle $\alpha 1$ satisfies $\alpha 1 = \alpha 1_{110} + 180 \times n$, where n is an integer (0, ±1, ±2, ... ), and the value of the angle $\alpha 2$ satisfies $\alpha 2 = \alpha 2_{110} + 180 \times m$, where m is an integer (0, ±1, ±2, ... ); and
the $\alpha 1_{110}$ and the $\alpha 2_{110}$ are any of combinations shown in Table 14:

TABLE 14

| Condition | $\alpha 1_{110}(°)$ | $\alpha 2_{110}(°)$ |
|---|---|---|
| 1 | 0 ± 5 | 80 ± 5 |
| 2 | 0 ± 5 | 90 ± 5 |
| 3 | 10 ± 5 | 80 ± 5 |
| 4 | 10 ± 5 | 90 ± 5 |
| 5 | 20 ± 5 | 70 ± 5 |
| 6 | 20 ± 5 | 80 ± 5 |
| 7 | 20 ± 5 | 90 ± 5 |
| 8 | 30 ± 5 | 50 ± 5 |
| 9 | 30 ± 5 | 60 ± 5 |
| 10 | 30 ± 5 | 70 ± 5 |
| 11 | 30 ± 5 | 80 ± 5 |
| 12 | 30 ± 5 | 90 ± 5 |
| 13 | 40 ± 5 | 50 ± 5 |
| 14 | 40 ± 5 | 60 ± 5 |
| 15 | 40 ± 5 | 70 ± 5 |
| 16 | 40 ± 5 | 80 ± 5 |
| 17 | 40 ± 5 | 90 ± 5 |
| 18 | 50 ± 5 | 60 ± 5 |
| 19 | 50 ± 5 | 70 ± 5 |
| 20 | 50 ± 5 | 80 ± 5 |
| 21 | 50 ± 5 | 90 ± 5 |
| 22 | 60 ± 5 | 70 ± 5 |
| 23 | 70 ± 5 | 30 ± 5 |
| 24 | 70 ± 5 | 60 ± 5 |
| 25 | 70 ± 5 | 80 ± 5 |
| 26 | 80 ± 5 | 90 ± 5. |

9. The acoustic wave device according to claim 3, wherein
the first intermediate layer is a silicon oxide film;
the second intermediate layer is a silicon nitride film;
the piezoelectric film is a lithium tantalate film;
the piezoelectric film includes a positive surface and a negative surface determined by a polarization direction of the piezoelectric film;
the plane orientation of the first silicon layer is (110), and the plane orientation of the second silicon layer is (111);
the angle $\alpha 1$ is the angle $\alpha_{110}$, and the angle $\alpha 2$ is the angle $\alpha_{111}$;

the value of the angle α1 satisfies α1=α1$_{110}$+180×n, where n is an integer (0, ±1, ±2, . . . );

when the IDT electrode is on the negative surface of the piezoelectric film, the value of the angle α2 satisfies α2=α2$_{111}$+120×m, where m is an integer (0, ±1, ±2, . . . );

when the IDT electrode is on the positive surface of the piezoelectric film, the value of the angle α2 satisfies α2=α2$_{111}$+60+120×m, where m is the integer (0, ±1, ±2, . . . ); and the α1$_{110}$ and the α2$_{111}$ are any of combinations shown in Table 15:

TABLE 15

| Condition | α1$_{110}$(°) | α2$_{111}$(°) |
|---|---|---|
| 1 | 0 ± 5 | 35 ± 2.5 |
| 2 | 0 ± 5 | 40 ± 2.5 |
| 3 | 0 ± 5 | 45 ± 2.5 |
| 4 | 0 ± 5 | 50 ± 2.5 |
| 5 | 0 ± 5 | 55 ± 2.5 |
| 6 | 0 ± 5 | 60 ± 2.5 |
| 7 | 10 ± 5 | 40 ± 2.5 |
| 8 | 10 ± 5 | 45 ± 2.5 |
| 9 | 10 ± 5 | 50 ± 2.5 |
| 10 | 10 ± 5 | 55 ± 2.5 |
| 11 | 10 ± 5 | 60 ± 2.5 |
| 12 | 20 ± 5 | 0 ± 2.5 |
| 13 | 20 ± 5 | 5 ± 2.5 |
| 14 | 20 ± 5 | 10 ± 2.5 |
| 15 | 20 ± 5 | 15 ± 2.5 |
| 16 | 20 ± 5 | 20 ± 2.5 |
| 17 | 20 ± 5 | 25 ± 2.5 |
| 18 | 20 ± 5 | 35 ± 2.5 |
| 19 | 20 ± 5 | 40 ± 2.5 |
| 20 | 20 ± 5 | 45 ± 2.5 |
| 21 | 20 ± 5 | 50 ± 2.5 |
| 22 | 20 ± 5 | 55 ± 2.5 |
| 23 | 20 ± 5 | 60 ± 2.5 |
| 24 | 30 ± 5 | 0 ± 2.5 |
| 25 | 30 ± 5 | 5 ± 2.5 |
| 26 | 30 ± 5 | 10 ± 2.5 |
| 27 | 30 ± 5 | 15 ± 2.5 |
| 28 | 30 ± 5 | 20 ± 2.5 |
| 29 | 30 ± 5 | 25 ± 2.5 |
| 30 | 30 ± 5 | 30 ± 2.5 |
| 31 | 30 ± 5 | 35 ± 2.5 |
| 32 | 30 ± 5 | 40 ± 2.5 |
| 33 | 30 ± 5 | 45 ± 2.5 |
| 34 | 30 ± 5 | 50 ± 2.5 |
| 35 | 30 ± 5 | 55 ± 2.5 |
| 36 | 30 ± 5 | 60 ± 2.5 |
| 37 | 40 ± 5 | 0 ± 2.5 |
| 38 | 40 ± 5 | 5 ± 2.5 |
| 39 | 40 ± 5 | 10 ± 2.5 |
| 40 | 40 ± 5 | 15 ± 2.5 |
| 41 | 40 ± 5 | 20 ± 2.5 |
| 42 | 40 ± 5 | 25 ± 2.5 |
| 43 | 40 ± 5 | 30 ± 2.5 |
| 44 | 40 ± 5 | 35 ± 2.5 |
| 45 | 40 ± 5 | 40 ± 2.5 |
| 46 | 40 ± 5 | 45 ± 2.5 |
| 47 | 40 ± 5 | 50 ± 2.5 |
| 48 | 40 ± 5 | 55 ± 2.5 |
| 49 | 40 ± 5 | 60 ± 2.5 |
| 50 | 50 ± 5 | 0 ± 2.5 |
| 51 | 50 ± 5 | 5 ± 2.5 |
| 52 | 50 ± 5 | 10 ± 2.5 |
| 53 | 50 ± 5 | 15 ± 2.5 |
| 54 | 50 ± 5 | 20 ± 2.5 |
| 55 | 50 ± 5 | 25 ± 2.5 |
| 56 | 50 ± 5 | 30 ± 2.5 |
| 57 | 50 ± 5 | 35 ± 2.5 |
| 58 | 50 ± 5 | 40 ± 2.5 |
| 59 | 50 ± 5 | 45 ± 2.5 |
| 60 | 50 ± 5 | 50 ± 2.5 |
| 61 | 50 ± 5 | 55 ± 2.5 |
| 62 | 50 ± 5 | 60 ± 2.5 |

TABLE 15-continued

| Condition | α1$_{110}$(°) | α2$_{111}$(°) |
|---|---|---|
| 63 | 60 ± 5 | 0 ± 2.5 |
| 64 | 60 ± 5 | 5 ± 2.5 |
| 65 | 60 ± 5 | 10 ± 2.5 |
| 66 | 60 ± 5 | 15 ± 2.5 |
| 67 | 60 ± 5 | 20 ± 2.5 |
| 68 | 60 ± 5 | 25 ± 2.5 |
| 69 | 60 ± 5 | 40 ± 2.5 |
| 70 | 60 ± 5 | 45 ± 2.5 |
| 71 | 60 ± 5 | 50 ± 2.5 |
| 72 | 60 ± 5 | 55 ± 2.5 |
| 73 | 60 ± 5 | 60 ± 2.5 |
| 74 | 70 ± 5 | 0 ± 2.5 |
| 75 | 80 ± 5 | 0 ± 2.5 |
| 76 | 80 ± 5 | 5 ± 2.5 |
| 77 | 80 ± 5 | 10 ± 2.5 |
| 78 | 80 ± 5 | 15 ± 2.5 |
| 79 | 80 ± 5 | 20 ± 2.5. |

10. The acoustic wave device according to claim 3, wherein the first intermediate layer is a silicon oxide film;

the second intermediate layer is a silicon nitride film;

the piezoelectric film is a lithium tantalate film;

the piezoelectric film includes a positive surface and a negative surface determined by a polarization direction of the piezoelectric film;

the plane orientation of the first silicon layer is (111), and the plane orientation of the second silicon layer is (100);

the angle α1 is the angle α$_{111}$, and the angle α2 is the angle α$_{110}$;

when the IDT electrode is on the negative surface of the piezoelectric film, the value of the angle α1 satisfies α1=α1$_{111}$+120×n, where n is an integer (0, ±1, ±2, . . . );

when the IDT electrode is on the positive surface of the piezoelectric film, the value of the angle α1 satisfies α1=α1$_{111}$+60+120×n, where n is the integer (0, ±1, ±2, . . . );

the value of the angle α2 satisfies α2=α2$_{100}$+90×m, where m is an integer (0, ±1, ±2, . . . ); and the α1$_{111}$ and the α2$_{100}$ are any of combinations shown in Table 16:

TABLE 16

| Condition | α1$_{111}$(°) | α2$_{100}$(°) |
|---|---|---|
| 1 | 0 ± 2.5 | 0 ± 2.5 |
| 2 | 0 ± 2.5 | 5 ± 2.5 |
| 3 | 0 ± 2.5 | 10 ± 2.5 |
| 4 | 0 ± 2.5 | 30 ± 2.5 |
| 5 | 0 ± 2.5 | 35 ± 2.5 |
| 6 | 0 ± 2.5 | 40 ± 2.5 |
| 7 | 0 ± 2.5 | 45 ± 2.5 |
| 8 | 5 ± 2.5 | 0 ± 2.5 |
| 9 | 5 ± 2.5 | 5 ± 2.5 |
| 10 | 5 ± 2.5 | 10 ± 2.5 |
| 11 | 5 ± 2.5 | 30 ± 2.5 |
| 12 | 5 ± 2.5 | 35 ± 2.5 |
| 13 | 5 ± 2.5 | 40 ± 2.5 |
| 14 | 5 ± 2.5 | 45 ± 2.5 |
| 15 | 10 ± 2.5 | 0 ± 2.5 |
| 16 | 10 ± 2.5 | 5 ± 2.5 |
| 17 | 10 ± 2.5 | 10 ± 2.5 |
| 18 | 10 ± 2.5 | 30 ± 2.5 |
| 19 | 10 ± 2.5 | 35 ± 2.5 |
| 20 | 10 ± 2.5 | 40 ± 2.5 |
| 21 | 10 ± 2.5 | 45 ± 2.5 |
| 22 | 15 ± 2.5 | 0 ± 2.5 |

TABLE 16-continued

| Condition | α1₁₁₁(°) | α2₁₀₀(°) |
|---|---|---|
| 23 | 15 ± 2.5 | 5 ± 2.5 |
| 24 | 15 ± 2.5 | 10 ± 2.5 |
| 25 | 15 ± 2.5 | 25 ± 2.5 |
| 26 | 15 ± 2.5 | 30 ± 2.5 |
| 27 | 15 ± 2.5 | 35 ± 2.5 |
| 28 | 15 ± 2.5 | 40 ± 2.5 |
| 29 | 15 ± 2.5 | 45 ± 2.5 |
| 30 | 20 ± 2.5 | 0 ± 2.5 |
| 31 | 20 ± 2.5 | 5 ± 2.5 |
| 32 | 20 ± 2.5 | 10 ± 2.5 |
| 33 | 20 ± 2.5 | 25 ± 2.5 |
| 34 | 20 ± 2.5 | 30 ± 2.5 |
| 35 | 20 ± 2.5 | 35 ± 2.5 |
| 36 | 20 ± 2.5 | 40 ± 2.5 |
| 37 | 20 ± 2.5 | 45 ± 2.5 |
| 38 | 25 ± 2.5 | 0 ± 2.5 |
| 39 | 25 ± 2.5 | 5 ± 2.5 |
| 40 | 25 ± 2.5 | 10 ± 2.5 |
| 41 | 25 ± 2.5 | 15 ± 2.5 |
| 42 | 25 ± 2.5 | 25 ± 2.5 |
| 43 | 25 ± 2.5 | 30 ± 2.5 |
| 44 | 30 ± 2.5 | 0 ± 2.5 |
| 45 | 30 ± 2.5 | 5 ± 2.5 |
| 46 | 30 ± 2.5 | 10 ± 2.5 |
| 47 | 30 ± 2.5 | 15 ± 2.5 |
| 48 | 30 ± 2.5 | 20 ± 2.5 |
| 49 | 30 ± 2.5 | 25 ± 2.5 |
| 50 | 30 ± 2.5 | 30 ± 2.5 |
| 51 | 30 ± 2.5 | 45 ± 2.5 |
| 52 | 35 ± 2.5 | 0 ± 2.5 |
| 53 | 35 ± 2.5 | 5 ± 2.5 |
| 54 | 35 ± 2.5 | 10 ± 2.5 |
| 55 | 35 ± 2.5 | 15 ± 2.5 |
| 56 | 35 ± 2.5 | 20 ± 2.5 |
| 57 | 35 ± 2.5 | 25 ± 2.5 |
| 58 | 35 ± 2.5 | 30 ± 2.5 |
| 59 | 35 ± 2.5 | 35 ± 2.5 |
| 60 | 35 ± 2.5 | 40 ± 2.5 |
| 61 | 40 ± 2.5 | 0 ± 2.5 |
| 62 | 40 ± 2.5 | 5 ± 2.5 |
| 63 | 40 ± 2.5 | 10 ± 2.5 |
| 64 | 40 ± 2.5 | 15 ± 2.5 |
| 65 | 40 ± 2.5 | 20 ± 2.5 |
| 66 | 40 ± 2.5 | 25 ± 2.5 |
| 67 | 40 ± 2.5 | 30 ± 2.5 |
| 68 | 40 ± 2.5 | 35 ± 2.5 |
| 69 | 40 ± 2.5 | 40 ± 2.5 |
| 70 | 40 ± 2.5 | 45 ± 2.5 |
| 71 | 45 ± 2.5 | 0 ± 2.5 |
| 72 | 45 ± 2.5 | 5 ± 2.5 |
| 73 | 45 ± 2.5 | 15 ± 2.5 |
| 74 | 45 ± 2.5 | 20 ± 2.5 |
| 75 | 45 ± 2.5 | 25 ± 2.5 |
| 76 | 45 ± 2.5 | 30 ± 2.5 |
| 77 | 45 ± 2.5 | 35 ± 2.5 |
| 78 | 45 ± 2.5 | 40 ± 2.5 |
| 79 | 45 ± 2.5 | 45 ± 2.5 |
| 80 | 50 ± 2.5 | 0 ± 2.5 |
| 81 | 50 ± 2.5 | 5 ± 2.5 |
| 82 | 50 ± 2.5 | 15 ± 2.5 |
| 83 | 50 ± 2.5 | 25 ± 2.5 |
| 84 | 50 ± 2.5 | 30 ± 2.5 |
| 85 | 50 ± 2.5 | 35 ± 2.5 |
| 86 | 50 ± 2.5 | 40 ± 2.5 |
| 87 | 50 ± 2.5 | 45 ± 2.5 |
| 88 | 55 ± 2.5 | 0 ± 2.5 |
| 89 | 55 ± 2.5 | 5 ± 2.5 |
| 90 | 55 ± 2.5 | 15 ± 2.5 |
| 91 | 55 ± 2.5 | 20 ± 2.5 |
| 92 | 55 ± 2.5 | 25 ± 2.5 |
| 93 | 55 ± 2.5 | 30 ± 2.5 |
| 94 | 55 ± 2.5 | 35 ± 2.5 |
| 95 | 55 ± 2.5 | 40 ± 2.5 |
| 96 | 55 ± 2.5 | 45 ± 2.5 |
| 97 | 60 ± 2.5 | 5 ± 2.5 |
| 98 | 60 ± 2.5 | 15 ± 2.5 |
| 99 | 60 ± 2.5 | 20 ± 2.5 |
| 100 | 60 ± 2.5 | 25 ± 2.5 |
| 101 | 60 ± 2.5 | 30 ± 2.5 |
| 102 | 60 ± 2.5 | 35 ± 2.5 |
| 103 | 60 ± 2.5 | 40 ± 2.5 |
| 104 | 60 ± 2.5 | 45 ± 2.5. |

11. The acoustic wave device according to claim 3, wherein
the first intermediate layer is a silicon oxide film;
the second intermediate layer is a silicon nitride film;
the piezoelectric film is a lithium tantalate film;
the piezoelectric film includes a positive surface and a negative surface determined by a polarization direction of the piezoelectric film;
the plane orientation of the first silicon layer is (111), and the plane orientation of the second silicon layer is (110);
the angle α1 is the angle $\alpha_{111}$, and the angle α2 is the angle when the IDT electrode is on the negative surface of the piezoelectric film, the value of the angle α1 satisfies $\alpha1=\alpha1_{111}+120\times n$, where n is an integer (0, ±1, ±2, . . . );
when the IDT electrode is on the positive surface of the piezoelectric film, the value of the angle α1 satisfies $\alpha1=\alpha1_{111}+60+120\times n$, where n is the integer (0, ±1, ±2, . . . );
the value of the angle α2 satisfies $\alpha2=\alpha2_{110}+180\times m$, where m is an integer (0, ±1, ±2, . . . ); and
the $\alpha1_{111}$ and the $\alpha2_{110}$ are any of combinations shown in Table 17:

TABLE 17

| Condition | α1₁₁₁(°) | α2₁₁₀(°) |
|---|---|---|
| 1 | 0 ± 2.5 | 80 ± 5 |
| 2 | 0 ± 2.5 | 90 ± 5 |
| 3 | 5 ± 2.5 | 80 ± 5 |
| 4 | 5 ± 2.5 | 90 ± 5 |
| 5 | 10 ± 2.5 | 80 ± 5 |
| 6 | 10 ± 2.5 | 90 ± 5 |
| 7 | 15 ± 2.5 | 80 ± 5 |
| 8 | 15 ± 2.5 | 90 ± 5 |
| 9 | 20 ± 2.5 | 70 ± 5 |
| 10 | 25 ± 2.5 | 50 ± 5 |
| 11 | 25 ± 2.5 | 70 ± 5 |
| 12 | 25 ± 2.5 | 80 ± 5 |
| 13 | 25 ± 2.5 | 90 ± 5 |
| 14 | 30 ± 2.5 | 50 ± 5 |
| 15 | 30 ± 2.5 | 60 ± 5 |
| 16 | 30 ± 2.5 | 70 ± 5 |
| 17 | 30 ± 2.5 | 80 ± 5 |
| 18 | 30 ± 2.5 | 90 ± 5 |
| 19 | 35 ± 2.5 | 50 ± 5 |
| 20 | 35 ± 2.5 | 60 ± 5 |
| 21 | 35 ± 2.5 | 70 ± 5 |
| 22 | 35 ± 2.5 | 80 ± 5 |
| 23 | 35 ± 2.5 | 90 ± 5 |
| 24 | 40 ± 2.5 | 50 ± 5 |
| 25 | 40 ± 2.5 | 60 ± 5 |
| 26 | 40 ± 2.5 | 70 ± 5 |
| 27 | 40 ± 2.5 | 80 ± 5 |
| 28 | 40 ± 2.5 | 90 ± 5 |
| 29 | 45 ± 2.5 | 50 ± 5 |
| 30 | 45 ± 2.5 | 60 ± 5 |
| 31 | 45 ± 2.5 | 70 ± 5 |
| 32 | 45 ± 2.5 | 80 ± 5 |
| 33 | 45 ± 2.5 | 90 ± 5 |
| 34 | 50 ± 2.5 | 50 ± 5 |
| 35 | 50 ± 2.5 | 60 ± 5 |
| 36 | 50 ± 2.5 | 70 ± 5 |

TABLE 17-continued

| Condition | α1₁₁₁(°) | α2₁₁₀(°) |
|---|---|---|
| 37 | 50 ± 2.5 | 80 ± 5 |
| 38 | 50 ± 2.5 | 90 ± 5 |
| 39 | 55 ± 2.5 | 50 ± 5 |
| 40 | 55 ± 2.5 | 60 ± 5 |
| 41 | 55 ± 2.5 | 70 ± 5 |
| 42 | 55 ± 2.5 | 80 ± 5 |
| 43 | 55 ± 2.5 | 90 ± 5 |
| 44 | 60 ± 2.5 | 50 ± 5 |
| 45 | 60 ± 2.5 | 60 ± 5 |
| 46 | 60 ± 2.5 | 70 ± 5 |
| 47 | 60 ± 2.5 | 80 ± 5 |
| 48 | 60 ± 2.5 | 90 ± 5. |

12. The acoustic wave device according to claim 3, wherein
the first intermediate layer is a silicon oxide film;
the second intermediate layer is a silicon nitride film;
the piezoelectric film is a lithium tantalate film;
the piezoelectric film includes a positive surface and a negative surface determined by a polarization direction of the piezoelectric film;
the plane orientation of the first silicon layer is (111), and the plane orientation of the second silicon layer is (111);
the angle α1 is the angle $\alpha_{111}$, and the angle α2 is the angle $\alpha_{111}$;
when the IDT electrode is on the negative surface of the piezoelectric film, the value of the angle α1 satisfies α1=α1₁₁₁+120×n, where n is an integer (0, ±1, ±2, ... ), and the value of the angle α2 satisfies α2=α2₁₁₁+120×m, where m is an integer (0, ±1, ±2, ... );
when the IDT electrode is provided on the positive surface of the piezoelectric film, the value of the angle α1 satisfies α1=α1₁₁₁+60+120×n, where n is the integer (0, ±1, ±2, ... ), and the value of the angle α2 satisfies α2=α2₁₁₁+60+120×m, where m is the integer (0, ±1, ±2, ... ); and
the α1₁₁₁ and the α2₁₁₁ are any of combinations shown in Table 18:

TABLE 18

| Condition | α1₁₁₁(°) | α2₁₁₁(°) |
|---|---|---|
| 1 | 0 ± 2.5 | 40 ± 2.5 |
| 2 | 0 ± 2.5 | 45 ± 2.5 |
| 3 | 0 ± 2.5 | 50 ± 2.5 |
| 4 | 0 ± 2.5 | 55 ± 2.5 |
| 5 | 0 ± 2.5 | 60 ± 2.5 |
| 6 | 5 ± 2.5 | 40 ± 2.5 |
| 7 | 5 ± 2.5 | 45 ± 2.5 |
| 8 | 5 ± 2.5 | 50 ± 2.5 |
| 9 | 5 ± 2.5 | 55 ± 2.5 |
| 10 | 5 ± 2.5 | 60 ± 2.5 |
| 11 | 10 ± 2.5 | 35 ± 2.5 |
| 12 | 10 ± 2.5 | 40 ± 2.5 |
| 13 | 10 ± 2.5 | 45 ± 2.5 |
| 14 | 10 ± 2.5 | 50 ± 2.5 |
| 15 | 10 ± 2.5 | 55 ± 2.5 |
| 16 | 10 ± 2.5 | 60 ± 2.5 |
| 17 | 25 ± 2.5 | 60 ± 2.5 |
| 18 | 30 ± 2.5 | 0 ± 2.5 |
| 19 | 30 ± 2.5 | 5 ± 2.5 |
| 20 | 30 ± 2.5 | 10 ± 2.5 |
| 21 | 30 ± 2.5 | 15 ± 2.5 |
| 22 | 30 ± 2.5 | 25 ± 2.5 |
| 23 | 30 ± 2.5 | 30 ± 2.5 |
| 24 | 30 ± 2.5 | 40 ± 2.5 |
| 25 | 30 ± 2.5 | 45 ± 2.5 |
| 26 | 30 ± 2.5 | 50 ± 2.5 |
| 27 | 30 ± 2.5 | 55 ± 2.5 |
| 28 | 30 ± 2.5 | 60 ± 2.5 |
| 29 | 35 ± 2.5 | 0 ± 2.5 |
| 30 | 35 ± 2.5 | 5 ± 2.5 |
| 31 | 35 ± 2.5 | 10 ± 2.5 |
| 32 | 35 ± 2.5 | 15 ± 2.5 |
| 33 | 35 ± 2.5 | 20 ± 2.5 |
| 34 | 35 ± 2.5 | 25 ± 2.5 |
| 35 | 35 ± 2.5 | 30 ± 2.5 |
| 36 | 35 ± 2.5 | 35 ± 2.5 |
| 37 | 35 ± 2.5 | 40 ± 2.5 |
| 38 | 35 ± 2.5 | 45 ± 2.5 |
| 39 | 35 ± 2.5 | 50 ± 2.5 |
| 40 | 35 ± 2.5 | 55 ± 2.5 |
| 41 | 35 ± 2.5 | 60 ± 2.5 |
| 42 | 40 ± 2.5 | 0 ± 2.5 |
| 43 | 40 ± 2.5 | 5 ± 2.5 |
| 44 | 40 ± 2.5 | 10 ± 2.5 |
| 45 | 40 ± 2.5 | 15 ± 2.5 |
| 46 | 40 ± 2.5 | 20 ± 2.5 |
| 47 | 40 ± 2.5 | 25 ± 2.5 |
| 48 | 40 ± 2.5 | 30 ± 2.5 |
| 49 | 40 ± 2.5 | 35 ± 2.5 |
| 50 | 40 ± 2.5 | 40 ± 2.5 |
| 51 | 40 ± 2.5 | 45 ± 2.5 |
| 52 | 40 ± 2.5 | 50 ± 2.5 |
| 53 | 40 ± 2.5 | 55 ± 2.5 |
| 54 | 40 ± 2.5 | 60 ± 2.5 |
| 55 | 45 ± 2.5 | 0 ± 2.5 |
| 56 | 45 ± 2.5 | 5 ± 2.5 |
| 57 | 45 ± 2.5 | 10 ± 2.5 |
| 58 | 45 ± 2.5 | 15 ± 2.5 |
| 59 | 45 ± 2.5 | 20 ± 2.5 |
| 60 | 45 ± 2.5 | 30 ± 2.5 |
| 61 | 45 ± 2.5 | 35 ± 2.5 |
| 62 | 45 ± 2.5 | 40 ± 2.5 |
| 63 | 45 ± 2.5 | 45 ± 2.5 |
| 64 | 45 ± 2.5 | 50 ± 2.5 |
| 65 | 45 ± 2.5 | 55 ± 2.5 |
| 66 | 45 ± 2.5 | 60 ± 2.5 |
| 67 | 50 ± 2.5 | 0 ± 2.5 |
| 68 | 50 ± 2.5 | 5 ± 2.5 |
| 69 | 50 ± 2.5 | 10 ± 2.5 |
| 70 | 50 ± 2.5 | 15 ± 2.5 |
| 71 | 50 ± 2.5 | 25 ± 2.5 |
| 72 | 50 ± 2.5 | 35 ± 2.5 |
| 73 | 50 ± 2.5 | 40 ± 2.5 |
| 74 | 50 ± 2.5 | 45 ± 2.5 |
| 75 | 50 ± 2.5 | 50 ± 2.5 |
| 76 | 50 ± 2.5 | 55 ± 2.5 |
| 77 | 50 ± 2.5 | 60 ± 2.5 |
| 78 | 55 ± 2.5 | 10 ± 2.5 |
| 79 | 55 ± 2.5 | 15 ± 2.5 |
| 80 | 55 ± 2.5 | 20 ± 2.5 |
| 81 | 55 ± 2.5 | 30 ± 2.5 |
| 82 | 55 ± 2.5 | 35 ± 2.5 |
| 83 | 55 ± 2.5 | 40 ± 2.5 |
| 84 | 55 ± 2.5 | 45 ± 2.5 |
| 85 | 55 ± 2.5 | 50 ± 2.5 |
| 86 | 55 ± 2.5 | 55 ± 2.5 |
| 87 | 55 ± 2.5 | 60 ± 2.5 |
| 88 | 60 ± 2.5 | 10 ± 2.5 |
| 89 | 60 ± 2.5 | 15 ± 2.5 |
| 90 | 60 ± 2.5 | 20 ± 2.5 |
| 91 | 60 ± 2.5 | 30 ± 2.5 |
| 92 | 60 ± 2.5 | 35 ± 2.5 |
| 93 | 60 ± 2.5 | 40 ± 2.5 |
| 94 | 60 ± 2.5 | 45 ± 2.5 |
| 95 | 60 ± 2.5 | 50 ± 2.5 |
| 96 | 60 ± 2.5 | 55 ± 2.5 |
| 97 | 60 ± 2.5 | 60 ± 2.5. |

13. The acoustic wave device according to claim 2, wherein
the first intermediate layer is a silicon oxide film;
the piezoelectric film is a lithium tantalate film;
the piezoelectric film is directly on the first intermediate layer;
the plane orientation of the first silicon layer is (100), and the plane orientation of the second silicon layer is (100);
the angle $\alpha 1$ is the angle $\alpha_{100}$, and the angle $\alpha 2$ is the angle $\alpha_{100}$;
the value of the angle $\alpha 1$ satisfies $\alpha 1 = \alpha 1_{100} + 90 \times n$, where n is an integer $(0, \pm 1, \pm 2, \ldots)$, and the value of the angle $\alpha 2$ satisfies $\alpha 2 = \alpha 2_{100} + 90 \times m$, where m is an integer $(0, \pm 1, \pm 2, \ldots)$; and
the $\alpha 1_{100}$ and the $\alpha 2_{100}$ are any of combinations shown in Table 1:

TABLE 1

| Condition | $\alpha 1_{100}(°)$ | $\alpha 2_{100}(°)$ |
|---|---|---|
| 1 | 20 ± 2.5 | 0 ± 2.5 |
| 2 | 20 ± 2.5 | 5 ± 2.5 |
| 3 | 20 ± 2.5 | 10 ± 2.5 |
| 4 | 20 ± 2.5 | 15 ± 2.5. |

14. The acoustic wave device according to claim 2, wherein
the first intermediate layer is a silicon oxide film;
the piezoelectric film is a lithium tantalate film;
the piezoelectric film is directly on the first intermediate layer;
the plane orientation of the first silicon layer is (100), and the plane orientation of the second silicon layer is (110);
the angle $\alpha 1$ is the angle $\alpha_{100}$, and the angle $\alpha 2$ is the angle $\alpha_{110}$;
the value of the angle $\alpha 1$ satisfies $\alpha 1 = \alpha 1_{100} + 90 \times n$, where n is an integer $(0, \pm 1, \pm 2, \ldots)$, and the value of the angle $\alpha 2$ satisfies $\alpha 2 = \alpha 2_{110} + 180 \times m$, where m is an integer $(0, \pm 1, \pm 2, \ldots)$; and
the $\alpha 1_{100}$ and the $\alpha 2_{110}$ are any of combinations shown in Table 2:

TABLE 2

| Condition | $\alpha 1_{100}(°)$ | $\alpha 2_{110}(°)$ |
|---|---|---|
| 1 | 20 ± 2.5 | 80 ± 5 |
| 2 | 20 ± 2.5 | 90 ± 5. |

15. The acoustic wave device according to claim 2, wherein
the first intermediate layer is a silicon oxide film;
the piezoelectric film is a lithium tantalate film;
the piezoelectric film is directly on the first intermediate layer;
the piezoelectric film includes a positive surface and a negative surface determined by a polarization direction of the piezoelectric film;
the plane orientation of the first silicon layer is (100), and the plane orientation of the second silicon layer is (111);
the angle $\alpha 1$ is the angle $\alpha_{100}$, and the angle $\alpha 2$ is the angle $\alpha_{111}$;
the value of the angle $\alpha 1$ satisfies $\alpha 1 = \alpha 1_{100} + 90 \times n$, where n is an integer $(0, \pm 1, \pm 2, \ldots)$;
when the IDT electrode is on the negative surface of the piezoelectric film, the value of the angle $\alpha 2$ satisfies $\alpha 2 = \alpha 2_{111} + 120 \times m$, where m is an integer $(0, \pm 1, \pm 2, \ldots)$;
when the IDT electrode is on the positive surface of the piezoelectric film, the value of the angle $\alpha 2$ satisfies $\alpha 2 = \alpha 2_{111} + 60 + 120 \times m$, where m is the integer $(0, \pm 1, \pm 2, \ldots)$; and
the $\alpha 1_{100}$ and the $\alpha 2_{111}$ are any of combinations shown in Table 3:

TABLE 3

| Condition | $\alpha 1_{100}(°)$ | $\alpha 2_{111}(°)$ |
|---|---|---|
| 1 | 15 ± 2.5 | 20 ± 2.5 |
| 2 | 25 ± 2.5 | 5 ± 2.5 |
| 3 | 30 ± 2.5 | 5 ± 2.5 |
| 4 | 40 ± 2.5 | 0 ± 2.5 |
| 5 | 40 ± 2.5 | 60 ± 2.5 |
| 6 | 45 ± 2.5 | 0 ± 2.5 |
| 7 | 45 ± 2.5 | 55 ± 2.5 |
| 8 | 45 ± 2.5 | 60 ± 2.5. |

16. The acoustic wave device according to claim 2, wherein
the first intermediate layer is a silicon oxide film;
the piezoelectric film is a lithium tantalate film;
the piezoelectric film is directly on the first intermediate layer;
the plane orientation of the first silicon layer is (110), and the plane orientation of the second silicon layer is (100);
the angle $\alpha 1$ is the angle $\alpha_{110}$, and the angle $\alpha 2$ is the angle $\alpha_{100}$;
the value of the angle $\alpha 1$ satisfies $\alpha 1 = \alpha 1_{110} + 180 \times n$, where n is an integer $(0, \pm 1, \pm 2, \ldots)$, and the value of the angle $\alpha 2$ satisfies $\alpha 2 = \alpha 2_{100} + 90 \times m$, where m is an integer $(0, \pm 1, \pm 2, \ldots)$; and
the $\alpha 1_{110}$ and the $\alpha 2_{100}$ are any of combinations shown in Table 4:

TABLE 4

| Condition | $\alpha 1_{110}(°)$ | $\alpha 2_{100}(°)$ |
|---|---|---|
| 1 | 0 ± 5 | 0 ± 2.5 |
| 2 | 0 ± 5 | 5 ± 2.5 |
| 3 | 0 ± 5 | 10 ± 2.5 |
| 4 | 0 ± 5 | 15 ± 2.5 |
| 5 | 0 ± 5 | 20 ± 2.5 |
| 6 | 0 ± 5 | 25 ± 2.5 |
| 7 | 0 ± 5 | 30 ± 2.5 |
| 8 | 0 ± 5 | 35 ± 2.5 |
| 9 | 0 ± 5 | 40 ± 2.5 |
| 10 | 0 ± 5 | 45 ± 2.5 |
| 11 | 10 ± 5 | 0 ± 2.5 |
| 12 | 10 ± 5 | 5 ± 2.5 |
| 13 | 10 ± 5 | 10 ± 2.5 |
| 14 | 10 ± 5 | 15 ± 2.5 |
| 15 | 10 ± 5 | 20 ± 2.5 |
| 16 | 10 ± 5 | 25 ± 2.5 |
| 17 | 10 ± 5 | 30 ± 2.5 |
| 18 | 10 ± 5 | 35 ± 2.5 |
| 19 | 10 ± 5 | 40 ± 2.5 |
| 20 | 10 ± 5 | 45 ± 2.5 |
| 21 | 20 ± 5 | 0 ± 2.5 |
| 22 | 20 ± 5 | 5 ± 2.5 |
| 23 | 20 ± 5 | 10 ± 2.5 |
| 24 | 20 ± 5 | 15 ± 2.5 |
| 25 | 20 ± 5 | 20 ± 2.5 |
| 26 | 20 ± 5 | 25 ± 2.5 |
| 27 | 20 ± 5 | 30 ± 2.5 |
| 28 | 20 ± 5 | 35 ± 2.5 |

TABLE 4-continued

| Condition | α1₁₁₀(°) | α2₁₀₀(°) |
|---|---|---|
| 29 | 20 ± 5 | 40 ± 2.5 |
| 30 | 20 ± 5 | 45 ± 2.5 |
| 31 | 30 ± 5 | 5 ± 2.5 |
| 32 | 30 ± 5 | 10 ± 2.5 |
| 33 | 30 ± 5 | 15 ± 2.5 |
| 34 | 30 ± 5 | 20 ± 2.5 |
| 35 | 30 ± 5 | 25 ± 2.5 |
| 36 | 30 ± 5 | 30 ± 2.5 |
| 37 | 30 ± 5 | 35 ± 2.5 |
| 38 | 30 ± 5 | 40 ± 2.5 |
| 39 | 30 ± 5 | 45 ± 2.5 |
| 40 | 40 ± 5 | 0 ± 2.5 |
| 41 | 40 ± 5 | 5 ± 2.5 |
| 42 | 40 ± 5 | 10 ± 2.5 |
| 43 | 40 ± 5 | 15 ± 2.5 |
| 44 | 40 ± 5 | 20 ± 2.5 |
| 45 | 40 ± 5 | 25 ± 2.5 |
| 46 | 40 ± 5 | 30 ± 2.5 |
| 47 | 40 ± 5 | 35 ± 2.5 |
| 48 | 40 ± 5 | 40 ± 2.5 |
| 49 | 40 ± 5 | 45 ± 2.5 |
| 50 | 50 ± 5 | 0 ± 2.5 |
| 51 | 50 ± 5 | 5 ± 2.5 |
| 52 | 50 ± 5 | 10 ± 2.5 |
| 53 | 50 ± 5 | 15 ± 2.5 |
| 54 | 50 ± 5 | 20 ± 2.5 |
| 55 | 50 ± 5 | 25 ± 2.5 |
| 56 | 50 ± 5 | 30 ± 2.5 |
| 57 | 50 ± 5 | 35 ± 2.5 |
| 58 | 50 ± 5 | 40 ± 2.5 |
| 59 | 50 ± 5 | 45 ± 2.5 |
| 60 | 60 ± 5 | 0 ± 2.5 |
| 61 | 60 ± 5 | 5 ± 2.5 |
| 62 | 60 ± 5 | 10 ± 2.5 |
| 63 | 60 ± 5 | 15 ± 2.5 |
| 64 | 60 ± 5 | 20 ± 2.5 |
| 65 | 60 ± 5 | 25 ± 2.5 |
| 66 | 60 ± 5 | 30 ± 2.5 |
| 67 | 60 ± 5 | 35 ± 2.5 |
| 68 | 60 ± 5 | 40 ± 2.5 |
| 69 | 60 ± 5 | 45 ± 2.5 |
| 70 | 70 ± 5 | 0 ± 2.5 |
| 71 | 70 ± 5 | 5 ± 2.5 |
| 72 | 70 ± 5 | 10 ± 2.5 |
| 73 | 70 ± 5 | 15 ± 2.5 |
| 74 | 70 ± 5 | 20 ± 2.5 |
| 75 | 70 ± 5 | 25 ± 2.5 |
| 76 | 70 ± 5 | 30 ± 2.5 |
| 77 | 70 ± 5 | 35 ± 2.5 |
| 78 | 70 ± 5 | 40 ± 2.5 |
| 79 | 70 ± 5 | 45 ± 2.5 |
| 80 | 80 ± 5 | 0 ± 2.5 |
| 81 | 80 ± 5 | 5 ± 2.5 |
| 82 | 80 ± 5 | 10 ± 2.5 |
| 83 | 80 ± 5 | 15 ± 2.5 |
| 84 | 80 ± 5 | 20 ± 2.5 |
| 85 | 80 ± 5 | 25 ± 2.5 |
| 86 | 80 ± 5 | 30 ± 2.5 |
| 87 | 80 ± 5 | 35 ± 2.5 |
| 88 | 80 ± 5 | 40 ± 2.5 |
| 89 | 80 ± 5 | 45 ± 2.5 |
| 90 | 90 ± 5 | 0 ± 2.5 |
| 91 | 90 ± 5 | 5 ± 2.5 |
| 92 | 90 ± 5 | 10 ± 2.5 |
| 93 | 90 ± 5 | 15 ± 2.5 |
| 94 | 90 ± 5 | 20 ± 2.5 |
| 95 | 90 ± 5 | 25 ± 2.5 |
| 96 | 90 ± 5 | 30 ± 2.5 |
| 97 | 90 ± 5 | 35 ± 2.5 |
| 98 | 90 ± 5 | 40 ± 2.5 |
| 99 | 90 ± 5 | 45 ± 2.5. |

17. The acoustic wave device according to claim 2, wherein the first intermediate layer is a silicon oxide film;
the piezoelectric film is a lithium tantalate film;
the piezoelectric film is directly on the first intermediate layer;
the plane orientation of the first silicon layer is (110), and the plane orientation of the second silicon layer is (110);
the angle α1 is the angle $\alpha_{110}$, and the angle α2 is the angle $\alpha_{110}$;
the value of the angle α1 satisfies $\alpha1=\alpha1_{110}+180\times n$, where n is an integer (0, ±1, ±2, . . . ), and the value of the angle α2 satisfies $\alpha2=\alpha2_{110}+180\times m$, where m is an integer (0, ±1, ±2, . . . ); and
the $\alpha1_{110}$ and the $\alpha2_{110}$ are any of combinations shown in Table 5:

TABLE 5

| Condition | α1₁₁₀(°) | α2₁₁₀(°) |
|---|---|---|
| 1 | 0 ± 5 | 70 ± 5 |
| 2 | 0 ± 5 | 80 ± 5 |
| 3 | 0 ± 5 | 90 ± 5 |
| 4 | 10 ± 5 | 70 ± 5 |
| 5 | 10 ± 5 | 80 ± 5 |
| 6 | 10 ± 5 | 90 ± 5 |
| 7 | 20 ± 5 | 70 ± 5 |
| 8 | 20 ± 5 | 80 ± 5 |
| 9 | 20 ± 5 | 90 ± 5 |
| 10 | 30 ± 5 | 50 ± 5 |
| 11 | 30 ± 5 | 60 ± 5 |
| 12 | 30 ± 5 | 70 ± 5 |
| 13 | 30 ± 5 | 80 ± 5 |
| 14 | 30 ± 5 | 90 ± 5 |
| 15 | 40 ± 5 | 50 ± 5 |
| 16 | 40 ± 5 | 60 ± 5 |
| 17 | 40 ± 5 | 70 ± 5 |
| 18 | 40 ± 5 | 80 ± 5 |
| 19 | 40 ± 5 | 90 ± 5 |
| 20 | 50 ± 5 | 60 ± 5 |
| 21 | 50 ± 5 | 70 ± 5 |
| 22 | 50 ± 5 | 80 ± 5 |
| 23 | 50 ± 5 | 90 ± 5 |
| 24 | 70 ± 5 | 90 ± 5. |

18. The acoustic wave device according to claim 2, wherein the first intermediate layer is a silicon oxide film;
the piezoelectric film is a lithium tantalate film;
the piezoelectric film is directly on the first intermediate layer;
the piezoelectric film includes a positive surface and a negative surface determined by a polarization direction of the piezoelectric film;
the plane orientation of the first silicon layer is (110), and the plane orientation of the second silicon layer is (111);
the angle α1 is the angle $\alpha_{110}$, and the angle α2 is the angle $\alpha_{111}$;
the value of the angle α1 satisfies $\alpha1=\alpha1_{110}+180\times n$, where n is an integer (0, ±1, ±2, . . . );
when the IDT electrode is on the negative surface of the piezoelectric film, the value of the angle α2 satisfies $\alpha2=\alpha2_{111}+120\times m$, where m is an integer (0, ±1, ±2, . . . );
when the IDT electrode is on the positive surface of the piezoelectric film, the value of the angle α2 satisfies $\alpha2=\alpha2_{111}+60+120\times m$, where m is the integer (0, ±1, ±2, . . . ); and the $\alpha 1_{110}$ and the $\alpha 2_{111}$ are any of combinations shown in Table

TABLE 6

| Condition | $\alpha 1_{110}(°)$ | $\alpha 2_{111}(°)$ |
|---|---|---|
| 1 | 0 ± 5 | 35 ± 2.5 |
| 2 | 0 ± 5 | 40 ± 2.5 |
| 3 | 0 ± 5 | 45 ± 2.5 |
| 4 | 0 ± 5 | 50 ± 2.5 |
| 5 | 10 ± 5 | 35 ± 2.5 |
| 6 | 10 ± 5 | 40 ± 2.5 |
| 7 | 10 ± 5 | 45 ± 2.5 |
| 8 | 10 ± 5 | 55 ± 2.5 |
| 9 | 10 ± 5 | 60 ± 2.5 |
| 10 | 20 ± 5 | 5 ± 2.5 |
| 11 | 20 ± 5 | 10 ± 2.5 |
| 12 | 20 ± 5 | 15 ± 2.5 |
| 13 | 20 ± 5 | 35 ± 2.5 |
| 14 | 20 ± 5 | 40 ± 2.5 |
| 15 | 20 ± 5 | 45 ± 2.5 |
| 16 | 20 ± 5 | 50 ± 2.5 |
| 17 | 20 ± 5 | 55 ± 2.5 |
| 18 | 20 ± 5 | 60 ± 2.5 |
| 19 | 30 ± 5 | 0 ± 2.5 |
| 20 | 30 ± 5 | 5 ± 2.5 |
| 21 | 30 ± 5 | 10 ± 2.5 |
| 22 | 30 ± 5 | 15 ± 2.5 |
| 23 | 30 ± 5 | 20 ± 2.5 |
| 24 | 30 ± 5 | 25 ± 2.5 |
| 25 | 30 ± 5 | 30 ± 2.5 |
| 26 | 30 ± 5 | 35 ± 2.5 |
| 27 | 30 ± 5 | 40 ± 2.5 |
| 28 | 30 ± 5 | 45 ± 2.5 |
| 29 | 30 ± 5 | 50 ± 2.5 |
| 30 | 40 ± 5 | 0 ± 2.5 |
| 31 | 40 ± 5 | 5 ± 2.5 |
| 32 | 40 ± 5 | 10 ± 2.5 |
| 33 | 40 ± 5 | 15 ± 2.5 |
| 34 | 40 ± 5 | 20 ± 2.5 |
| 35 | 40 ± 5 | 25 ± 2.5 |
| 36 | 40 ± 5 | 30 ± 2.5 |
| 37 | 40 ± 5 | 35 ± 2.5 |
| 38 | 40 ± 5 | 40 ± 2.5 |
| 39 | 40 ± 5 | 45 ± 2.5 |
| 40 | 40 ± 5 | 50 ± 2.5 |
| 41 | 40 ± 5 | 55 ± 2.5 |
| 42 | 40 ± 5 | 60 ± 2.5 |
| 43 | 50 ± 5 | 0 ± 2.5 |
| 44 | 50 ± 5 | 5 ± 2.5 |
| 45 | 50 ± 5 | 10 ± 2.5 |
| 46 | 50 ± 5 | 15 ± 2.5 |
| 47 | 50 ± 5 | 20 ± 2.5 |
| 48 | 50 ± 5 | 25 ± 2.5 |
| 49 | 50 ± 5 | 40 ± 2.5 |
| 50 | 50 ± 5 | 45 ± 2.5 |
| 51 | 50 ± 5 | 50 ± 2.5 |
| 52 | 50 ± 5 | 55 ± 2.5 |
| 53 | 50 ± 5 | 60 ± 2.5 |
| 54 | 80 ± 5 | 0 ± 2.5 |
| 55 | 80 ± 5 | 5 ± 2.5. |

19. The acoustic wave device according to claim 2, wherein the first intermediate layer is a silicon oxide film;

the piezoelectric film is a lithium tantalate film;

the piezoelectric film is directly on the first intermediate layer;

the piezoelectric film includes a positive surface and a negative surface determined by a polarization direction of the piezoelectric film;

the plane orientation of the first silicon layer is (111), and the plane orientation of the second silicon layer is (100);

the angle $\alpha 1$ is the angle $\alpha_{111}$, and the angle $\alpha 2$ is the angle $\alpha_{100}$;

when the IDT electrode is on the negative surface of the piezoelectric film, the value of the angle $\alpha 1$ satisfies $\alpha 1 = \alpha 1_{111} + 120 \times n$, where n is an integer $(0, \pm 1, \pm 2, \ldots)$;

when the IDT electrode is on the positive surface of the piezoelectric film, the value of the angle $\alpha 1$ satisfies $\alpha 1 = \alpha 1_{111} + 60 + 120 \times n$, where n is the integer $(0, \pm 1, \pm 2, \ldots)$, the value of the angle $\alpha 2$ satisfies $\alpha 2 = \alpha 2_{100} + 90 \times m$, where m is an integer $(0, \pm 1, \pm 2, \ldots)$; and the $\alpha 1_{111}$ and the $\alpha 2_{100}$ are any of combinations shown in Table 7:

TABLE 7

| Condition | $\alpha 1_{111}(°)$ | $\alpha 2_{100}(°)$ |
|---|---|---|
| 1 | 0 ± 2.5 | 0 ± 2.5 |
| 2 | 0 ± 2.5 | 5 ± 2.5 |
| 3 | 0 ± 2.5 | 10 ± 2.5 |
| 4 | 0 ± 2.5 | 35 ± 2.5 |
| 5 | 0 ± 2.5 | 40 ± 2.5 |
| 6 | 0 ± 2.5 | 45 ± 2.5 |
| 7 | 5 ± 2.5 | 0 ± 2.5 |
| 8 | 5 ± 2.5 | 5 ± 2.5 |
| 9 | 5 ± 2.5 | 10 ± 2.5 |
| 10 | 5 ± 2.5 | 35 ± 2.5 |
| 11 | 5 ± 2.5 | 40 ± 2.5 |
| 12 | 5 ± 2.5 | 45 ± 2.5 |
| 13 | 10 ± 2.5 | 0 ± 2.5 |
| 14 | 10 ± 2.5 | 5 ± 2.5 |
| 15 | 10 ± 2.5 | 10 ± 2.5 |
| 16 | 10 ± 2.5 | 35 ± 2.5 |
| 17 | 10 ± 2.5 | 40 ± 2.5 |
| 18 | 10 ± 2.5 | 45 ± 2.5 |
| 19 | 15 ± 2.5 | 0 ± 2.5 |
| 20 | 15 ± 2.5 | 5 ± 2.5 |
| 21 | 15 ± 2.5 | 10 ± 2.5 |
| 22 | 15 ± 2.5 | 35 ± 2.5 |
| 23 | 15 ± 2.5 | 40 ± 2.5 |
| 24 | 15 ± 2.5 | 45 ± 2.5 |
| 25 | 20 ± 2.5 | 0 ± 2.5 |
| 26 | 20 ± 2.5 | 5 ± 2.5 |
| 27 | 20 ± 2.5 | 10 ± 2.5 |
| 28 | 20 ± 2.5 | 30 ± 2.5 |
| 29 | 20 ± 2.5 | 35 ± 2.5 |
| 30 | 20 ± 2.5 | 40 ± 2.5 |
| 31 | 20 ± 2.5 | 45 ± 2.5 |
| 32 | 25 ± 2.5 | 0 ± 2.5 |
| 33 | 25 ± 2.5 | 5 ± 2.5 |
| 34 | 25 ± 2.5 | 10 ± 2.5 |
| 35 | 30 ± 2.5 | 0 ± 2.5 |
| 36 | 30 ± 2.5 | 5 ± 2.5 |
| 37 | 30 ± 2.5 | 10 ± 2.5 |
| 38 | 30 ± 2.5 | 15 ± 2.5 |
| 39 | 30 ± 2.5 | 20 ± 2.5 |
| 40 | 30 ± 2.5 | 25 ± 2.5 |
| 41 | 35 ± 2.5 | 0 ± 2.5 |
| 42 | 35 ± 2.5 | 5 ± 2.5 |
| 43 | 35 ± 2.5 | 10 ± 2.5 |
| 44 | 35 ± 2.5 | 15 ± 2.5 |
| 45 | 35 ± 2.5 | 20 ± 2.5 |
| 46 | 35 ± 2.5 | 25 ± 2.5 |
| 47 | 35 ± 2.5 | 30 ± 2.5 |
| 48 | 35 ± 2.5 | 35 ± 2.5 |
| 49 | 35 ± 2.5 | 40 ± 2.5 |
| 50 | 40 ± 2.5 | 0 ± 2.5 |
| 51 | 40 ± 2.5 | 5 ± 2.5 |
| 52 | 40 ± 2.5 | 10 ± 2.5 |
| 53 | 40 ± 2.5 | 20 ± 2.5 |
| 54 | 40 ± 2.5 | 30 ± 2.5 |
| 55 | 40 ± 2.5 | 35 ± 2.5 |
| 56 | 40 ± 2.5 | 40 ± 2.5 |
| 57 | 40 ± 2.5 | 45 ± 2.5 |
| 58 | 45 ± 2.5 | 0 ± 2.5 |
| 59 | 45 ± 2.5 | 5 ± 2.5 |
| 60 | 45 ± 2.5 | 10 ± 2.5 |
| 61 | 45 ± 2.5 | 20 ± 2.5 |
| 62 | 45 ± 2.5 | 30 ± 2.5 |

TABLE 7-continued

| Condition | $\alpha1_{111}(°)$ | $\alpha2_{100}(°)$ |
|---|---|---|
| 63 | 45 ± 2.5 | 35 ± 2.5 |
| 64 | 45 ± 2.5 | 40 ± 2.5 |
| 65 | 45 ± 2.5 | 45 ± 2.5 |
| 66 | 50 ± 2.5 | 0 ± 2.5 |
| 67 | 50 ± 2.5 | 5 ± 2.5 |
| 68 | 50 ± 2.5 | 10 ± 2.5 |
| 69 | 50 ± 2.5 | 15 ± 2.5 |
| 70 | 50 ± 2.5 | 20 ± 2.5 |
| 71 | 50 ± 2.5 | 35 ± 2.5 |
| 72 | 50 ± 2.5 | 40 ± 2.5 |
| 73 | 50 ± 2.5 | 45 ± 2.5 |
| 74 | 55 ± 2.5 | 0 ± 2.5 |
| 75 | 55 ± 2.5 | 5 ± 2.5 |
| 76 | 55 ± 2.5 | 15 ± 2.5 |
| 77 | 55 ± 2.5 | 20 ± 2.5 |
| 78 | 55 ± 2.5 | 35 ± 2.5 |
| 79 | 55 ± 2.5 | 40 ± 2.5 |
| 80 | 55 ± 2.5 | 45 ± 2.5 |
| 81 | 60 ± 2.5 | 5 ± 2.5 |
| 82 | 60 ± 2.5 | 10 ± 2.5 |
| 83 | 60 ± 2.5 | 15 ± 2.5 |
| 84 | 60 ± 2.5 | 20 ± 2.5 |
| 85 | 60 ± 2.5 | 35 ± 2.5 |
| 86 | 60 ± 2.5 | 40 ± 2.5 |
| 87 | 60 ± 2.5 | 45 ± 2.5. |

20. The acoustic wave device according to claim 2, wherein
the first intermediate layer is a silicon oxide film;
the piezoelectric film is a lithium tantalate film;
the piezoelectric film is directly on the first intermediate layer;
the piezoelectric film includes a positive surface and a negative surface determined by a polarization direction of the piezoelectric film;
the plane orientation of the first silicon layer is (111), and the plane orientation of the second silicon layer is (110);
the angle $\alpha1$ is the angle $\alpha_{111}$, and the angle $\alpha2$ is the angle $\alpha_{110}$;
when the IDT electrode is on the negative surface of the piezoelectric film, the value of the angle $\alpha1$ satisfies $\alpha1=\alpha1_{111}+120\times n$, where n is an integer $(0, \pm1, \pm2, \ldots)$;
when the IDT electrode is on the positive surface of the piezoelectric film, the value of the angle $\alpha1$ satisfies $\alpha1=\alpha1_{111}+60+120\times n$, where n is the integer $(0, \pm1, \pm2, \ldots)$;
the value of the angle $\alpha2$ satisfies $\alpha2=\alpha2_{110}+180\times m$, where m is an integer $(0, \pm1, \pm2, \ldots)$; and
the $\alpha1_{111}$ and the $\alpha2_{110}$ are any of combinations shown in Table 8:

TABLE 8

| Condition | $\alpha1_{111}(°)$ | $\alpha2_{110}(°)$ |
|---|---|---|
| 1 | 0 ± 2.5 | 80 ± 5 |
| 2 | 0 ± 2.5 | 90 ± 5 |
| 3 | 5 ± 2.5 | 80 ± 5 |
| 4 | 5 ± 2.5 | 90 ± 5 |
| 5 | 10 ± 2.5 | 80 ± 5 |
| 6 | 10 ± 2.5 | 90 ± 5 |
| 7 | 15 ± 2.5 | 80 ± 5 |
| 8 | 15 ± 2.5 | 90 ± 5 |
| 9 | 20 ± 2.5 | 80 ± 5 |
| 10 | 20 ± 2.5 | 90 ± 5 |
| 11 | 25 ± 2.5 | 70 ± 5 |
| 12 | 25 ± 2.5 | 90 ± 5 |
| 13 | 30 ± 2.5 | 60 ± 5 |

TABLE 8-continued

| Condition | $\alpha1_{111}(°)$ | $\alpha2_{110}(°)$ |
|---|---|---|
| 14 | 30 ± 2.5 | 70 ± 5 |
| 15 | 30 ± 2.5 | 80 ± 5 |
| 16 | 30 ± 2.5 | 90 ± 5 |
| 17 | 35 ± 2.5 | 70 ± 5 |
| 18 | 35 ± 2.5 | 80 ± 5 |
| 19 | 35 ± 2.5 | 90 ± 5 |
| 20 | 40 ± 2.5 | 60 ± 5 |
| 21 | 40 ± 2.5 | 70 ± 5 |
| 22 | 40 ± 2.5 | 80 ± 5 |
| 23 | 40 ± 2.5 | 90 ± 5 |
| 24 | 45 ± 2.5 | 60 ± 5 |
| 25 | 45 ± 2.5 | 70 ± 5 |
| 26 | 45 ± 2.5 | 80 ± 5 |
| 27 | 45 ± 2.5 | 90 ± 5 |
| 28 | 50 ± 2.5 | 60 ± 5 |
| 29 | 50 ± 2.5 | 70 ± 5 |
| 30 | 50 ± 2.5 | 80 ± 5 |
| 31 | 50 ± 2.5 | 90 ± 5 |
| 32 | 55 ± 2.5 | 60 ± 5 |
| 33 | 55 ± 2.5 | 70 ± 5 |
| 34 | 55 ± 2.5 | 80 ± 5 |
| 35 | 55 ± 2.5 | 90 ± 5 |
| 36 | 60 ± 2.5 | 70 ± 5 |
| 37 | 60 ± 2.5 | 80 ± 5 |
| 38 | 60 ± 2.5 | 90 ± 5. |

21. The acoustic wave device according to claim 2, wherein
the first intermediate layer is a silicon oxide film;
the piezoelectric film is a lithium tantalate film;
the piezoelectric film is directly on the first intermediate layer;
the piezoelectric film includes a positive surface and a negative surface determined by a polarization direction of the piezoelectric film;
the plane orientation of the first silicon layer is (111), and the plane orientation of the second silicon layer is (111);
the angle $\alpha1$ is the angle $\alpha_{111}$, and the angle $\alpha2$ is the angle $\alpha_{111}$;
when the IDT electrode is on the negative surface of the piezoelectric film, the value of the angle $\alpha1$ satisfies $\alpha1=\alpha1_{111}+120\times n$, where n is an integer $(0, \pm1, \pm2, \ldots)$, and the value of the angle $\alpha2$ satisfies $\alpha2=\alpha2_{111}+120\times m$, where m is an integer $(0, \pm1, \pm2, \ldots)$;
when the IDT electrode is on the positive surface of the piezoelectric film, the value of the angle $\alpha1$ satisfies $\alpha1=\alpha1_{111}+60+120\times n$, where n is the integer $(0, \pm1, \pm2, \ldots)$;
the value of the angle $\alpha2$ satisfies $\alpha2=\alpha2_{111}+60+120\times m$, where m is the integer $(0, \pm1, \pm2, \ldots)$; and
the $\alpha1_{111}$ and the $\alpha2_{111}$ are any of combinations shown in Table 9:

TABLE 9

| Condition | $\alpha1_{111}(°)$ | $\alpha2_{111}(°)$ |
|---|---|---|
| 1 | 0 ± 2.5 | 40 ± 2.5 |
| 2 | 0 ± 2.5 | 45 ± 2.5 |
| 3 | 0 ± 2.5 | 50 ± 2.5 |
| 4 | 0 ± 2.5 | 55 ± 2.5 |
| 5 | 0 ± 2.5 | 60 ± 2.5 |
| 6 | 5 ± 2.5 | 40 ± 2.5 |
| 7 | 5 ± 2.5 | 45 ± 2.5 |
| 8 | 5 ± 2.5 | 50 ± 2.5 |
| 9 | 5 ± 2.5 | 55 ± 2.5 |
| 10 | 5 ± 2.5 | 60 ± 2.5 |
| 11 | 10 ± 2.5 | 40 ± 2.5 |
| 12 | 10 ± 2.5 | 45 ± 2.5 |

TABLE 9-continued

| Condition | $\alpha1_{111}(°)$ | $\alpha2_{111}(°)$ |
|---|---|---|
| 13 | 10 ± 2.5 | 50 ± 2.5 |
| 14 | 10 ± 2.5 | 55 ± 2.5 |
| 15 | 10 ± 2.5 | 60 ± 2.5 |
| 16 | 15 ± 2.5 | 40 ± 2.5 |
| 17 | 15 ± 2.5 | 45 ± 2.5 |
| 18 | 15 ± 2.5 | 50 ± 2.5 |
| 19 | 15 ± 2.5 | 55 ± 2.5 |
| 20 | 15 ± 2.5 | 60 ± 2.5 |
| 21 | 20 ± 2.5 | 45 ± 2.5 |
| 22 | 20 ± 2.5 | 50 ± 2.5 |
| 23 | 20 ± 2.5 | 55 ± 2.5 |
| 24 | 20 ± 2.5 | 60 ± 2.5 |
| 25 | 25 ± 2.5 | 0 ± 2.5 |
| 26 | 25 ± 2.5 | 5 ± 2.5 |
| 27 | 25 ± 2.5 | 40 ± 2.5 |
| 28 | 25 ± 2.5 | 45 ± 2.5 |
| 29 | 25 ± 2.5 | 50 ± 2.5 |
| 30 | 25 ± 2.5 | 55 ± 2.5 |
| 31 | 25 ± 2.5 | 60 ± 2.5 |
| 32 | 30 ± 2.5 | 0 ± 2.5 |
| 33 | 30 ± 2.5 | 5 ± 2.5 |
| 34 | 30 ± 2.5 | 10 ± 2.5 |
| 35 | 30 ± 2.5 | 15 ± 2.5 |
| 36 | 30 ± 2.5 | 40 ± 2.5 |
| 37 | 30 ± 2.5 | 45 ± 2.5 |
| 38 | 30 ± 2.5 | 50 ± 2.5 |
| 39 | 30 ± 2.5 | 55 ± 2.5 |
| 40 | 30 ± 2.5 | 60 ± 2.5 |
| 41 | 35 ± 2.5 | 10 ± 2.5 |
| 42 | 35 ± 2.5 | 15 ± 2.5 |
| 43 | 35 ± 2.5 | 60 ± 2.5 |
| 44 | 40 ± 2.5 | 60 ± 2.5 |
| 45 | 50 ± 2.5 | 55 ± 2.5 |
| 46 | 50 ± 2.5 | 60 ± 2.5 |

22. The acoustic wave device according to claim 2, further comprising:

a second intermediate layer between the first intermediate layer and the support substrate; wherein
the first intermediate layer is a silicon oxide film;
the second intermediate layer is a silicon nitride film;
the piezoelectric film is a lithium tantalate film; and
when ψ in Euler angles (φ, θ, ψ) of the first silicon layer is Si_psi [deg], ψ in Euler angles (φ, θ, ψ) of the second silicon layer is si_psi_2 [deg], a thickness of the second silicon layer is t_Si2 [λ], a thickness of the second intermediate layer is t_SiN [λ], a thickness of the first intermediate layer is t_SiO2 [λ], and a thickness of the piezoelectric film is t_LT [λ], and a phase of a higher-order mode is Pkj [deg], the Si_psi, the si_psi_2, the t_Si2, the t_SiN, the t_SiO2, and the t_LT are within ranges of angles and thicknesses in which Pkj in Equation 1 below is about −70 deg or less:

Pkj [deg]=(−71.2068602606219)+
331.629446317838×($t\_LT\lambda$]−
0.173291148291141)+(−22.7224910522243)×
($t\_SiO2[\lambda$]−0.133361933361938)+
70.1603362058α21×($t\_SiN[\lambda$]−
0.0694258544258521)+20.4186870884974×
($t\_Si2[\lambda$]−0.432632632632632)+(−
0.0795718195965644)×(si_psi_2 [deg]−
15.1794651794652)+(−0.0801661426763212)×
(Si_psi [deg]−21.3234663234663)+(−
8265.27531314391)×(($t\_LT[\lambda$]−
0.173291148291141)×($t\_LT[\lambda$]−
0.173291148291141)−0.000254658833416191)+
(−702.352467513552)×(($t\_LT[\lambda$]−
0.173291148291141)×($t\_SiO2[\lambda$]−
0.133361933361938))+(−159.217489977571)×
(($t\_SiO2[\lambda$]−0.133361933361938)×($t\_SiO2$
[$\lambda$]−0.133361933361938)−
0.00220941097478356)+1181.94608028125×
(($t\_LT\lambda$]−0.173291148291141)×($t\_SiN[\lambda$]−
0.0694258544258521))+148.194177052574×
(($t\_SiO2[\lambda$]−0.133361933361938)×($t\_SiN[\lambda$]−
0.0694258544258521))+(−138.414297240254)×
(($t\_SiN[\lambda$]−0.0694258544258521)×($t\_SiN[\lambda$]−
0.0694258544258521)−0.00607933216152169)+
(−73.8108320642126)×(($t\_LT\lambda$]−
0.173291148291141)×($t\_Si2[\lambda$]−
0.432632632632632))+22.3596977549241×
(($t\_SiO2[\lambda$]−0.133361933361938)×($t\_Si2[\lambda$]−
0.432632632632632))+(−−180.302445874872)×
(($t\_SiN[\lambda$]−0.0694258544258521)×($t\_Si2[\lambda$]−
0.432632632632632))+58.1189523422145×
(($t\_Si2[\lambda$]−0.432632632632632)×($t\_Si2[\lambda$]−
0.432632632632632)−0.0206911530435046)+(−
0.0892573877283934)×(($t\_LT[\lambda$]−
0.173291148291141)×(si_psi_2 [deg]−
15.1794651794652))+0.1α2191016582739×
(($t\_SiO2[\lambda$]−0.133361933361938)×(si_psi_2
[deg]−15-1794651794652))+(−
0.566877950267944)×(($t\_SiN[\lambda$]−
0.0694258544258521)×(si_psi,2 [deg]−
15.1794651794652))+(−0.523218662939604)×
(($t\_Si2[\lambda1$]−0.432632632632632)×(si_psi_2
[deg]−15.1794651794652))+
0.001.11049675010859×((si_psi,2 [deg]−
15.1794651794652)×(si_psi_2 [deg]−
15.1794651794652)−260.117227398797)+
2.43575857272564×(($t\_LT[\lambda$]−
0.173291148291141)×(Si_psi [deg]−
21.3234663234663))+(−0.269547003578196)×
(($t\_SiO2[\lambda$]−0.133361933361938)×(Si_psi
[deg]−21.3234663234663))+(−
0.235856493743728)×(($t\_SiN[\lambda$]−
0.0694258544258521)×(Si_psi [deg]−
21.3234663234663))+0.475976492439799×
(($t\_Si2[\lambda$]−0.432632632632632)×(Si_psi [deg]−
21.3234663234663))+0.00288777512919308×
((si_psi,2 [deg]−15.1794651794652)×(Si_psi
[deg]−21.3234663234663))+
0.00174948079902691×((Si_psi [deg]−
21.3234663234663)×(Si_psi [deg]−
21.3234663234663)−553.32136696361).  Equation 1

23. The acoustic wave device according to claim 2, further comprising:

a second intermediate layer between the first intermediate layer and the support substrate; wherein
the first intermediate layer is a silicon oxide film;
the second intermediate layer is a silicon nitride film,
the piezoelectric film is a lithium tantalate film using 35° Y-cut X-propagation LiTaO$_3$; and
when ψ in Euler angles (φ, θ, ψ) of the first silicon layer is Si_psi [deg], ψ in Euler angles (φ, θ, ψ) of the second silicon layer is si_psi_2 [deg], a thickness of the second silicon layer is t_Si2 [λ], a thickness of the second intermediate layer is t_SiN [λ], a thickness of the first intermediate layer is t_SiO2 [λ], and a thickness of the piezoelectric film is t_LT [λ], and a phase of a higher-order mode is Pkj [deg], the Si_psi, the si_psi_2, the t_Si2, the t_SiN, the t_SiO2, and the t_LT are within ranges of angles and thicknesses in which Pkj in Equation 2 below is about −70 deg or less:

Pkj [deg]=(−68.3045028100257)+
148.009830991658×($t\_LT[\lambda$]−
0.182938408896478)+(−31.7023619287189)×
($t\_SiO2[\lambda1$]−0.131180496150558)+
59.9941196381256×($t\_SiN[\lambda$]−
0.0722326775α21397)+28.3891130547491×
($t\_Si2[\lambda$]−0.457408041060735)+(−
0.0551187486931435)×(si_psi_2 [deg]−
23.817792985457)+0.0α621179951505866×
(Si_psi [deg]−33.7339606501283)+(−
307.104268249355)×(($t\_LT[\lambda$]−
0.182938408896478)×($t\_SiO2[\lambda1$]−
0.131180496150558))+(−221.090307531174)×
(($t\_SiO2[\lambda$]−0.131180496150558)×($t\_SiO2[\lambda1$]−
0.131180496150558)−0.00245634808837649)+
3.0630243958978×(($t\_LT\lambda$]−

0.182938408896478)×(t_SiN[λ]−
0.0722326775α21397))+26.3784321839523×
((t_SiO2[λ]−0.131180496150558)×(t_SiN[λ]−
0.0722326775α21397))+(−149.210462980265)×
((t_SiN[λ]−0,0722326775α21397)×(t_SiN[λ]−
0.0722326775α21397)−
0.00538017340609054)+16.5185556736186×
((t_LT[λ]−0.182938408896478)×(t_Si2[λ1]−
0.457408041060735))+56.1146358518209×
((t_SiO2[λ1]−0.131180496150558)×(t_Si2[λ]−
0.457408041060735))+(−231.9230984773)×
((t_SiN[λ]−0.0722326775α21397)×(t_Si2[λ]−
0.457408041060735))+(−9-26166386908678)×
((t_Si2[λ]−0.457408041060735)×(t_Si2[λ]−
0.457408041060735)−0.00796565129547814)+
(−0.0982556479630247)×((t_LT[λ]−
0.182938408896478)×(si_psi_2 [deg]−
23.8177929854577))+(−0.144777667964478)×
((t_SiO2[λ]−0.131180496150558)×(si_psi_2
[deg]−23.8177929854577))+(−
0.121859651665675)×((t_SiN[λ]−
0.0722326775α21397)×(si_psi_2 [deg]−
23.8177929854577))+(−0.337942081738039)×
(((t_Si2[λ]−0.457408041060735)×(si_psi_2
[deg]−23.8177929854577))+
0.0000092550445874239×((si_psi_2 [deg]−
23.8177929854577)×(si_psi_2 [deg]−
23.8177929854577)−211.955679987944)+
1.28762234468537×((t_LTλ]−
0.182938408896478)×(Si_psi [deg]−
33.7339606501283))+(−0.350061531387324)×
((t_SiO2[λ]−0.131180496150558)×(Si_psi
[deg]−33.7339606501283))+(−
0.155177588775029)×((t_SiN[λ]−
0.0722326775α21397)×(Si_psi [deg]−
33.7339606501283))+0.305377220918695×
((t_Si2[λ]−0.457408041060735)×(Si_psi [deg]−
33.7339606501283))+0.00184222592354461×
((si_psi_2 [deg]−23.8177929854577)×(Si_psi
[deg]−33.7339606501283))+
0.0α210385689952457×((Si_psi [deg]−
33.7339606501283)×(Si_psi [deg]−
33.7339606501283)−454.804329993321)   Equation 2

24. The acoustic wave device according to claim 1, wherein the type of the angle α1 and the type of the angle α2 are identical, and the value of the angle α1 and the value of the angle α2 are different.

25. The acoustic wave device according to claim 1, wherein the type of the angle α1 is different from the type of the angle α2.

26. The acoustic wave device according to claim 1, wherein
the piezoelectric film is a lithium tantalate film; and
θ in Euler angles (φ, θ, ψ) of the piezoelectric film is about 113° to about 139°.

27. The acoustic wave device according to claim 1, wherein
the piezoelectric film is a lithium tantalate film; and
a thickness of the second silicon layer is about 0.3λ to about 0.8λ.

28. The acoustic wave device according to claim 1, wherein the piezoelectric film is a lithium niobate film.

* * * * *